United States Patent
Son et al.

(10) Patent No.: US 12,183,680 B2
(45) Date of Patent: Dec. 31, 2024

(54) SEMICONDUCTOR MEMORY DEVICE INCLUDING WIRING CONTACT PLUGS

(71) Applicant: Samsung Electronics Co., Ltd., Suwon-si (KR)

(72) Inventors: Yonghyeok Son, Seoul (KR); Junwoo Lee, Bucheon-si (KR); Sungdong Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/191,418

(22) Filed: Mar. 28, 2023

(65) Prior Publication Data
US 2023/0238331 A1 Jul. 27, 2023

Related U.S. Application Data

(62) Division of application No. 18/153,028, filed on Jan. 11, 2023, now Pat. No. 11,901,297, which is a
(Continued)

(30) Foreign Application Priority Data

Nov. 3, 2020 (KR) .................. 10-2020-0145532

(51) Int. Cl.
*H01L 23/535* (2006.01)
*H01L 21/768* (2006.01)
*H10B 12/00* (2023.01)

(52) U.S. Cl.
CPC ...... *H01L 23/535* (2013.01); *H01L 21/76805* (2013.01); *H01L 21/76843* (2013.01);
(Continued)

(58) Field of Classification Search
CPC ............. H01L 23/535; H01L 21/76805; H01L 21/76843; H01L 21/76895; H01L 28/75;
(Continued)

(56) References Cited

U.S. PATENT DOCUMENTS 6,316,351 B1    11/2001    Chen et al.
6,605,546 B1    8/2003    Subramanian et al.
(Continued)

FOREIGN PATENT DOCUMENTS

CN         103534807 A    1/2014
JP         2014-220423 A    11/2014
(Continued)

OTHER PUBLICATIONS

Notice of Allowance dated Sep. 20, 2023, issued in corresponding U.S. Appl. No. 18/153,028.
(Continued)

*Primary Examiner* — David Vu
(74) *Attorney, Agent, or Firm* — HARNESS, DICKEY & PIERCE, P.L.C.

(57) ABSTRACT

A semiconductor memory device includes a substrate including a cell area and a peripheral area, a plurality of capacitors including a plurality of lower electrodes arranged in the cell area, a plurality of capacitor dielectric layers covering the plurality of lower electrodes, and an upper electrode on the plurality of capacitor dielectric layers, an etch stop layer covering the upper electrode, a filling insulation layer covering the etch stop layer and arranged in the cell area and the peripheral area, a plurality of wiring lines on the filling insulation layer, and a first wiring contact plug electrically connecting at least one of the plurality of wiring lines to the upper electrode. The upper electrode includes a first upper electrode layer covering the plurality of capacitor dielectric layers and including a semiconductor material and a second upper electrode layer covering the first upper electrode layer and including a metallic material.

20 Claims, 101 Drawing Sheets

Related U.S. Application Data division of application No. 17/330,795, filed on May 26, 2021, now Pat. No. 11,569,171.

(52) U.S. Cl.
CPC ...  *H01L 21/76895* (2013.01); *H10B 12/0335* (2023.02); *H10B 12/053* (2023.02); *H10B 12/09* (2023.02); *H10B 12/315* (2023.02); *H10B 12/34* (2023.02); *H10B 12/482* (2023.02); *H10B 12/485* (2023.02); *H10B 12/50* (2023.02)

(58) Field of Classification Search
CPC .. H10B 12/0335; H10B 12/053; H10B 12/09; H10B 12/315; H10B 12/34; H10B 12/482; H10B 12/485; H10B 12/50; H10B 12/30

See application file for complete search history.

(56) References Cited

U.S. PATENT DOCUMENTS

| | | |
|---|---|---|
| 7,923,343 B2 | 4/2011 | Eun |
| 8,546,232 B2 | 10/2013 | Sako |
| 8,648,441 B2 | 2/2014 | Hijioka et al. |
| 8,993,396 B2 | 3/2015 | Park et al. |
| 9,093,460 B2 | 7/2015 | Kim et al. |
| 9,105,758 B2 | 8/2015 | Kim |
| 9,209,189 B2 | 12/2015 | Sakamoto et al. |
| 9,257,398 B2 | 2/2016 | Kim |
| 9,299,709 B2 | 3/2016 | Sasaki |
| 9,349,736 B2 | 5/2016 | Hung et al. |
| 9,478,547 B2 | 10/2016 | Kunishima et al. |
| 9,496,328 B2 | 11/2016 | Seo et al. |
| 9,548,300 B2 | 1/2017 | Kim |
| 10,332,888 B2 | 6/2019 | Liu et al. |
| 10,395,982 B2 | 8/2019 | Nam et al. |
| 10,861,787 B1 * | 12/2020 | Sukekawa ............... H01L 25/18 |
| 2002/0164544 A1 | 11/2002 | Luckanc et al. |
| 2004/0157443 A1 | 8/2004 | Shimooka et al. |
| 2006/0019482 A1 | 1/2006 | Su et al. |
| 2007/0205508 A1 | 9/2007 | Hsia et al. |
| 2010/0123199 A1 | 5/2010 | Kawahara et al. |
| 2012/0115300 A1 * | 5/2012 | Hirota ................... H10B 12/033 438/381 |
| 2012/0235274 A1 | 9/2012 | Doyle et al. |
| 2013/0264620 A1 * | 10/2013 | Yu ....................... H01L 23/5329 438/653 |
| 2013/0270676 A1 | 10/2013 | Lindert et al. |
| 2013/0344674 A1 | 12/2013 | Sako |
| 2017/0186752 A1 | 6/2017 | Choi et al. |
| 2018/0166529 A1 | 6/2018 | Park et al. |
| 2018/0175042 A1 | 6/2018 | Jang et al. |
| 2018/0197815 A1 | 7/2018 | Kang |
| 2020/0212169 A1 | 7/2020 | Kim |
| 2021/0217447 A1 * | 7/2021 | Kim ....................... H10B 12/053 |

FOREIGN PATENT DOCUMENTS

| | | |
|---|---|---|
| KR | 2002-0037198 A | 5/2002 |
| KR | 10-2007-0009285 A | 1/2007 |
| KR | 101087846 B1 | 11/2011 |
| KR | 10-2018-0069186 A | 6/2018 |
| KR | 10-2019-0006142 A | 1/2019 |

OTHER PUBLICATIONS

Office Action dated Dec. 7, 2022, issued in corresponding Taiwanese Patent Application No. 110135528.

Notice of Allowance dated Sep. 22, 2022, issued in corresponding U.S. Appl. No. 17/330,795.

Korean Office Action dated Jun. 19, 2024 for corresponding Korean Patent Application No. 10-2020-0145532 and its English-language translation.

* cited by examiner

SEMICONDUCTOR MEMORY DEVICE INCLUDING WIRING CONTACT PLUGS

CROSS-REFERENCE TO RELATED APPLICATIONS

This application is a divisional of U.S. application Ser. No. 18/153,028, filed Jan. 11, 2023, which is a divisional of U.S. application Ser. No. 17/330,795, filed May 26, 2021, which is based on and claims priority under 35 U. S. C. § 119 to Korean Patent Application No. 10-2020-0145532, filed on Nov. 3, 2020, in the Korean Intellectual Property Office, the disclosure of each of which is incorporated by reference herein in its entirety.

BACKGROUND

Inventive concepts relate to a semiconductor memory device, and more particularly, to a semiconductor memory device including wiring contact plugs electrically connecting different vertical levels.

In accordance with the breakthrough of the electronics industry and user's request, an electronic device is miniaturized and lightened. Therefore, a high degree of integration may be required for the semiconductor memory device used in an electronic device so that a design rule for components of the semiconductor memory device is being reduced. Therefore, it may be difficult to secure the reliability of the semiconductor memory device.

SUMMARY

Inventive concepts relate to a semiconductor memory device including wiring contact plugs capable of securing reliability.

Inventive concepts also relate to the following semiconductor memory devices.

According to an embodiment of inventive concepts, a semiconductor memory device may include a substrate including a cell area and a peripheral area; a plurality of capacitors including a plurality of lower electrodes on the cell area, a plurality of capacitor dielectric layers covering the plurality of lower electrodes, and an upper electrode covering the plurality of capacitor dielectric layers and the plurality of lower electrodes; an etch stop layer covering the upper electrode; a filling insulation layer covering the etch stop layer and on the cell area and the peripheral area; a plurality of wiring lines on the filling insulation layer; and a first wiring contact plug electrically connecting at least one of the plurality of wiring lines to the upper electrode. The upper electrode may include a first upper electrode layer covering the plurality of capacitor dielectric layers and a second upper electrode layer covering the first upper electrode layer. The first upper electrode may include a semiconductor material and the second upper electrode may include a metallic material.

According to an embodiment of inventive concepts, a semiconductor memory device may include a substrate including a cell area and a peripheral area; a plurality of lower electrodes on the cell area; a plurality of gate lines on the substrate; a plurality of logic bit lines on the peripheral area and on the plurality of gate lines; a plurality of capacitor dielectric layers conformally covering surfaces of the plurality of lower electrodes; an upper electrode on the substrate, the upper electrode including a first upper electrode layer and a second upper electrode layer on the first upper electrode layer, the first upper electrode layer including a semiconductor material, filling spaces among the plurality of lower electrodes, and covering the plurality of capacitor dielectric layers; an etch stop layer covering the upper electrode in the cell area; a filling insulation layer covering the etch stop layer and the plurality of logic bit lines; a plurality of wiring lines on the filling insulation layer; and a first wiring contact plug connecting at least one of the plurality of wiring lines to the second upper electrode layer through the filling insulation layer and the etch stop layer; and a second wiring contact plug connecting at least another one of the plurality of wiring lines to the plurality of logic bit lines through the filling insulation layer. The second upper electrode layer may include an electrode barrier layer, a main electrode layer including a metallic material, and an interface layer including conductive metal oxide.

According to an embodiment of inventive concepts, a semiconductor memory device may include a substrate including a cell area and a peripheral area; a plurality of gate lines on the peripheral area of the substrate; plurality of logic bit lines on the plurality of gate lines; a logic capping layer covering upper surfaces of the plurality of gate lines; a plurality of lower electrodes on the cell area; a plurality of capacitor dielectric layers covering the plurality of lower electrodes; an upper electrode including a first upper electrode layer and a second upper electrode layer on the first upper electrode layer, the first upper electrode layer including a semiconductor material, filling spaces among the plurality of lower electrodes, and covering the plurality of capacitor dielectric layers, and the second upper electrode layer including a metallic material and covering the plurality of lower electrodes; an etch stop layer covering the upper electrode; a filling insulation layer covering the etch stop layer and the logic capping layer; a plurality of wiring lines on the filling insulation layer; a first wiring contact plug connecting at least one of the plurality of wiring lines to the upper electrode through the filling insulation layer and the etch stop layer; and a second wiring contact plug connecting at least another one of the plurality of wiring lines to the plurality of logic bit lines through the filling insulation layer and the logic capping layer. A height of the second wiring contact plug may be greater than a height of the first wiring contact plug. The second upper electrode layer may include a stacked structure in which the electrode barrier layer, the main electrode layer, and the interface layer are sequentially stacked. The main electrode layer may include a metallic material and the interface layer may include conductive metal oxide.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
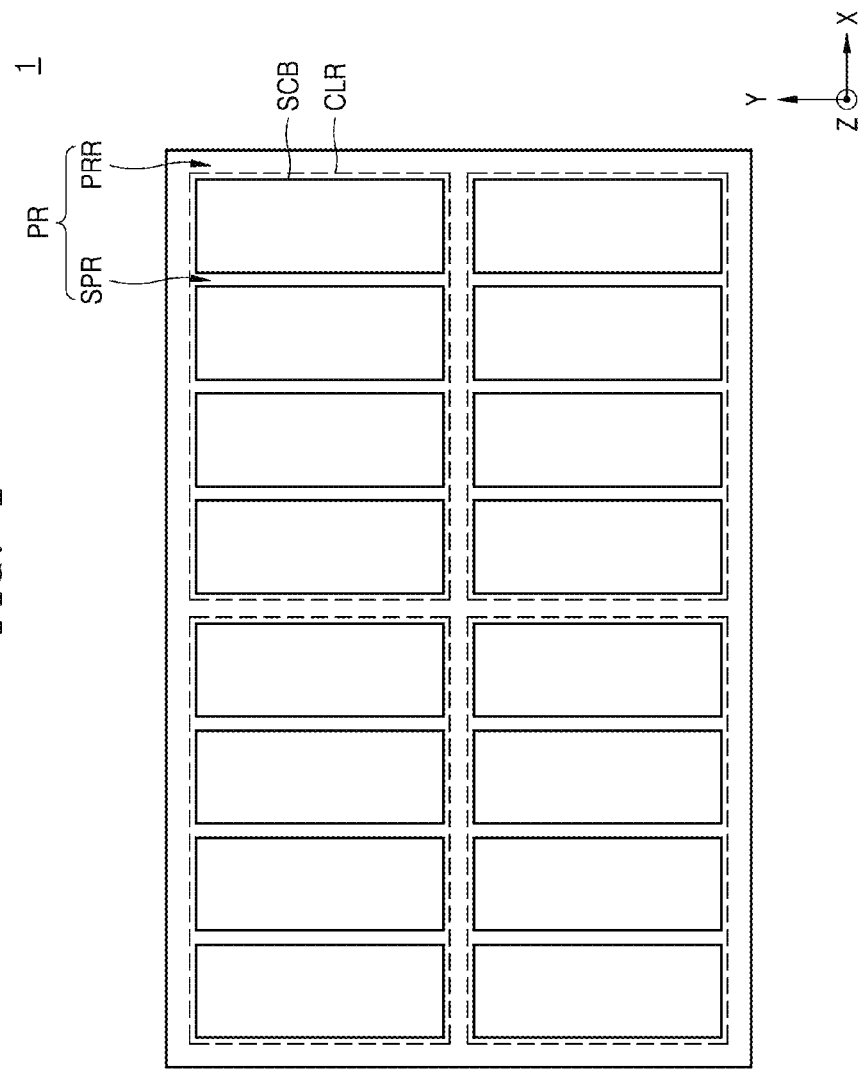
FIG. 1 is a block diagram illustrating a semiconductor memory device according to embodiments of inventive concepts.

FIG. 1 is a block diagram illustrating a semiconductor memory device 1 according to embodiments of inventive concepts.

Referring to FIG. 1, the semiconductor memory device 1 may include a cell area CLR in which a plurality of memory cells are arranged and a main peripheral area PRR surrounding the cell area CLR.

According to an embodiment of inventive concepts, in the cell area CLR, sub-peripheral areas SPR distinguishing cell blocks SCB from one another may be provided. In the cell blocks SCB, the plurality of memory cells may be arranged. In the current specification, the cell blocks SCB mean areas in each of the plurality of memory cells are regularly arranged at uniform intervals and may be referred to as sub-cell blocks.

In the main peripheral area PRR and the sub-peripheral areas SPR, logic cells for writing/reading an electrical signal in/from the plurality of memory cells may be arranged. In some embodiments, the main peripheral area PRR may be referred to as a peripheral circuit area and the sub-peripheral areas SPR may be referred to as core circuit areas. A peripheral area PR may include the main peripheral area PRR and the sub-peripheral areas SPR. That is, the peripheral area PR may be a core and peripheral circuit area including a peripheral circuit area and a core circuit area. In some embodiments, at least parts of the sub-peripheral areas SPR may be provided as only spaces for distinguishing the cell blocks SCB from one another.

Figure 2:
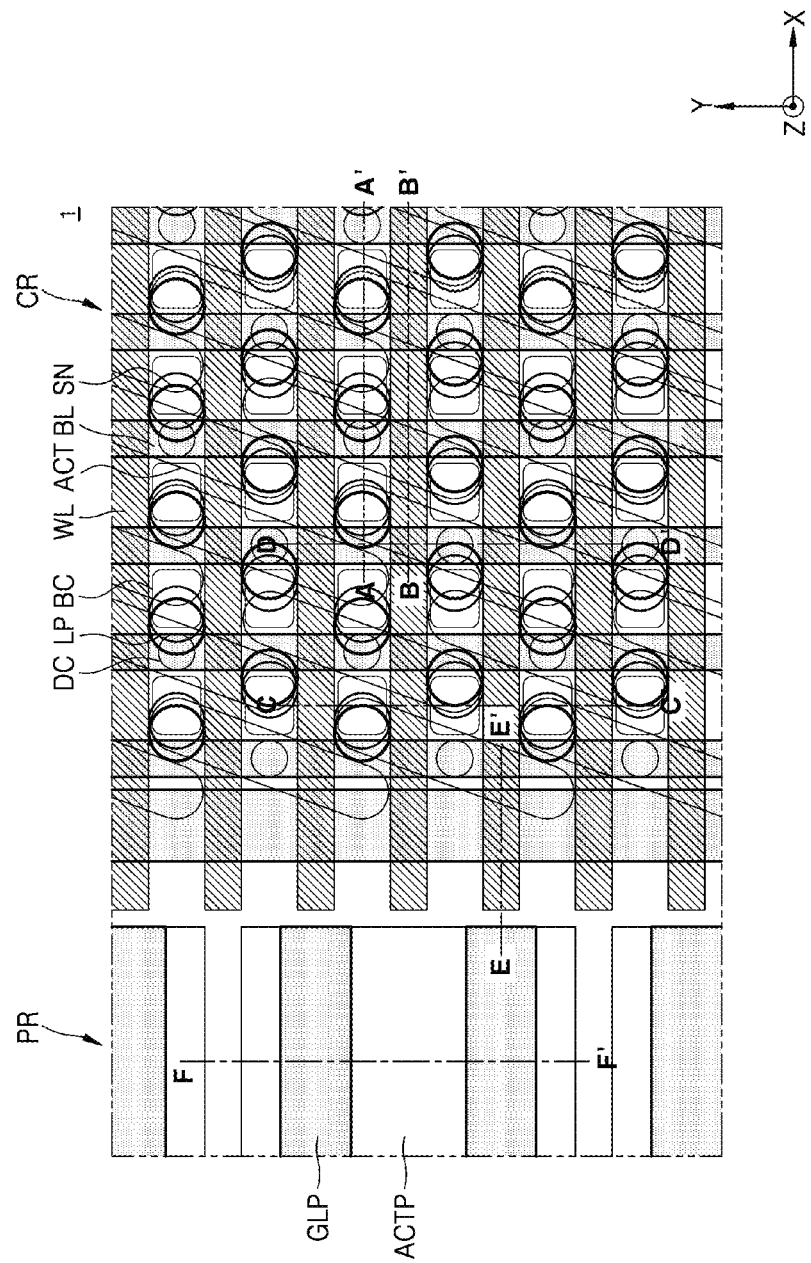
FIG. 2 is a schematic plan layout illustrating main components of a semiconductor memory device according to embodiments of inventive concepts.

FIG. 2 is a schematic plan layout illustrating main components of a semiconductor memory device 1 according to embodiments of inventive concepts.

Referring to FIG. 2, the semiconductor memory device 1 includes a memory cell area CR and a peripheral area PR. The semiconductor memory device 1 may include a plurality of active areas ACT formed in the memory cell area CR and a plurality of logic active areas ACTP formed in the peripheral area PR. The memory cell area CR may be the cell block SCB illustrated in FIG. 1 in which the plurality of memory cells are arranged, and the peripheral area PR may be the peripheral area PR illustrated in FIG. 1 including the main peripheral area PRR and the sub-peripheral areas SPR.

In some embodiments, the plurality of active areas ACT may be arranged in the memory cell area CR to have a long axis in a diagonal direction with respect to a first horizontal direction (an X direction) and a second horizontal direction (a Y direction).

A plurality of word lines WL may extend in parallel with the first horizontal direction (the X direction) across the plurality of active areas ACT in the memory cell area CR. On the plurality of word lines WL, a plurality of bit lines BL may extend in parallel with the second horizontal direction (the Y direction) intersecting with the first horizontal direction (the X direction). The plurality of bit lines BL may be connected to the plurality of active areas ACT through a plurality of direct contacts DC.

In some embodiments, a plurality of buried contacts BC may be formed between two adjacent bit lines BL among the plurality of bit lines BL. In some embodiments, the plurality of buried contacts BC may be arranged in line in the first horizontal direction (the X direction) and the second horizontal direction (the Y direction).

On the plurality of buried contacts BC, a plurality of landing pads LP may be provided. The plurality of landing pads LP may be arranged to at least partially overlap the plurality of buried contacts BC. In some embodiments, each of the plurality of landing pads LP may extend to an upper portion of one of the two adjacent bit lines BL.

On the plurality of landing pads LP, a plurality of storage nodes SN may be formed. The plurality of storage nodes SN may be formed on the plurality of bit lines BL. The plurality of storage nodes SN may be respectively lower electrodes of a plurality of capacitors. The plurality of storage nodes SN may be connected to the plurality of active areas ACT through the plurality of landing pads LP and the plurality of buried contacts BC.

A plurality of gate line patterns GLP may be arranged on the plurality of logic active areas ACTP in the peripheral area PR. In FIG. 2, it is illustrated that the plurality of gate line patterns GLP extend in parallel on the plurality of logic active areas ACTP in the first horizontal direction (the X direction) and each of the plurality of gate line patterns GLP has a uniform width in the second horizontal direction (the Y direction). However, inventive concepts are not limited thereto. For example, each of the plurality of gate line patterns GLP may have a varying width and may bend or extend in a varying direction.

Figure 3A:
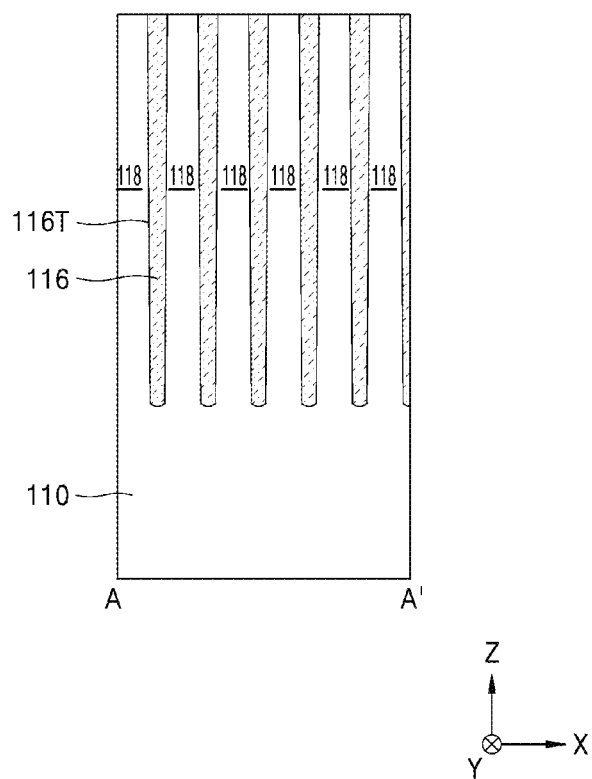
FIGS. 3A to 3F, 4A to 4F, 5A to 5F, 6A to 6F, 7A to 7F, 8A to 8F, 9A to 9F, 10A to 10F, 11A to 11C, 12A to 12C, 13A to 13C, 14A to 14C, 15A to 15C, 16A to 16C, 17A to 17C, 18A to 18C, 19A to 19C, 20A to 20C, and 21A to 21C are cross-sectional views illustrating a method of manufacturing a semiconductor memory device operation by operation according to embodiments of inventive concepts.
Figure 3B:
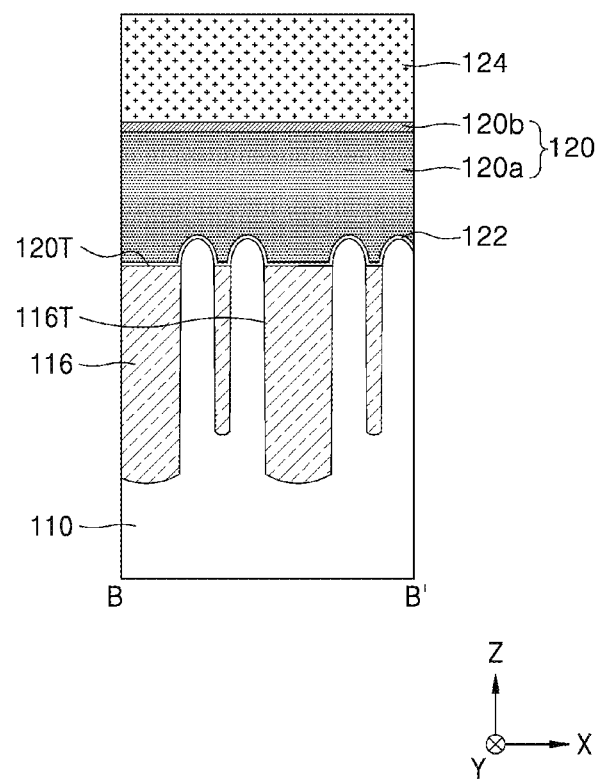
Figure 3C:
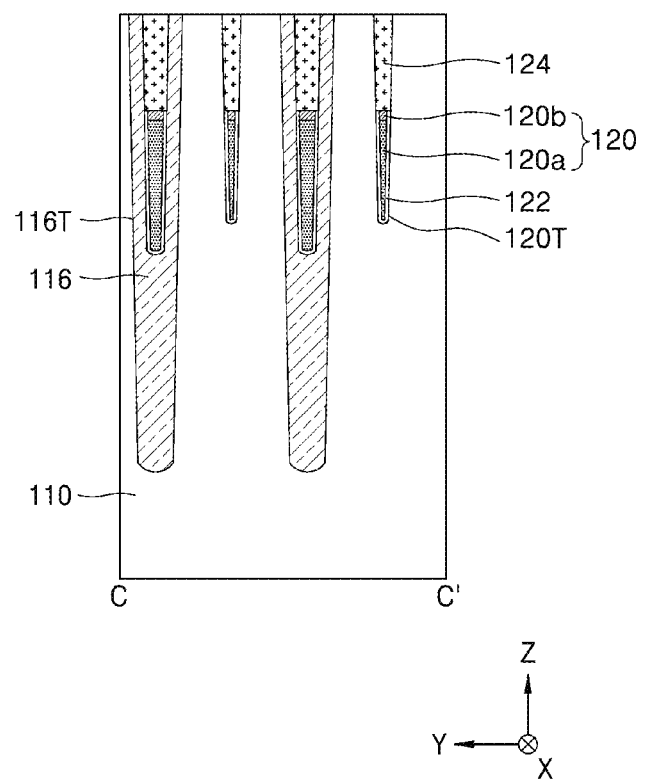
Figure 3D:
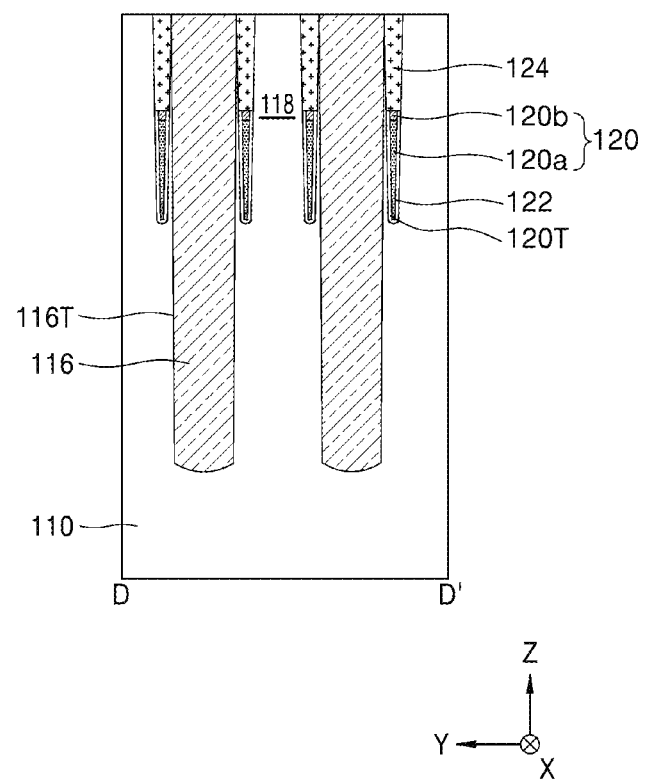
Figure 3E:
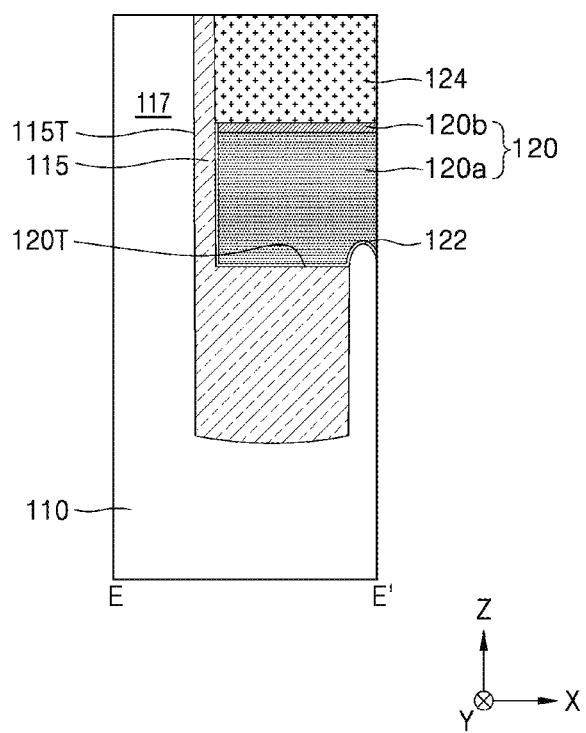
Figure 3F:
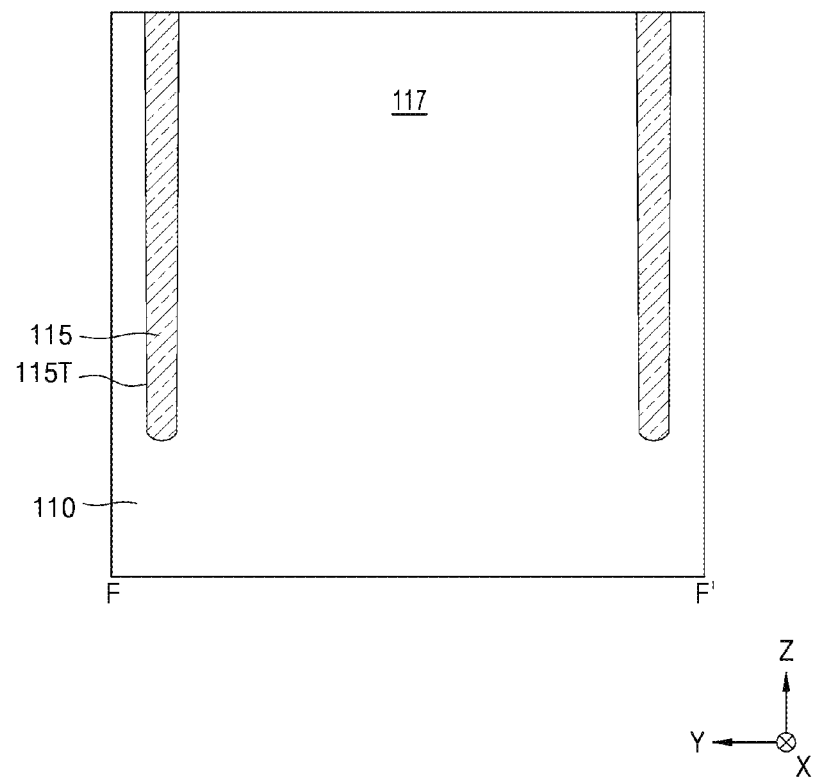
Figure 4A:
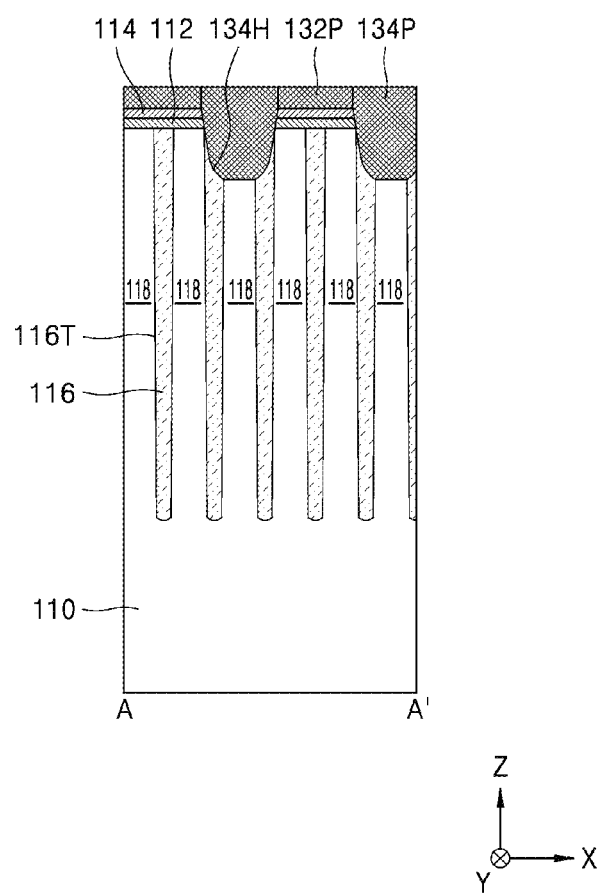
Figure 4B:
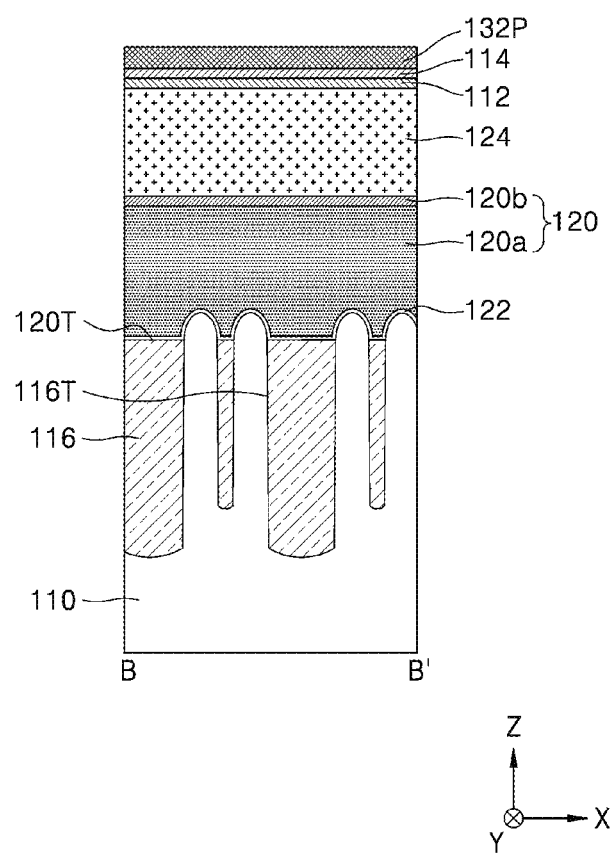
Figure 4C:
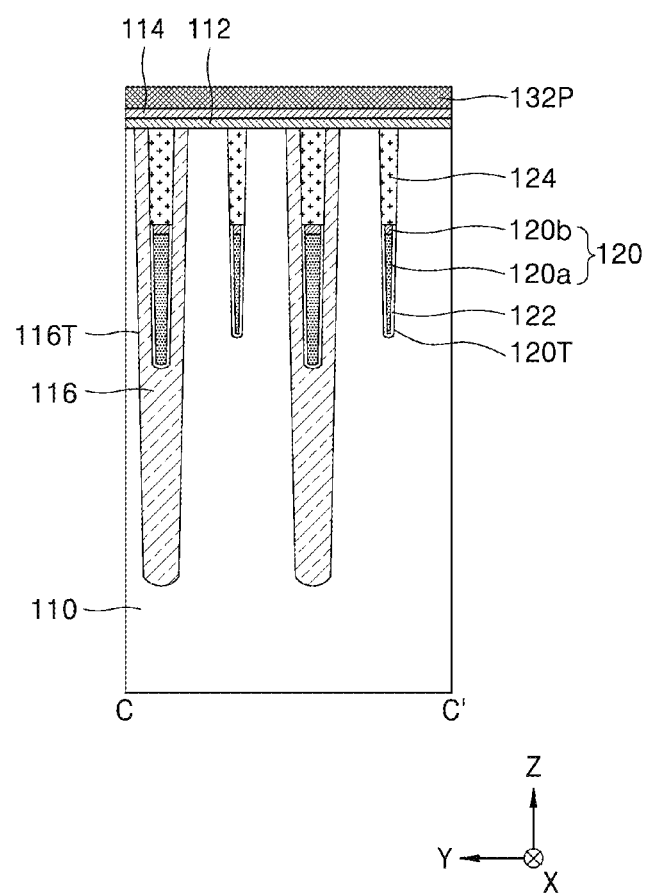
Figure 4D:
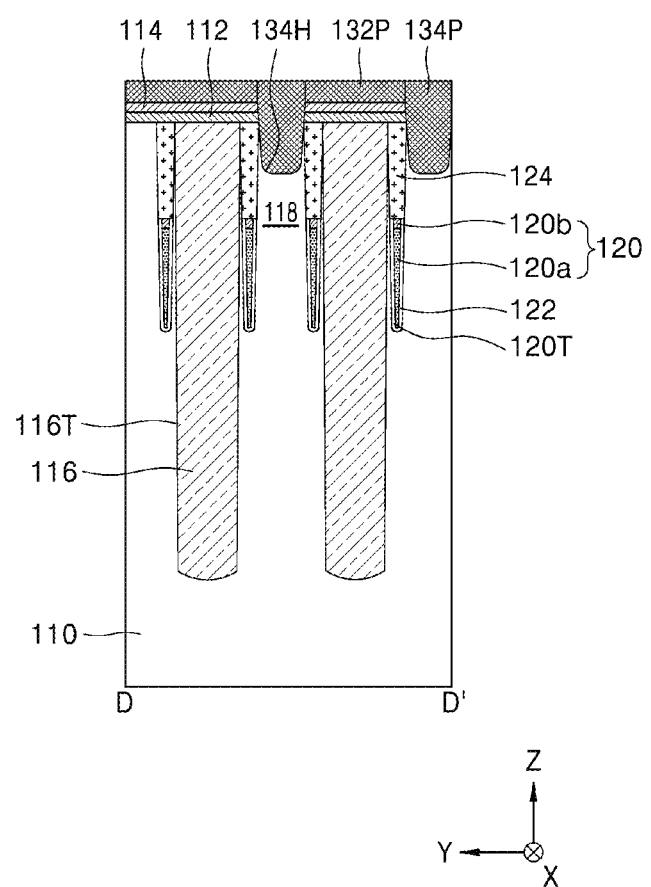
Figure 4E:
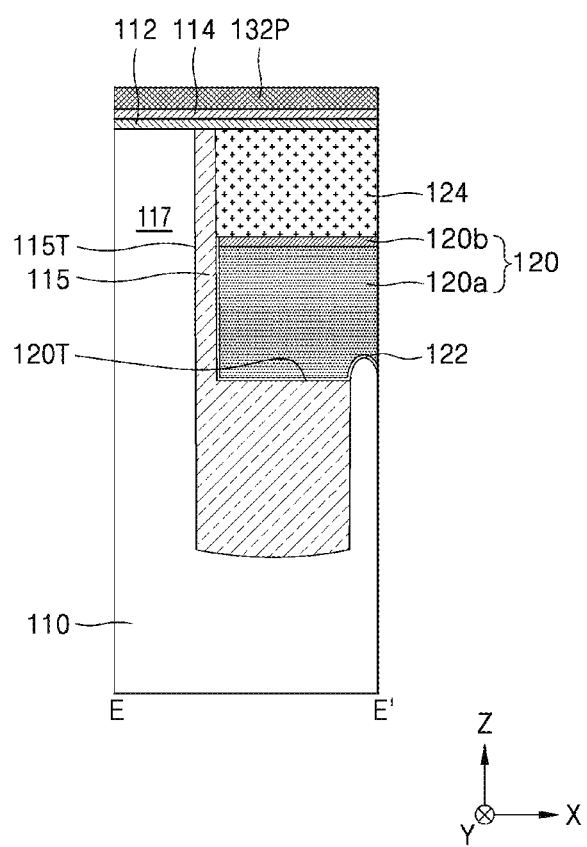
Figure 4F:
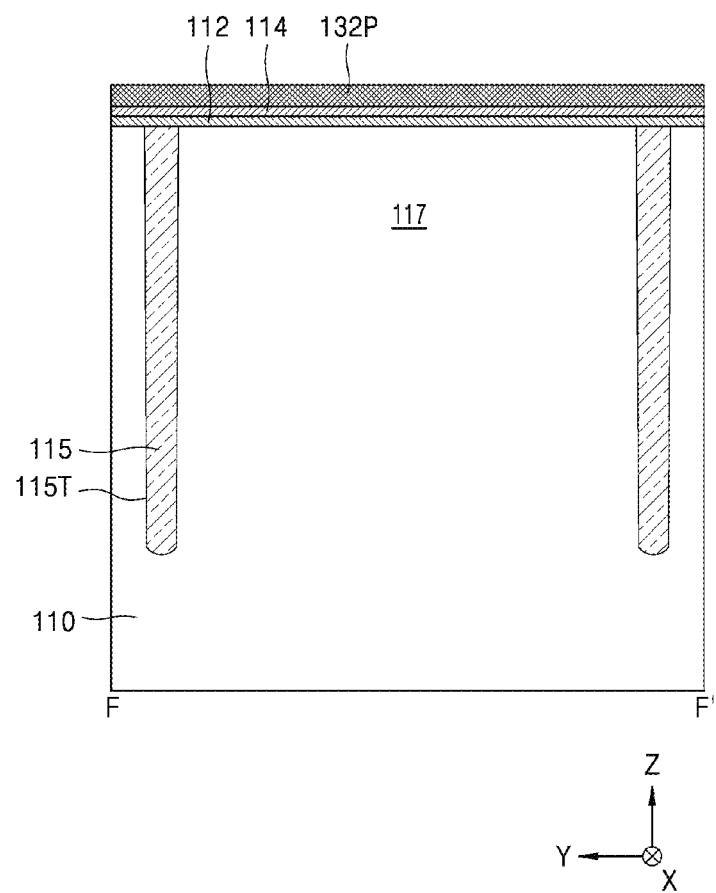
Figure 5A:
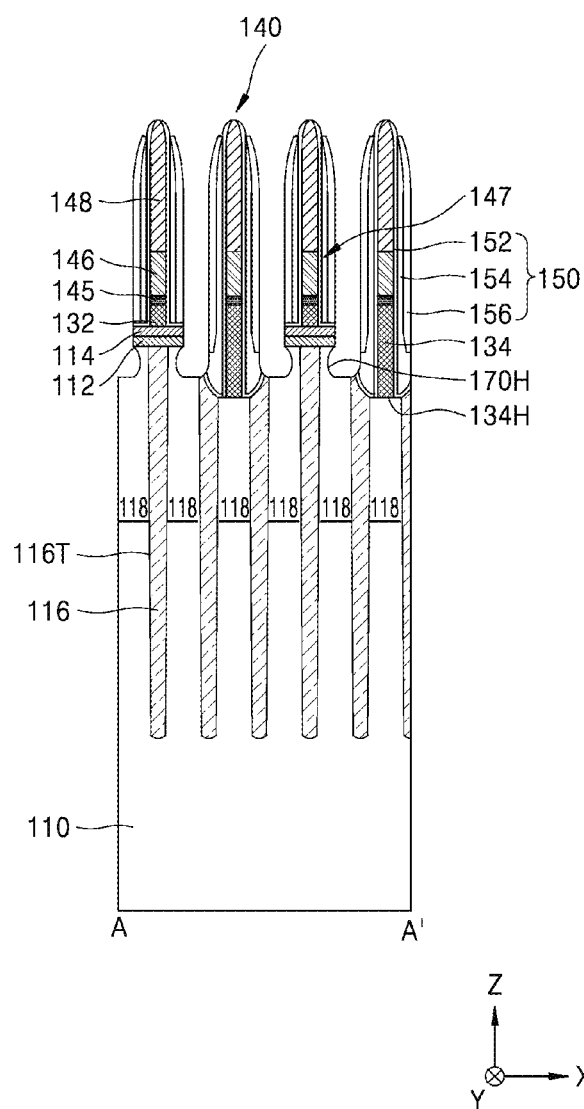
Figure 5B:
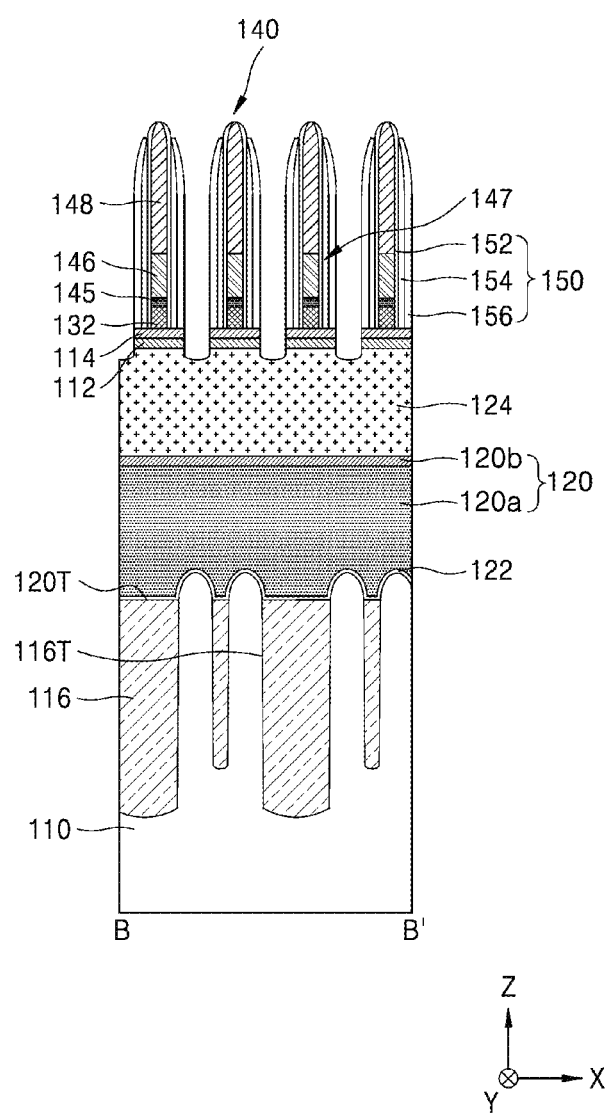
Figure 5C:
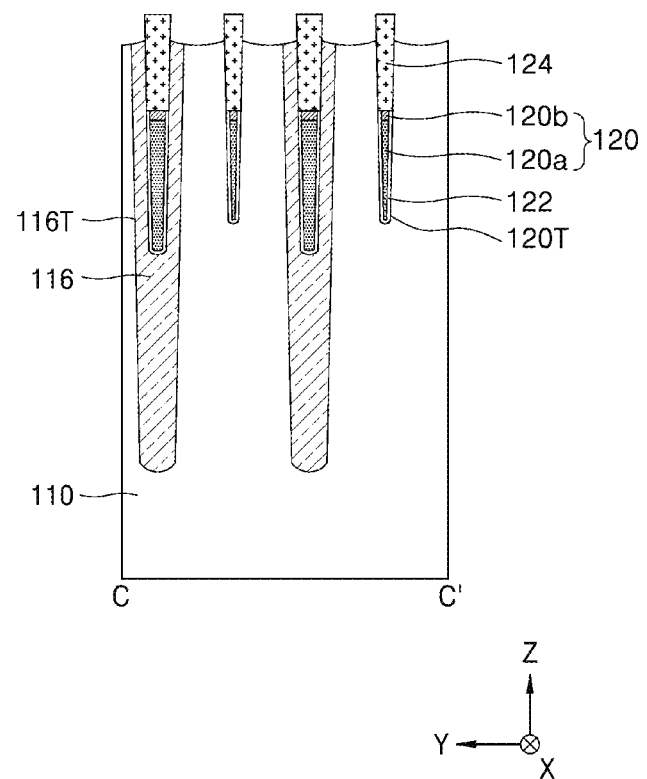
Figure 5D:
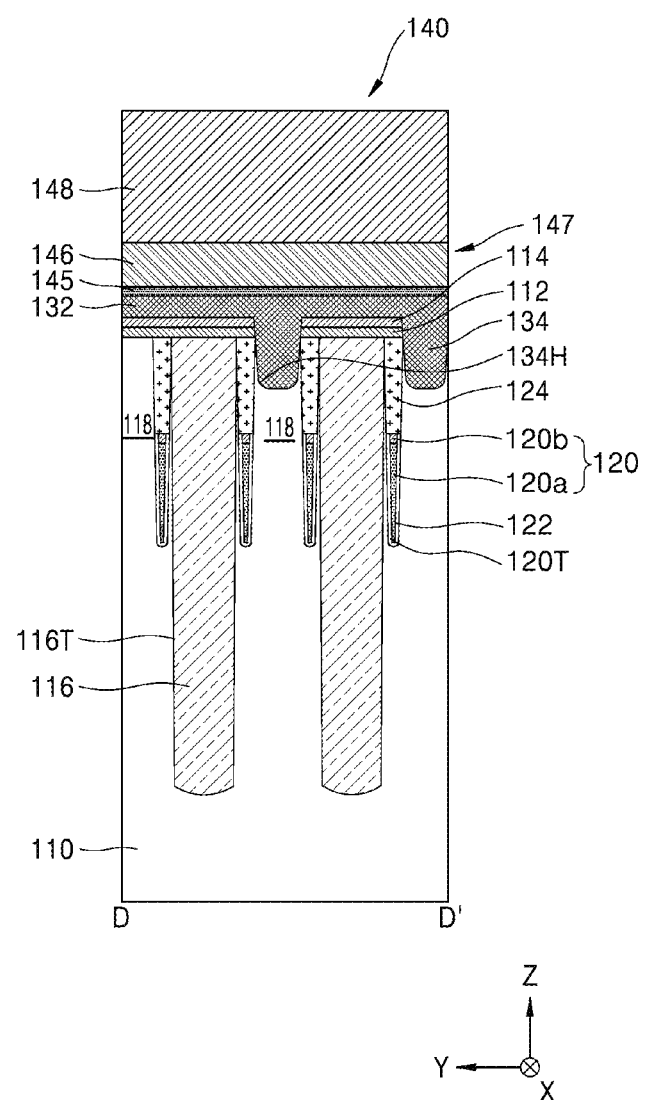
Figure 5E:
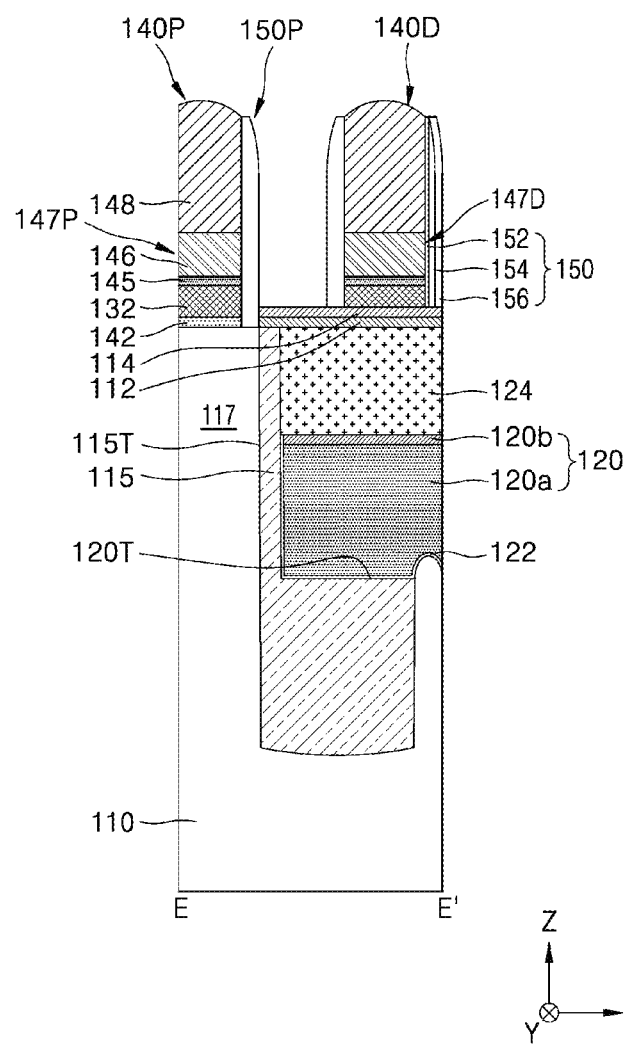
Figure 5F:
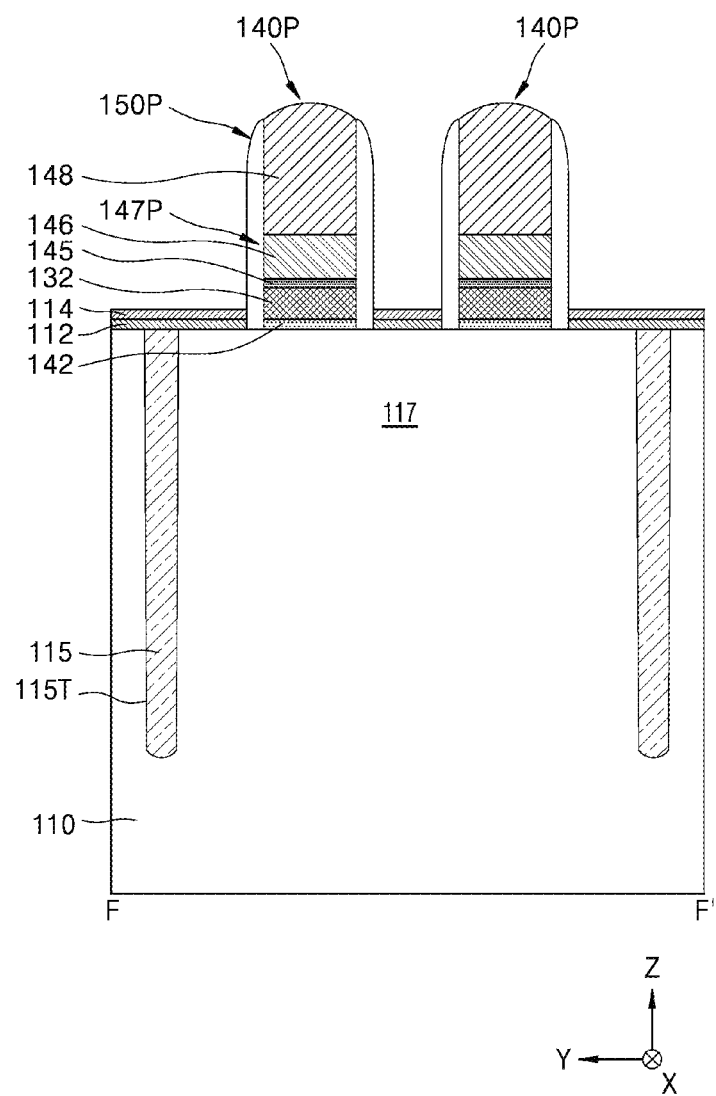
Figure 6A:
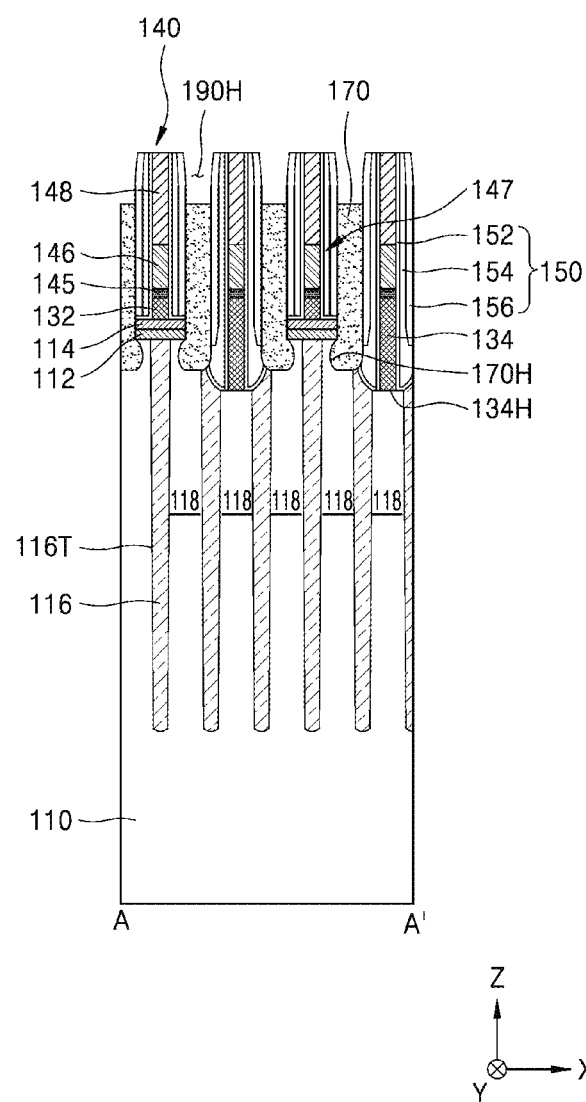
Figure 6B:
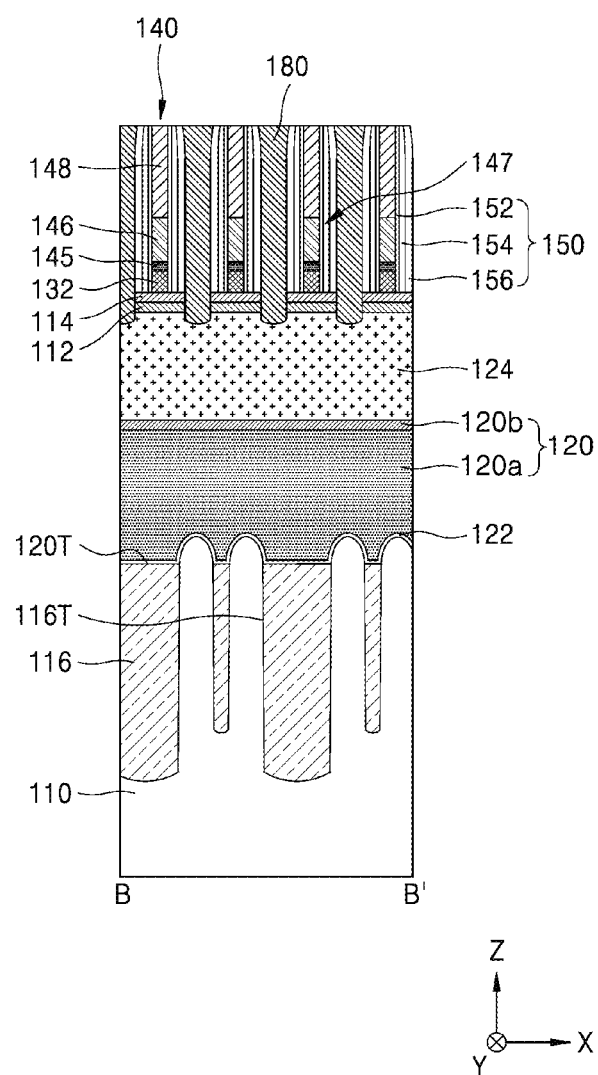
Figure 6C:
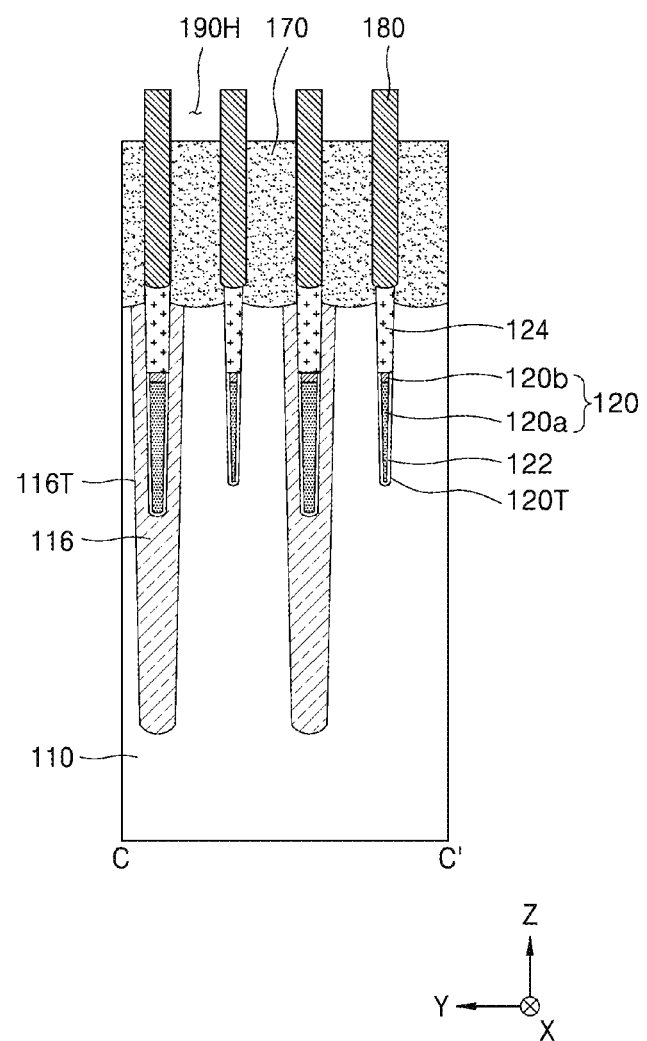
Figure 6D:
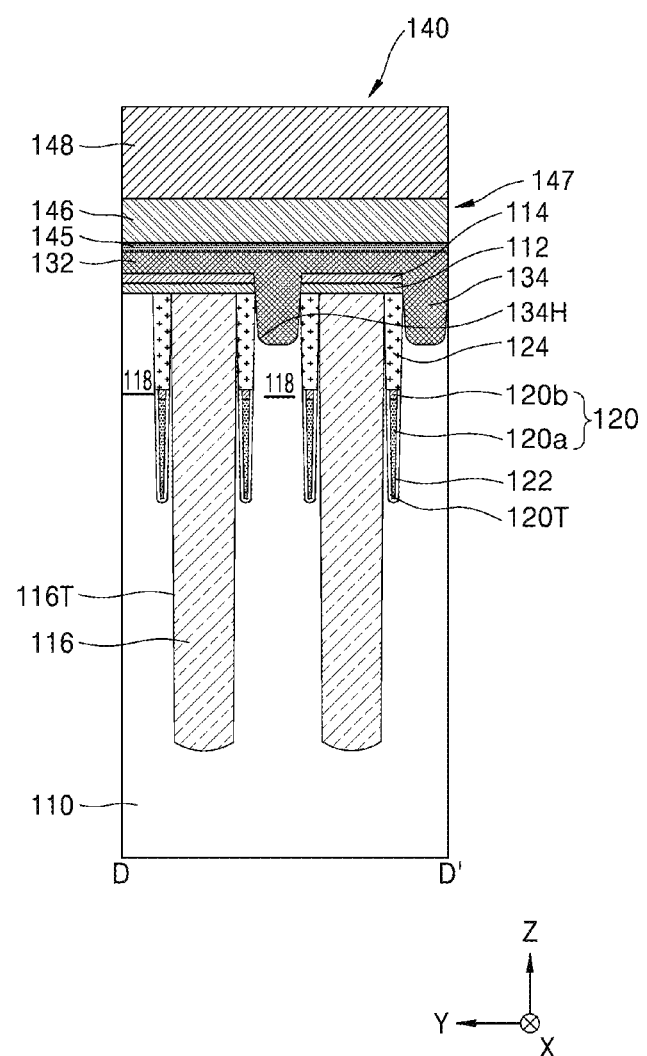
Figure 6E:
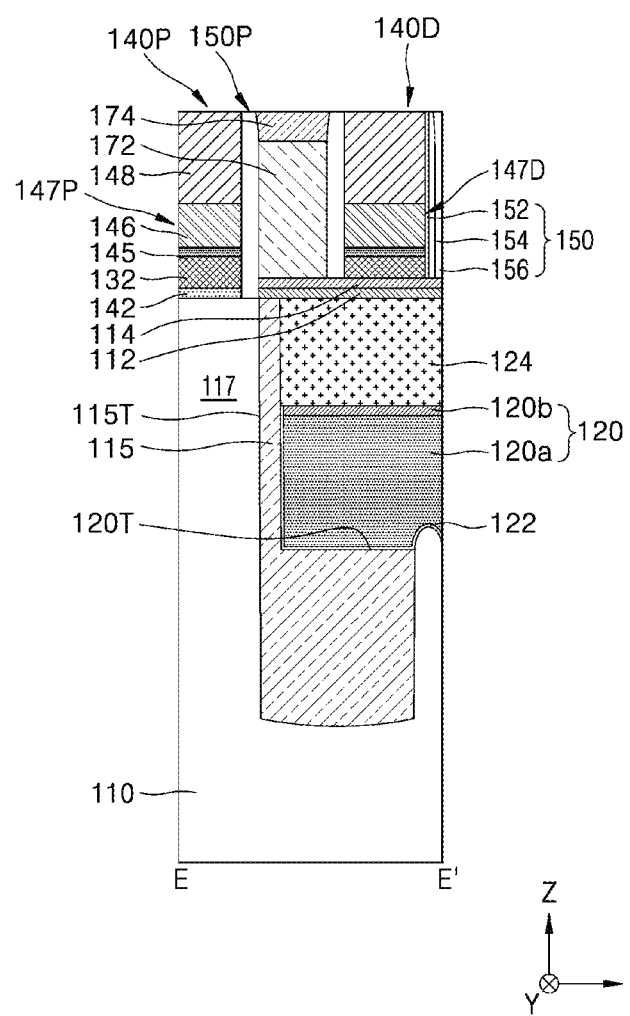
Figure 6F:
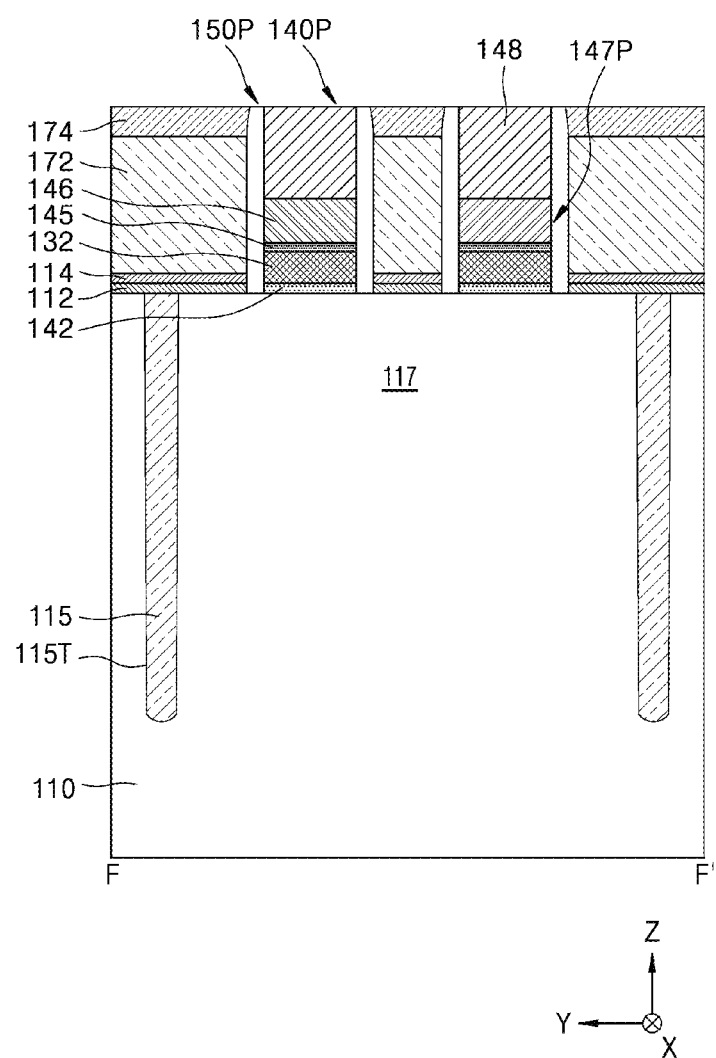
Figure 7A:
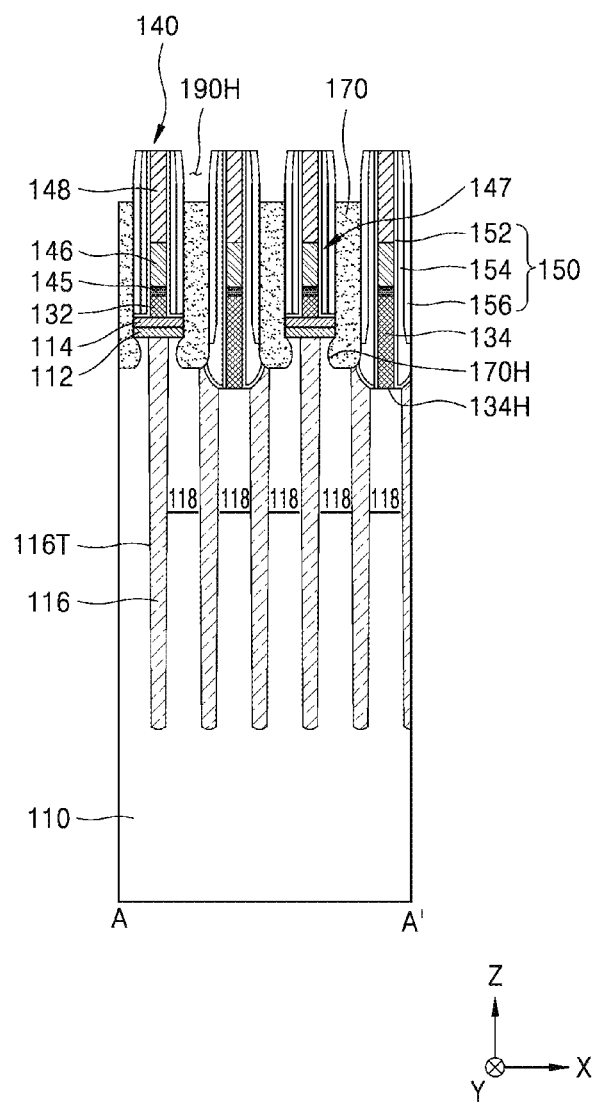
Figure 7B:
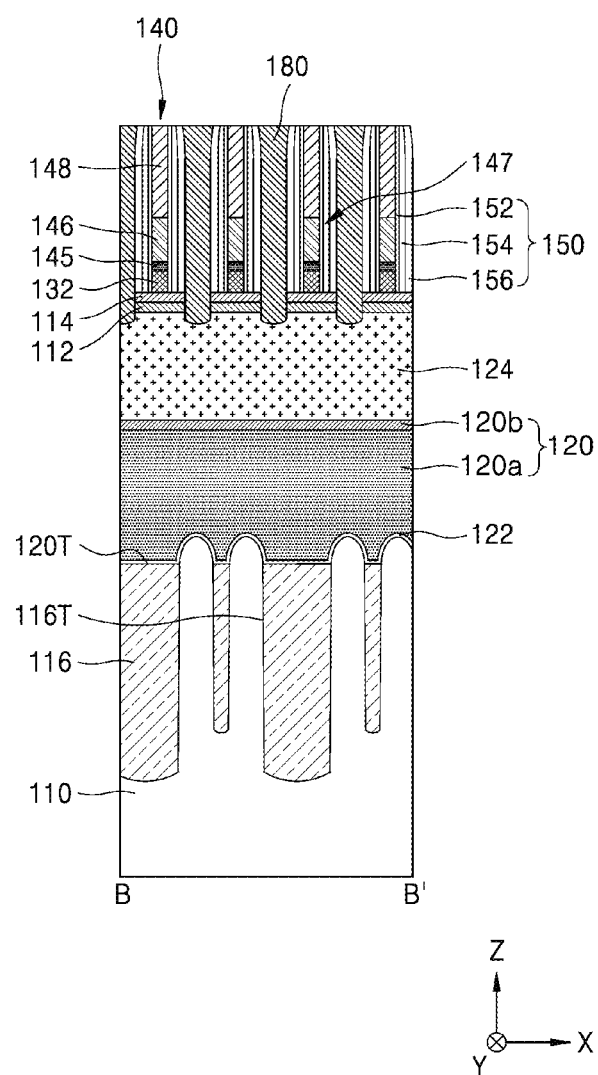
Figure 7C:
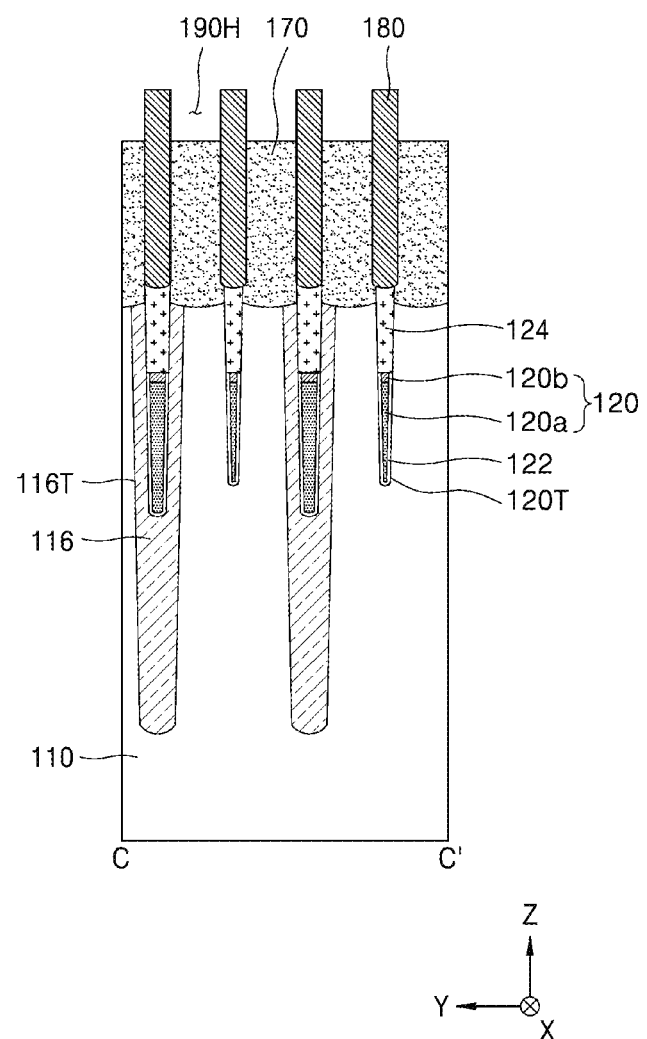
Figure 7D:
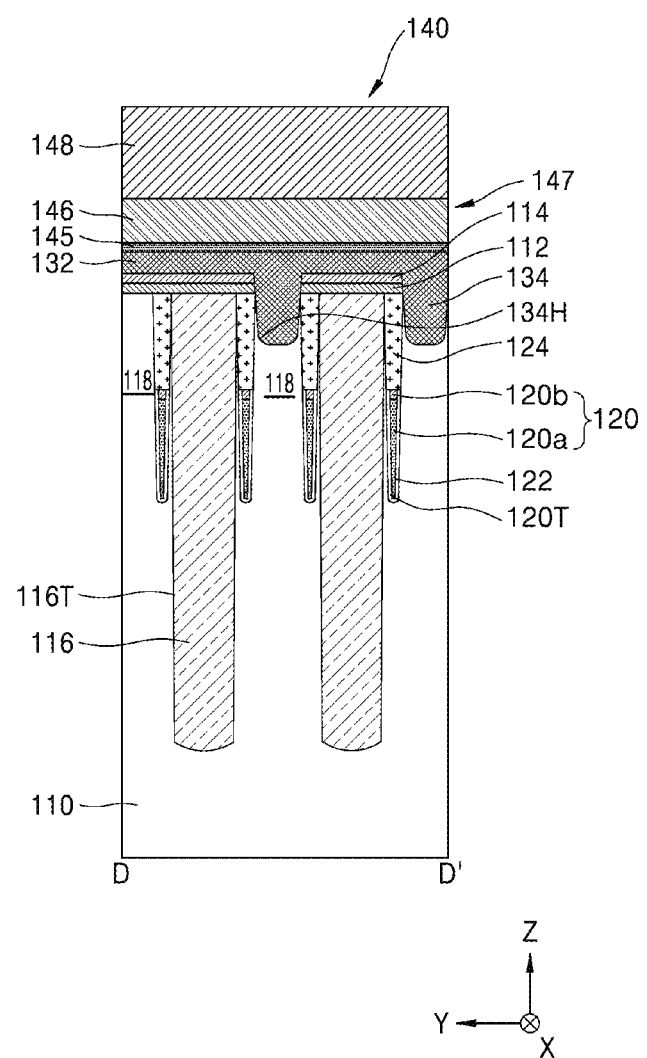
Figure 7E:
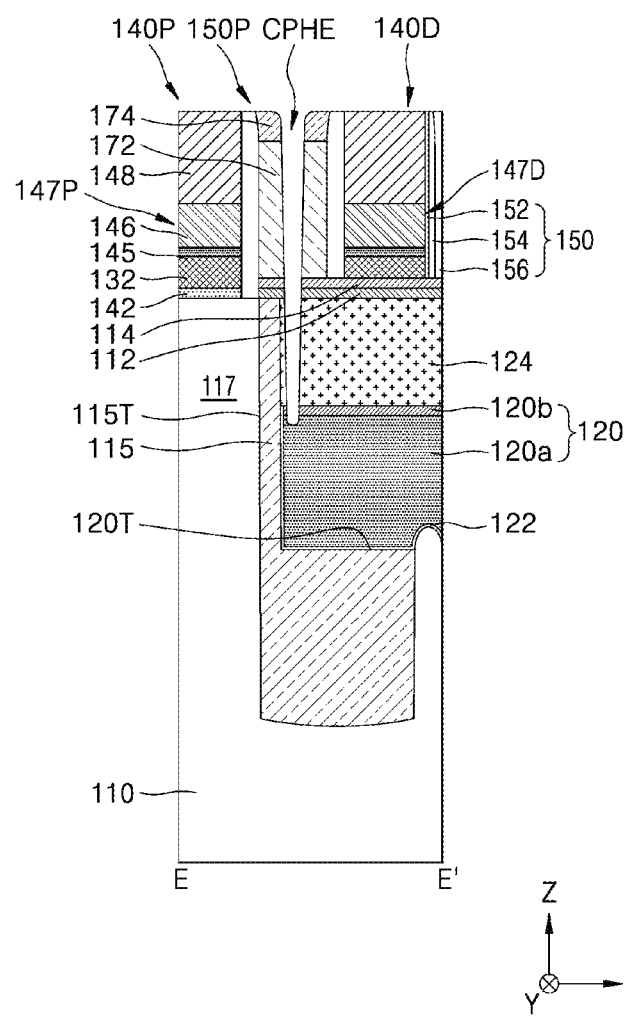
Figure 7F:
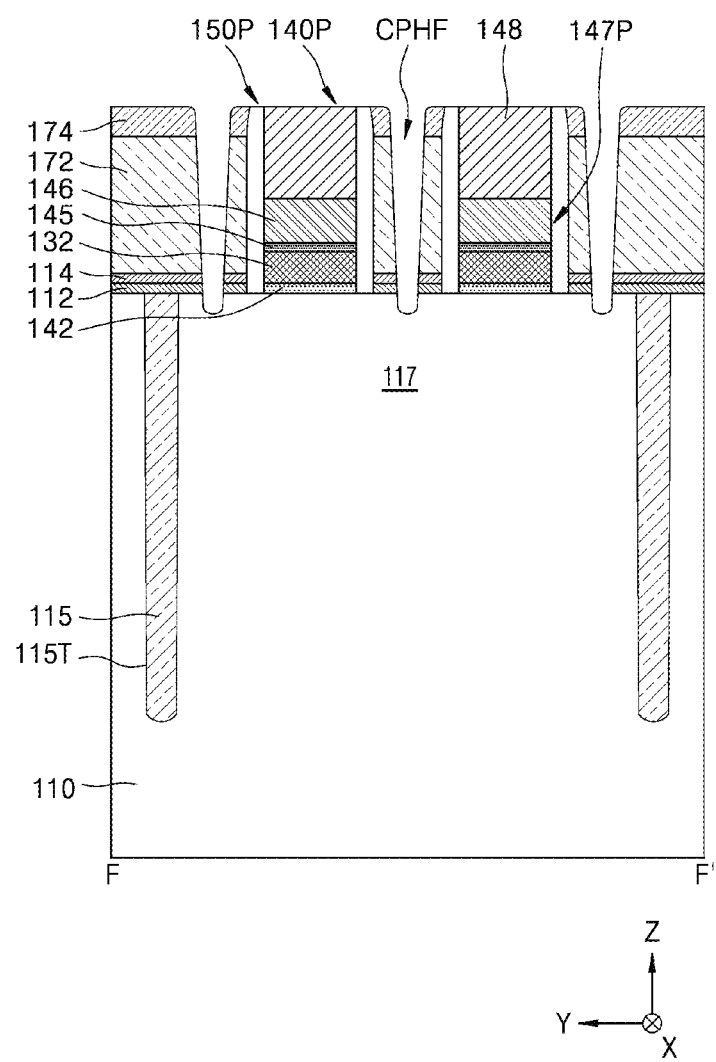
Figure 8A:
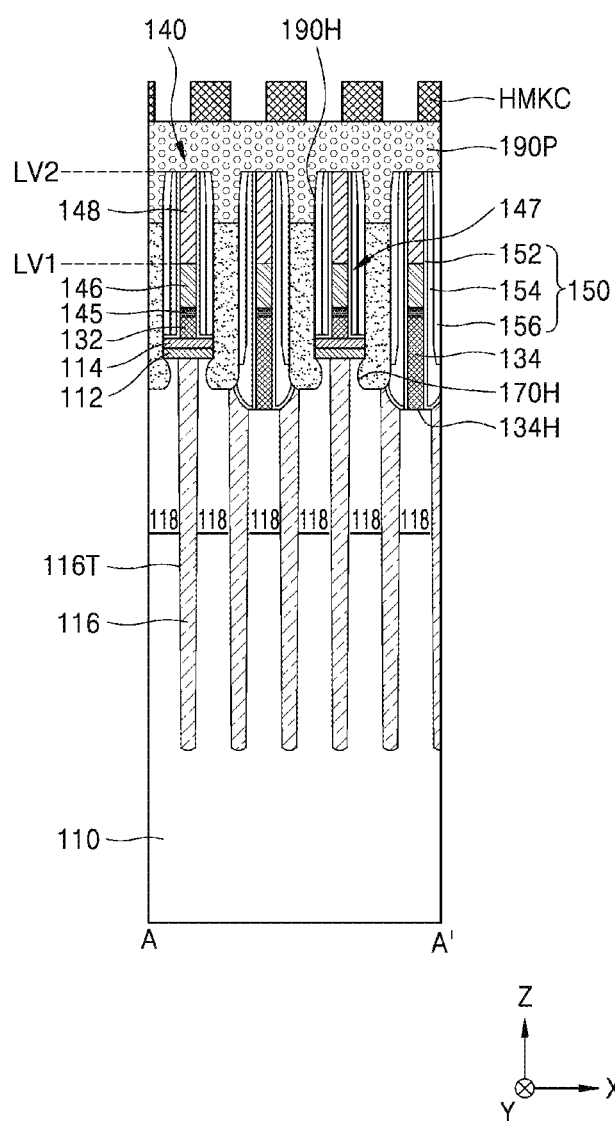
Figure 8B:
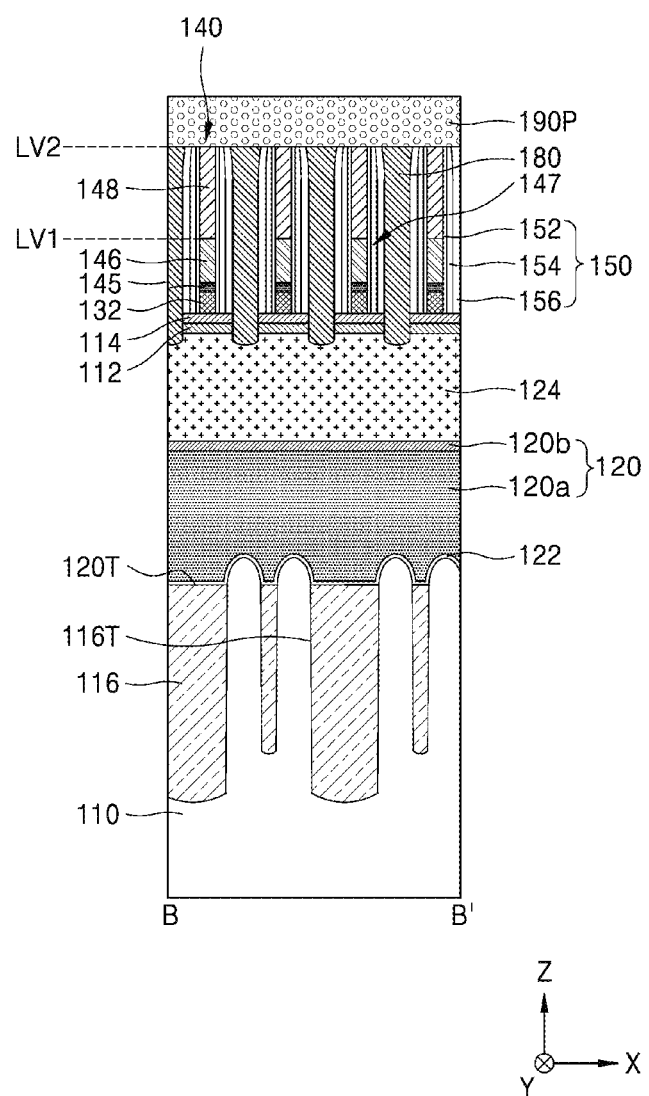
Figure 8C:
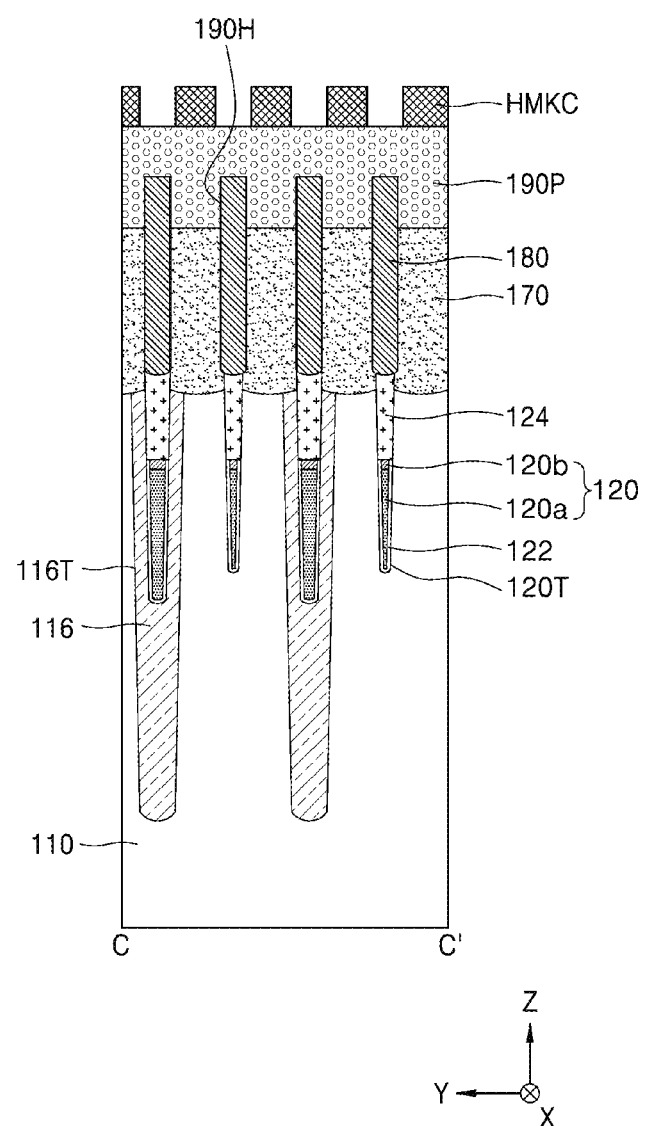
Figure 8D:
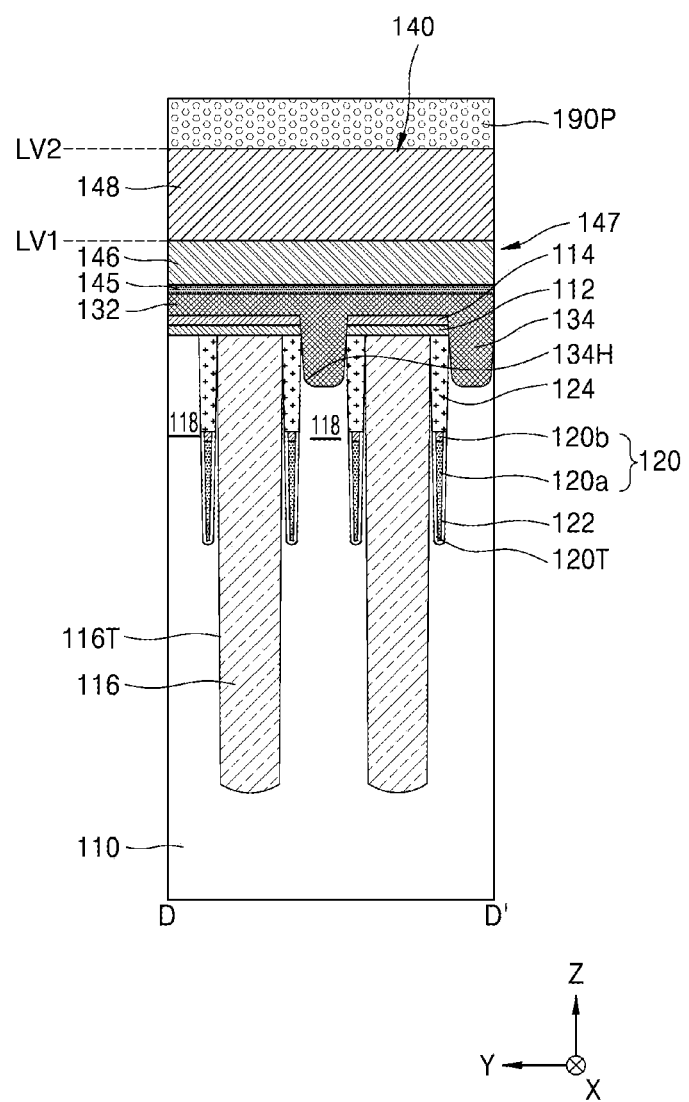
Figure 8E:
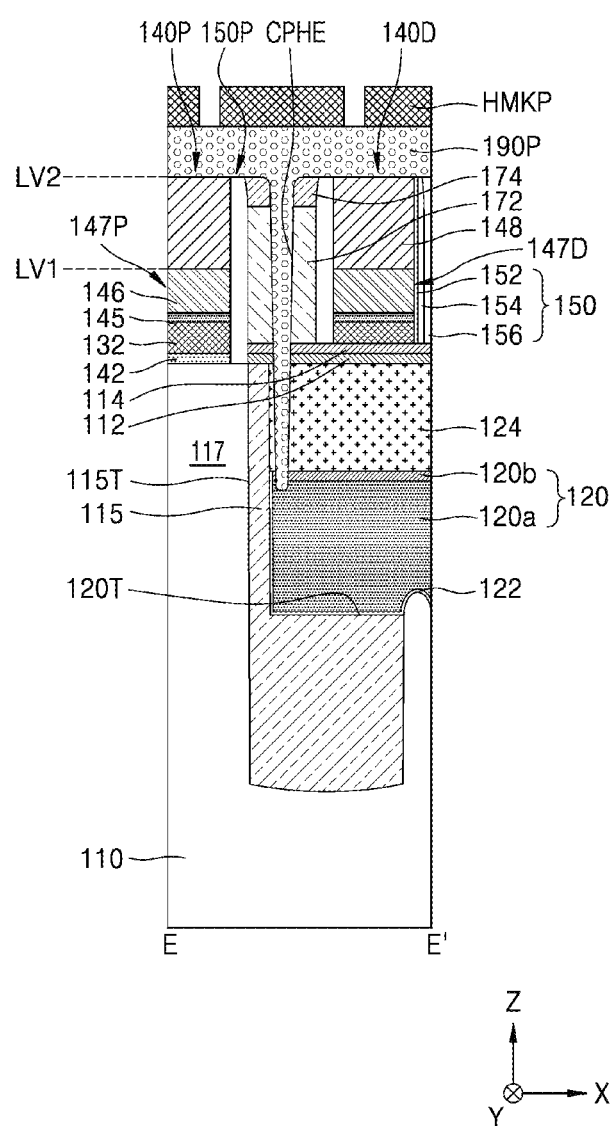
Figure 8F:
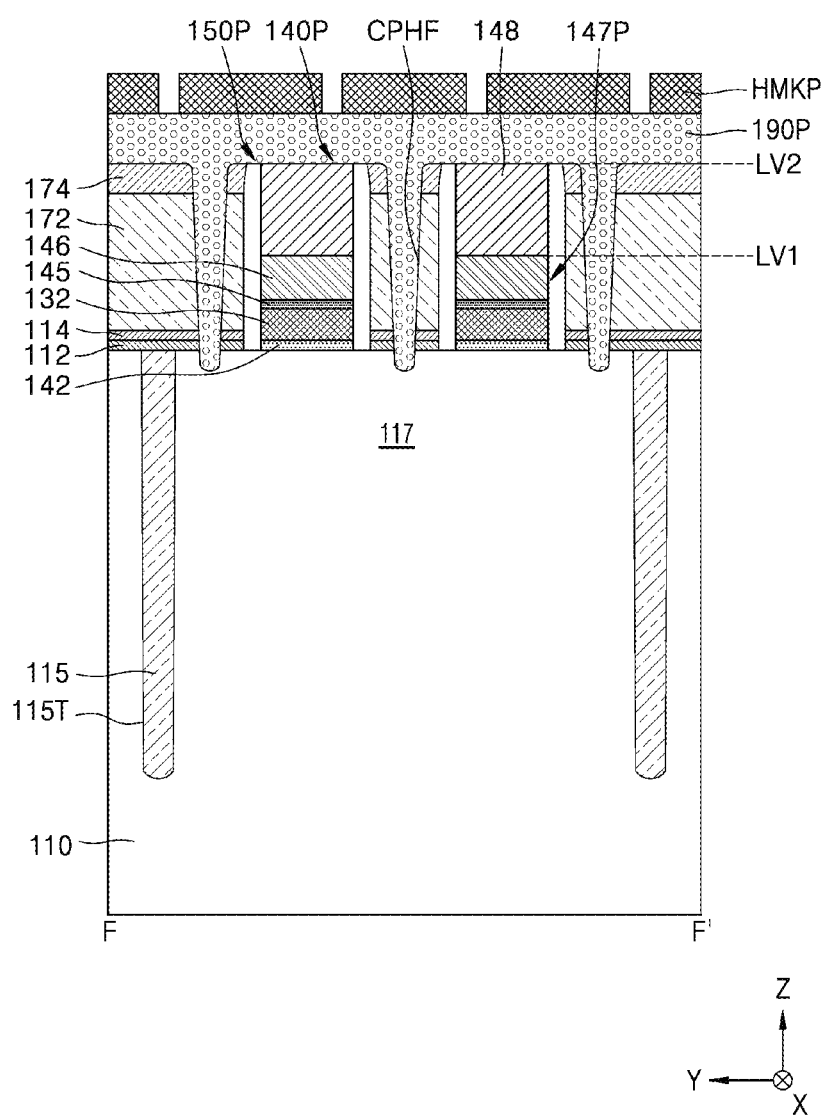
Figure 9A:
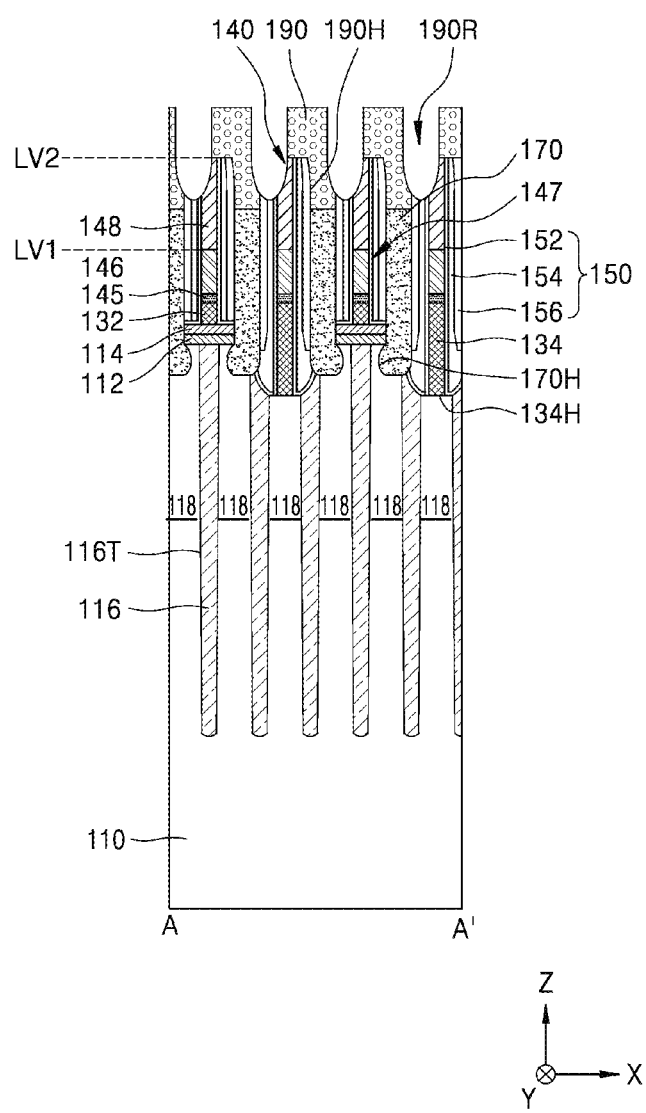
Figure 9B:
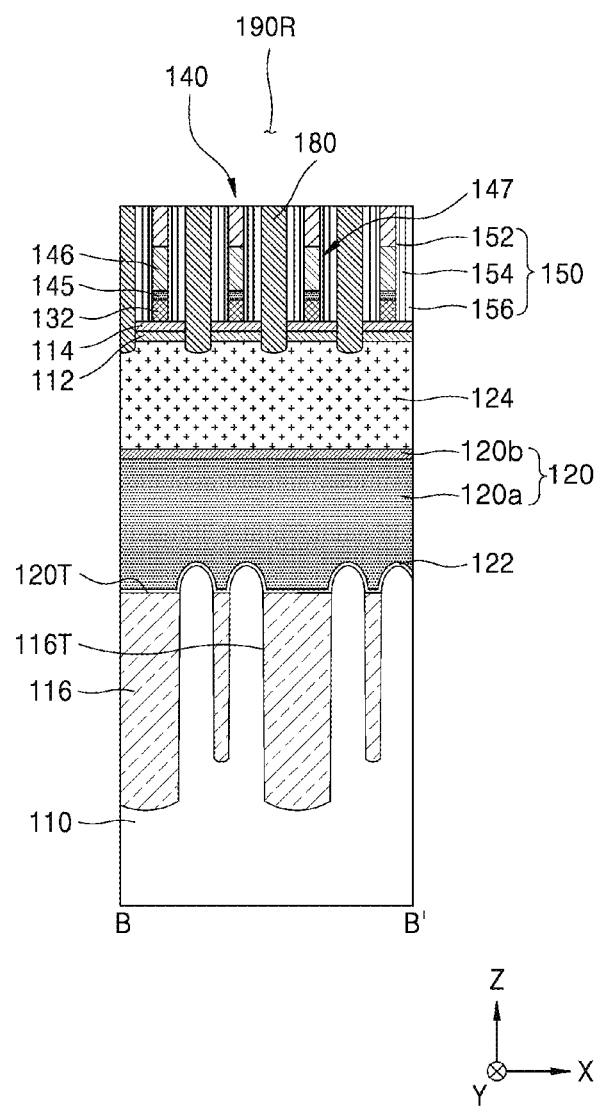
Figure 9C:
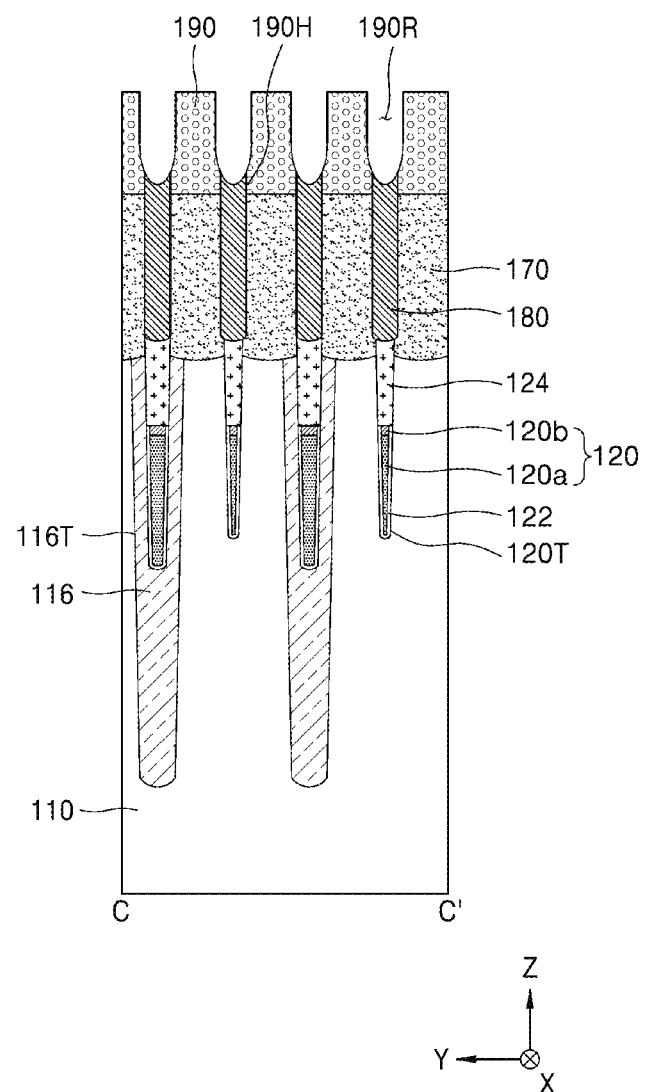
Figure 9D:
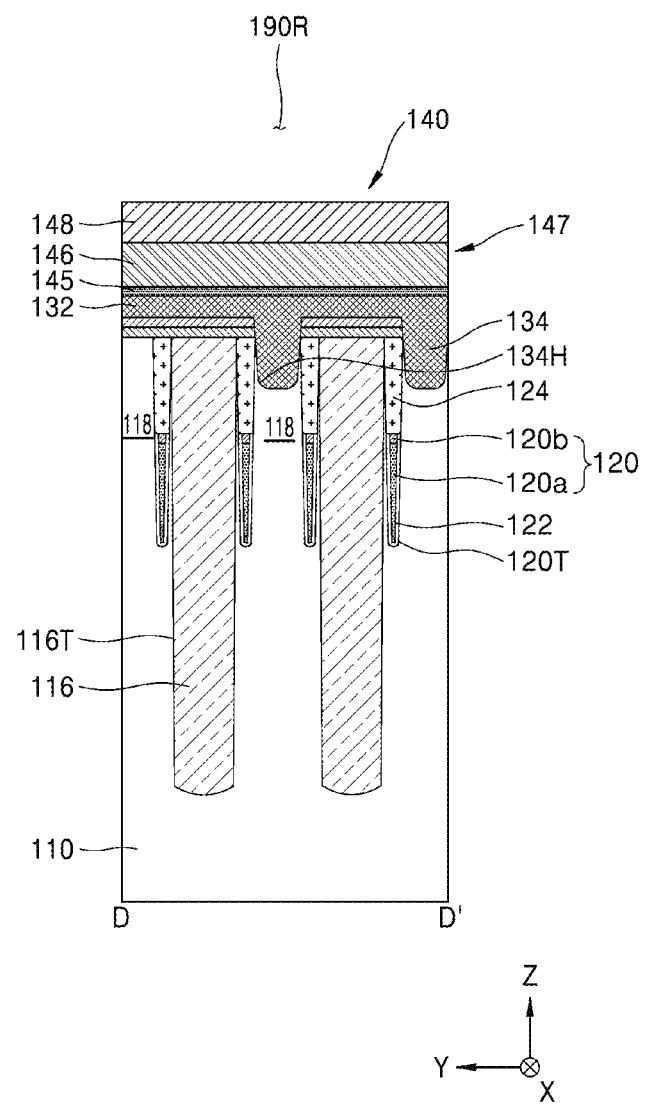
Figure 9E:
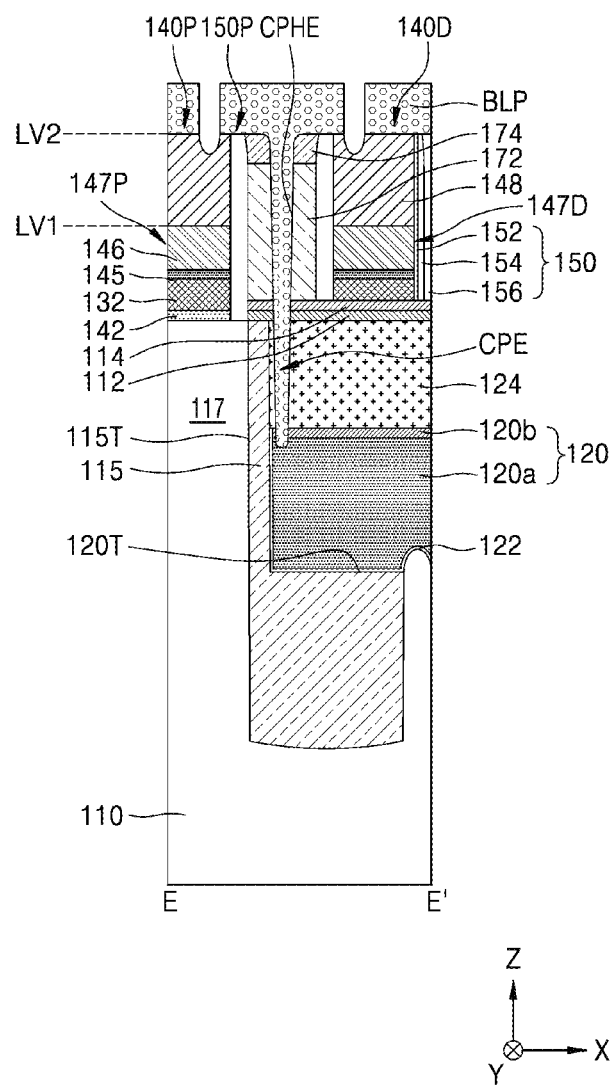
Figure 9F:
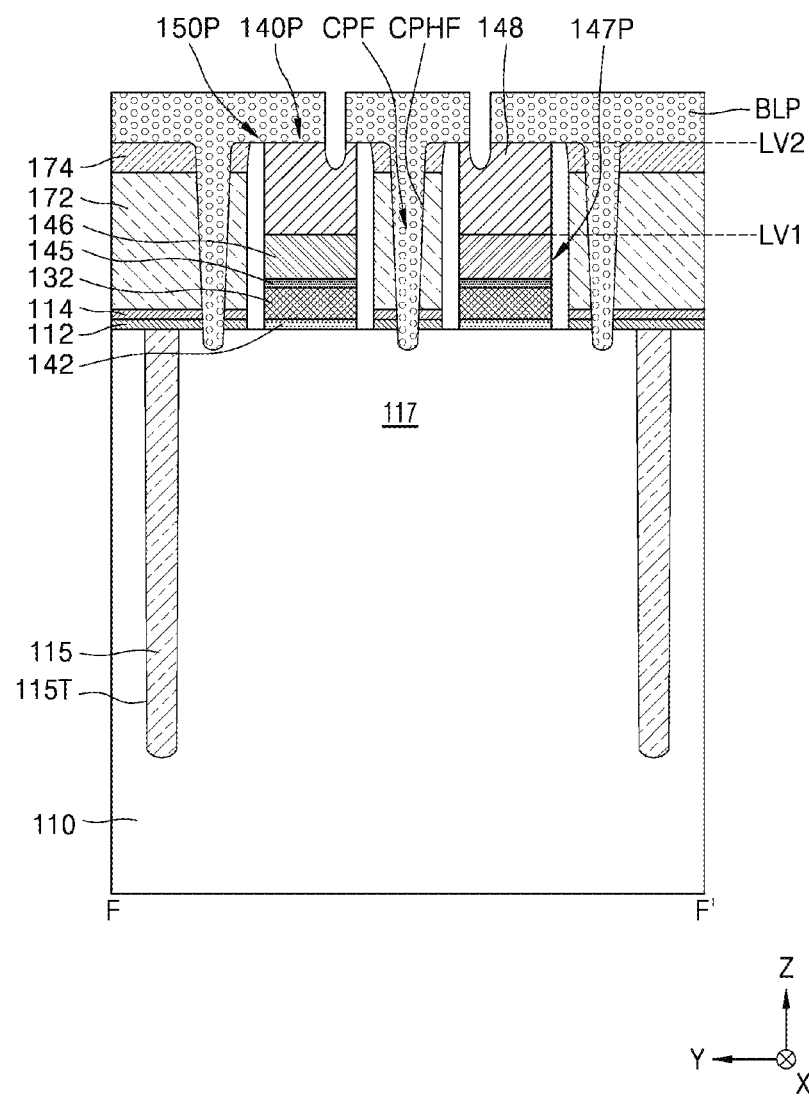

In FIG. 2, in the peripheral area PR, other components excluding the plurality of logic active areas ACTP and the plurality of gate line patterns GLP are omitted for convenience sake. In addition, in FIG. 2, it is illustrated that the plurality of gate line patterns GLP are arranged only on the plurality of logic active areas ACTP. However, inventive concepts are not limited thereto. For example, at least some of the plurality of gate line patterns GLP may extend to the outside of the plurality of logic active areas ACTP, that is, onto a plurality of logic isolation layers (115 of FIGS. 3E to 3F).

The plurality of gate line patterns GLP may be at the same level as the plurality of bit lines BL. In some embodiments, the plurality of gate line patterns GLP and the plurality of bit lines BL may include the same material or at least some of the plurality of gate line patterns GLP and the plurality of bit lines BL may include the same material as each other. For example, all or some of processes of forming all or some of the plurality of gate line patterns GLP and processes of forming the plurality of bit lines BL may be the same.

Figure 21A:
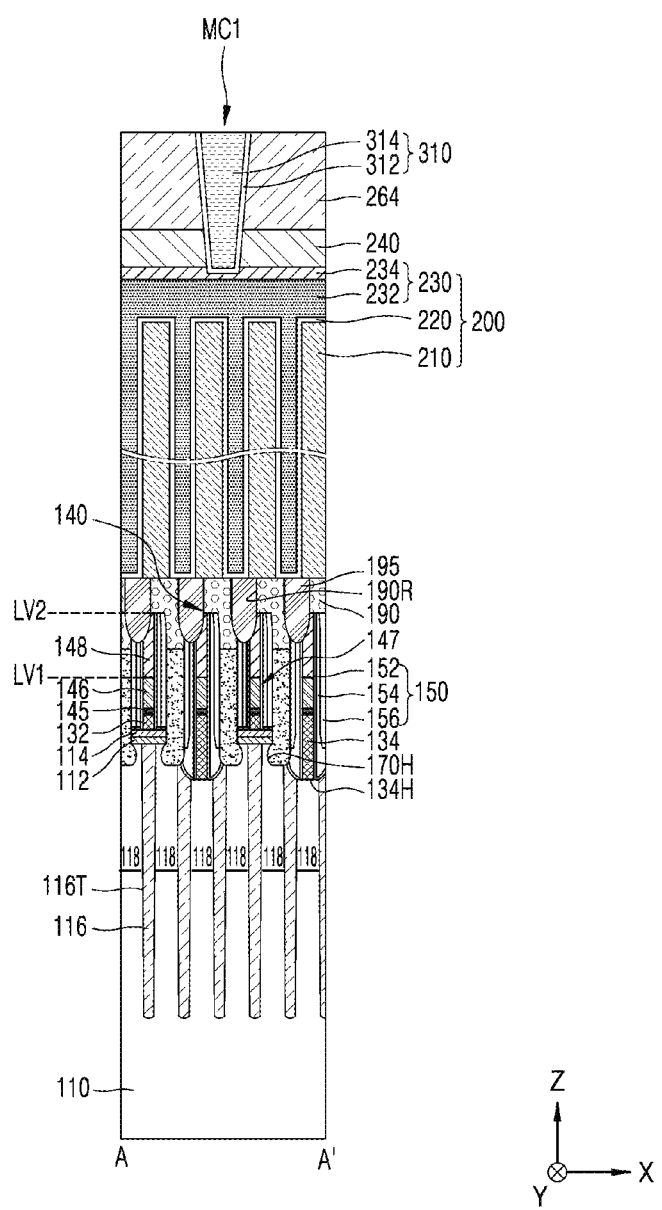
Figure 21B:
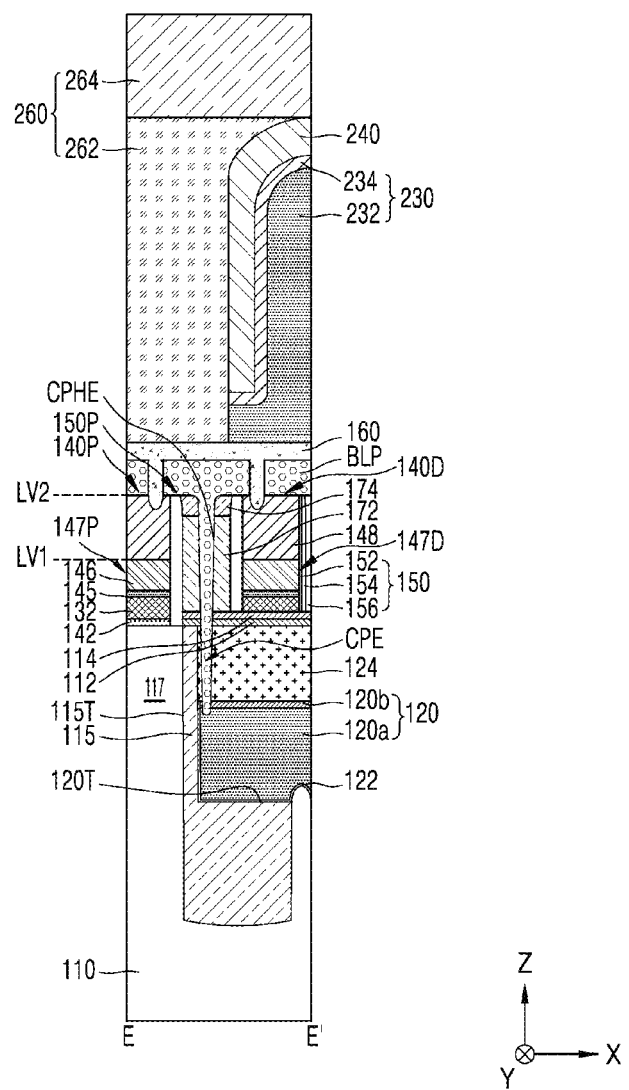
Figure 21C:
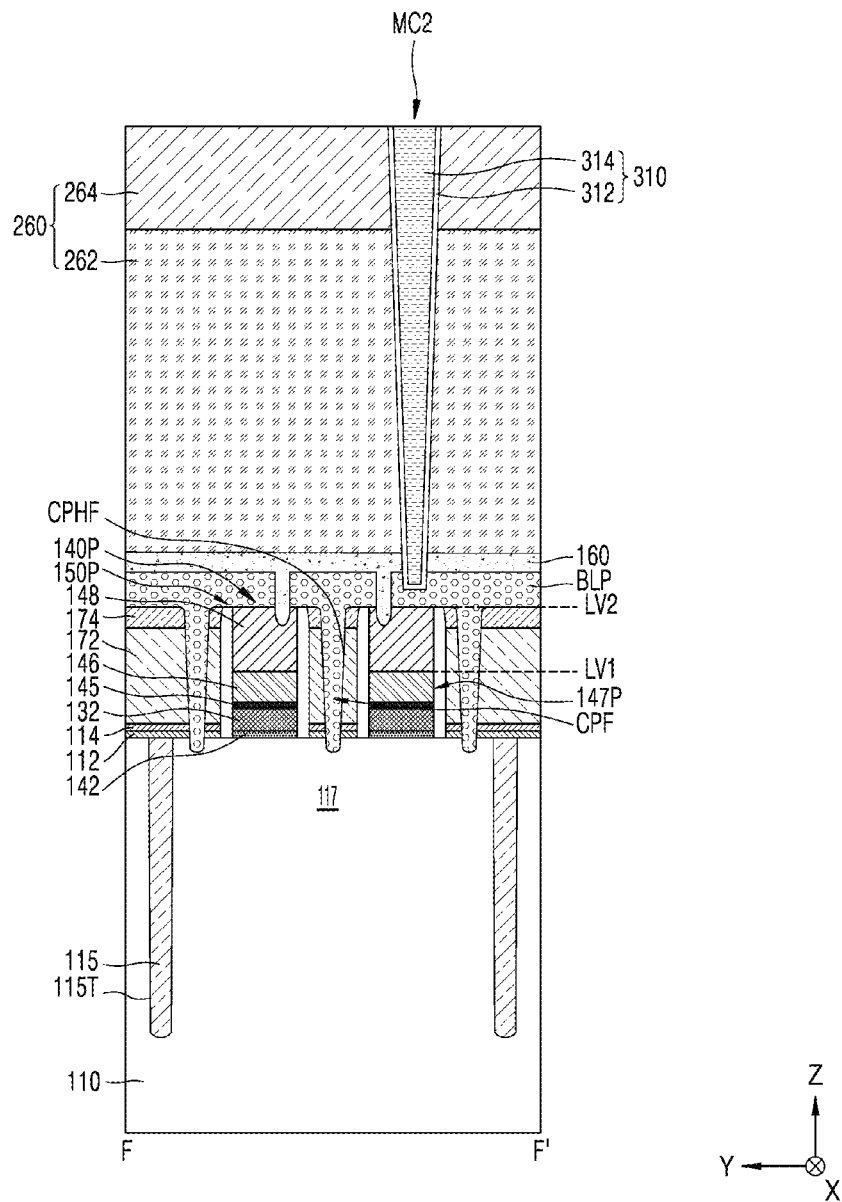
Figure 22A:
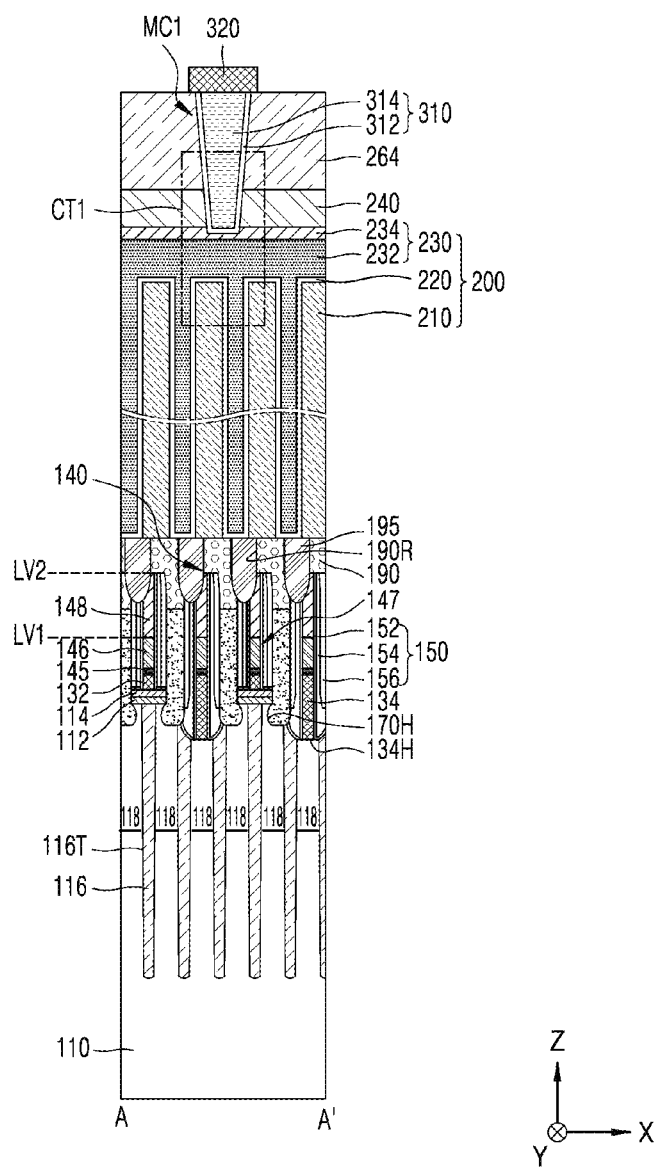
FIGS. 22A to 22E are cross-sectional views illustrating a semiconductor memory device according to embodiments of inventive concepts.
Figure 22B:
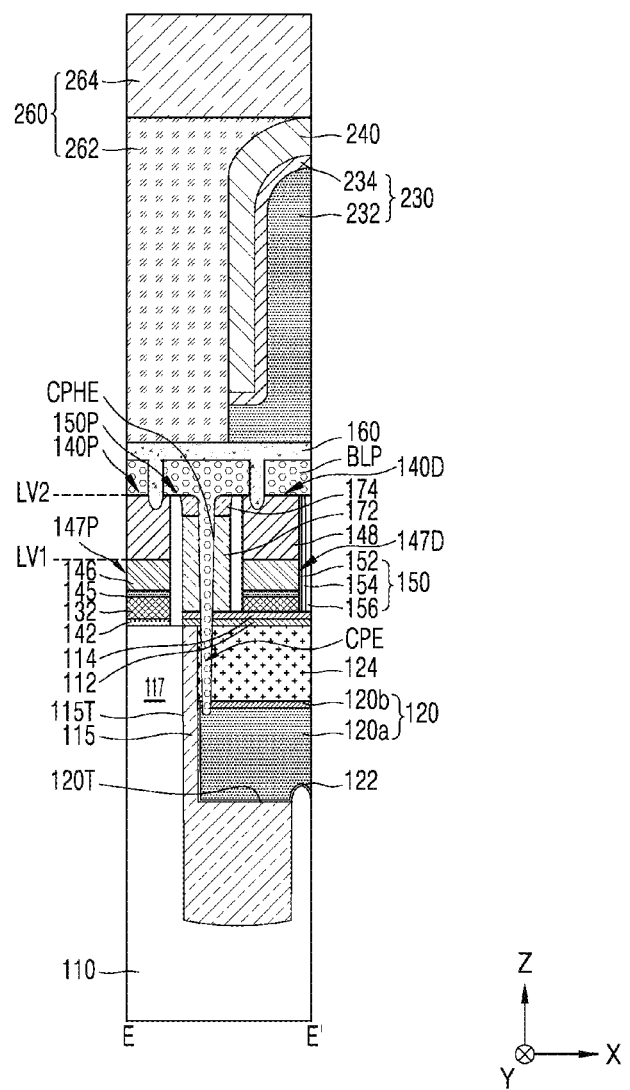
Figure 22C:
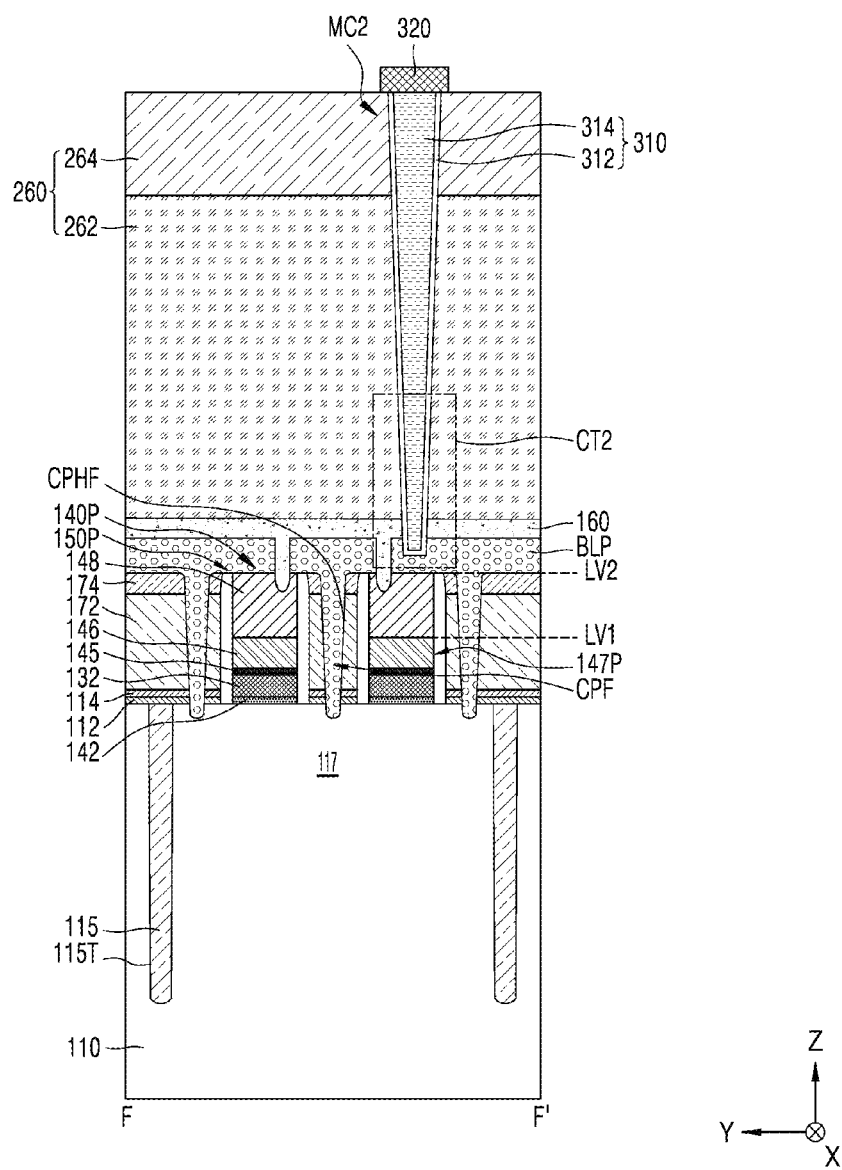
Figure 22D:
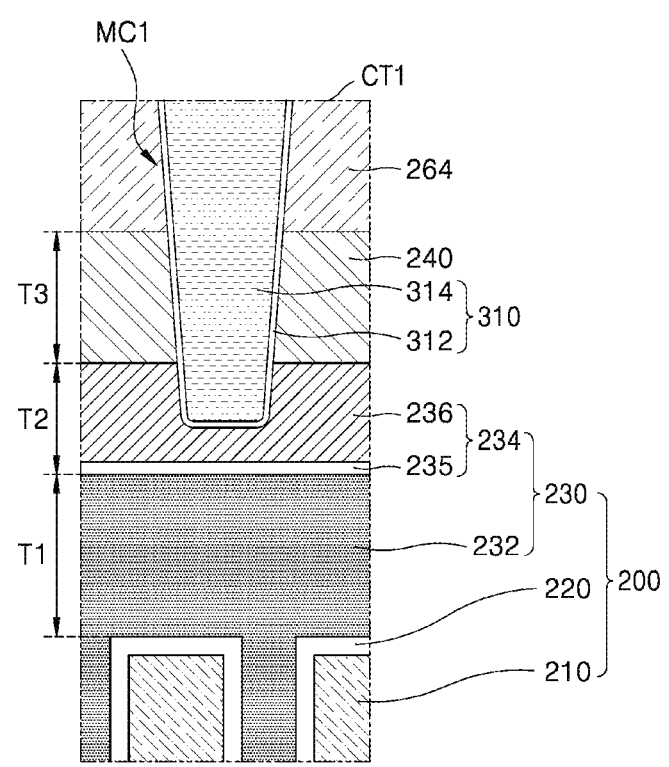
Figure 22E:
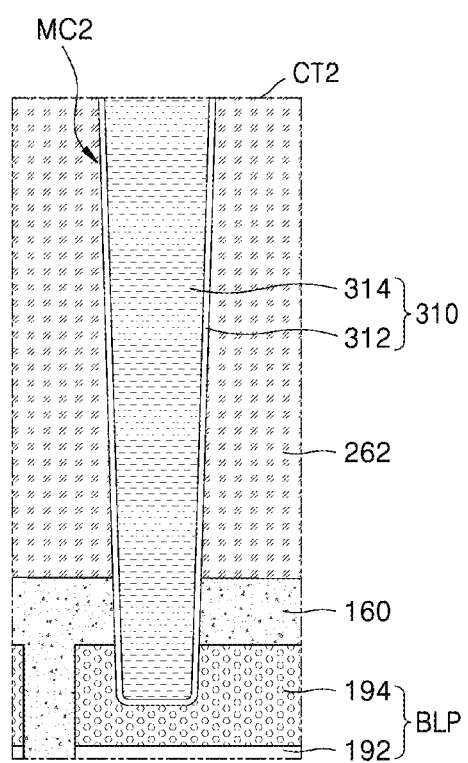
Figure 23A:
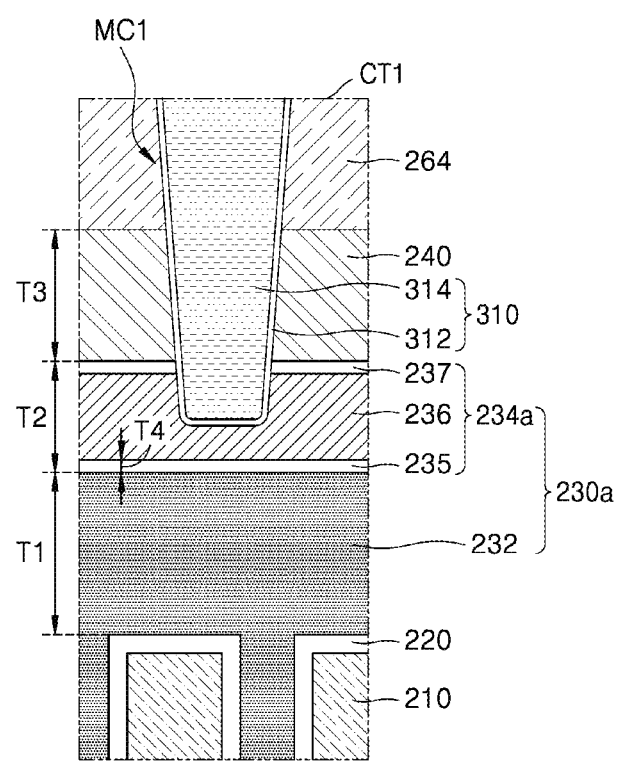
FIGS. 23A to 23F are cross-sectional views illustrating an enlarged part of a semiconductor memory device according to embodiments of inventive concepts.
Figure 23B:
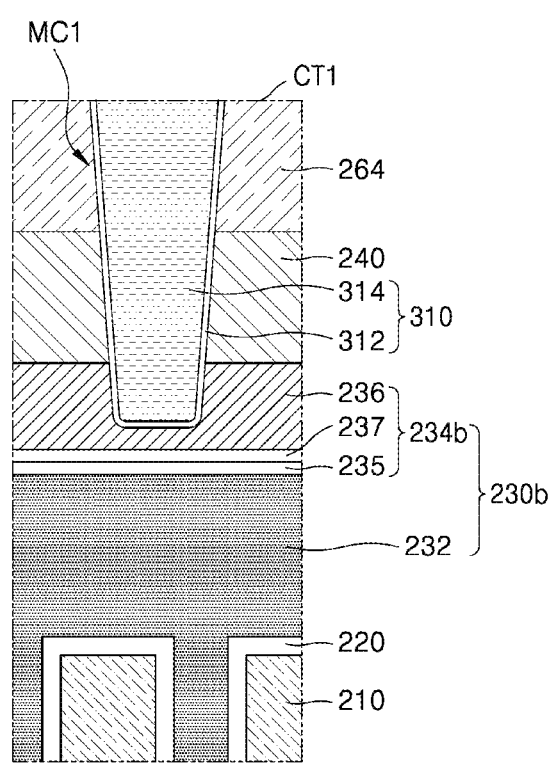
Figure 23C:
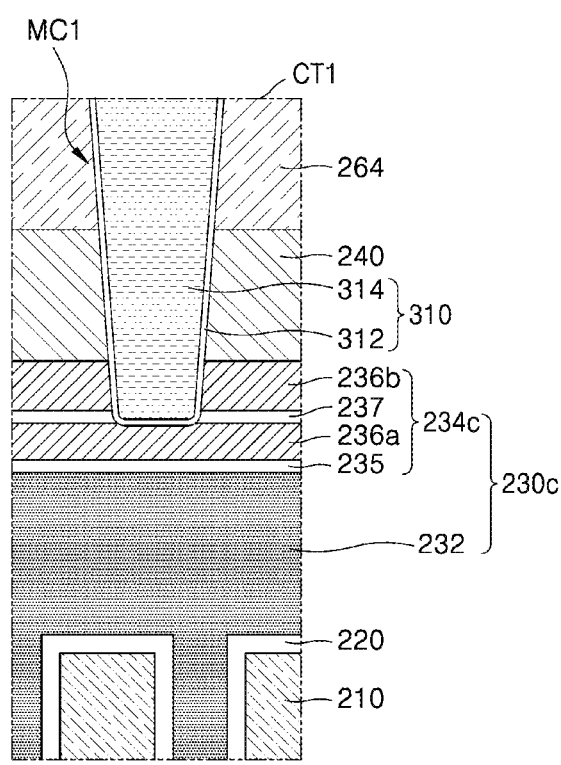
Figure 23D:
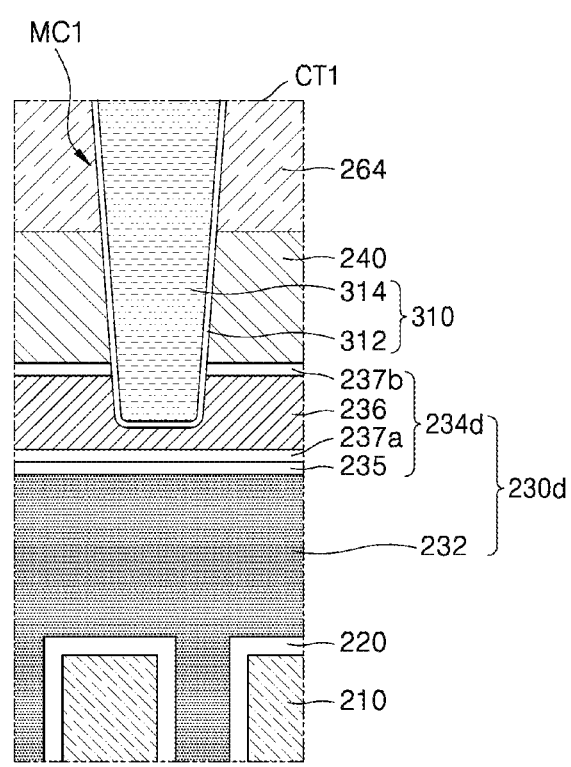
Figure 23E:
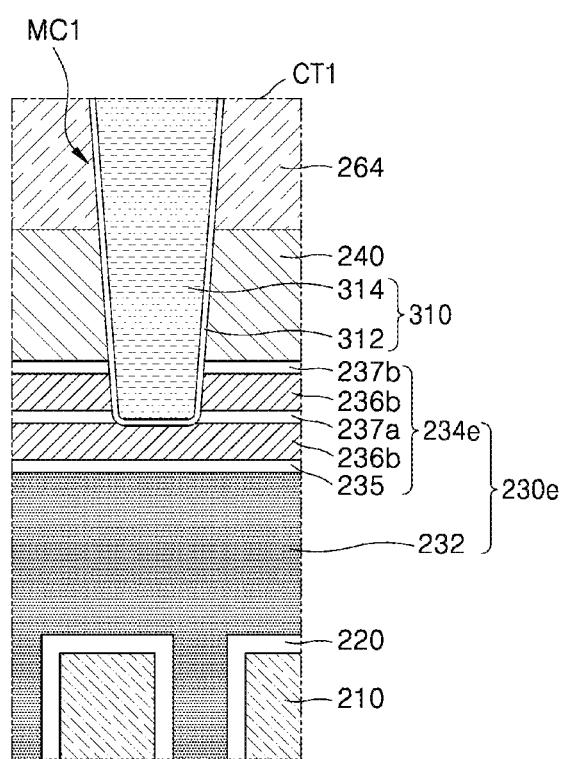
Figure 23F:
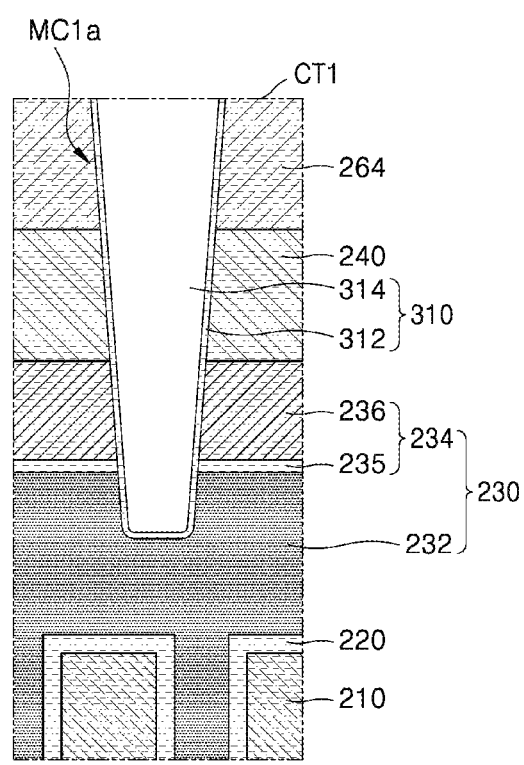

FIGS. 3A to 3F, 4A to 4F, 5A to 5F, 6A to 6F, 7A to 7F, 8A to 8F, 9A to 9F, 10A to 10F, 11A to 11C, 12A to 12C, 13A to 13C, 14A to 14C, 15A to 15C, 16A to 16C, 17A to 17C, 18A to 18C, 19A to 19C, 20A to 20C, and 21A to 21C are cross-sectional views illustrating a method of manufacturing a semiconductor memory device operation by operation according to embodiments of inventive concepts, and FIGS. 22A to 22E are cross-sectional views illustrating a semiconductor memory device according to embodiments of inventive concepts. Specifically, FIGS. 3A, 4A, 5A, 6A, 7A, 8A, 9A, 10A, 11A, 12A, 13A, 14A, 15A, 16A, 17A, 18A, 19A, 20A, 21A, and 22A are cross-sectional views taken along the line A-A' of FIG. 2, FIGS. 3B, 4B, 5B, 6B, 7B, 8B, 9B, and 10B are cross-sectional views taken along the line B-B' of FIG. 2, FIGS. 3C, 4C, 5C, 6C, 7C, 8C, 9C, and 10C are cross-sectional views taken along the line C-C' of FIG. 2, FIGS. 3D, 4D, 5D, 6D, 7D, 8D, 9D, and 10D are cross-sectional views taken along the line D-D' of FIG. 2, FIGS. 3E, 4E, 5E, 6E, 7E, 8E, 9E, 10E, 11B, 12B, 13B, 14B, 15B, 16B, 17B, 18B, 19B, 20B, 21B, and 22B are cross-sectional views taken along the line E-E' of FIG. 2, FIGS. 3D, 4D, 5D, 6D, 7D, 8D, 9D, and 10D are cross-sectional views taken along the line D-D' of FIG. 2, FIGS. 3F, 4F, 5F, 6F, 7F, 8F, 9F, 10F, 12C, 13C, 14C, 15C, 16C, 17C, 18C, 19C, 20C, 21C, and 22C are cross-sectional views taken along the line F-F' of FIG. 2, FIG. 22D is an enlarged cross-sectional view illustrating the portion CT1 of FIG. 22A, and FIG. 22E is an enlarged cross-sectional view illustrating the portion CT2 of FIG. 22C.

Referring to FIGS. 3A to 3F, a plurality of isolation trenches 116T and a plurality of logic isolation trenches 115T may be formed in a substrate 110 and a plurality of isolation layers 116 filling the plurality of isolation trenches 116T and the plurality of logic isolation layers 115 filling the plurality of logic isolation trenches 115T may be formed.

In some embodiments, the substrate 110 may include, for example, silicon (Si), crystalline Si, polycrystalline Si, or amorphous Si. In other embodiments, the substrate 110 may include a semiconductor element such as germanium (Ge) or at least one compound semiconductor selected from silicon germanium (SiGe), silicon carbide (Sic), gallium arsenide (GaAs), indium arsenide (InAs), and indium phosphide (InP). In some embodiments, the substrate 110 may have a silicon on insulator (SOI) structure. For example, the substrate 110 may include a buried oxide (BOX) layer. The substrate 110 may include a conductive area, for example, a well or structure doped with impurities.

Each of the plurality of isolation layers 116 and the plurality of logic isolation layers 115 may include at least one of, for example, a silicon oxide layer, a silicon nitride layer, and a silicon oxynitride layer. Each of the plurality of isolation layers 116 may include a single layer including a kind of insulating layer, a bilayer including two kinds of insulating layers, or a multilayer including at least three kinds of insulating layers. For example, each of the plurality of isolation layers 116 may include a bilayer or a multilayer including an oxide layer and a nitride layer. However, according to inventive concepts, a configuration of each of the plurality of isolation layers 116 are not limited thereto. A plurality of active areas 118 may be defined by the plurality of isolation layers 116 in the memory cell area (CR of FIG. 2) in the substrate 110, and a plurality of logic active areas 117 may be defined by the plurality of logic isolation layers 115 in the peripheral area (PR of FIG. 2) in the substrate 110.

The plurality of isolation layers 116 may define the plurality of active areas 118 in an isolation structure, and the plurality of logic isolation layers 115 may define the plurality of logic active areas 117 in the isolation structure. In some embodiments, the plurality of isolation layers 116 and the plurality of logic isolation layers 115 may be formed together and may be collectively referred to as the isolation structure. The plurality of isolation layers 116 and the plurality of logic isolation layers 115 may not be clearly distinguished from each other on a boundary between the memory cell area CR and the peripheral area PR.

Each of the plurality of active areas 118 may be in the form of a flat long island having a short axis and a long axis like each of the plurality of active areas ACT illustrated in FIG. 2. Each of the plurality of logic active areas 117 may be rectangular like each of the plurality of active areas ACT illustrated in FIG. 2. However, inventive concepts are not limited thereto and each of the plurality of logic active areas 117 may be in the form of a varying plane.

In the substrate 110, a plurality of word line trenches 120T may be formed. The plurality of word line trenches 120T may extend in the first horizontal direction (the X direction) to run parallel with one another and may be in the form of lines arranged at approximately equal intervals across the plurality of active areas 118 in the second horizontal direction (the Y direction). In some embodiments, step differences may be formed in bottom surfaces of the plurality of word line trenches 120T.

After cleaning a resultant material in which the plurality of word line trenches 120T are formed, in the plurality of word line trenches 120T, a plurality of gate dielectric layers 122, a plurality of word lines 120, and a plurality of buried insulating layers 124 may be sequentially formed. The plurality of word lines 120 may configure the plurality of word lines WL illustrated in FIG. 2. The plurality of word lines 120 may extend in the first horizontal direction (the X direction) to run parallel with one another and may be in the form of lines arranged at approximately equal intervals across the plurality of active areas 118 in the second horizontal direction (the Y direction). An upper surface of each of the plurality of word lines 120 may be at a level lower than that of an upper surface of the substrate 110. Bottom surfaces of the plurality of word lines 120 may be concavo-convex, and a saddle fin field effect transistor (FET) may be formed in each of the plurality of active areas 118.

In the current specification, a level or a vertical level means a height in a vertical direction (a Z direction) perpendicular to a main surface or the upper surface of the substrate 110. That is, being at the same level or a uniform level means that the height in the vertical direction (the Z direction) perpendicular to the main surface or the upper surface of the substrate 110 is uniform and being at a lower or higher level means that the height in the vertical direction (the Z direction) perpendicular to the main surface or the upper surface of the substrate 110 is less or greater.

Each of the plurality of word lines 120 may have a stacked structure of a lower word line layer 120a and an upper word line layer 120b. For example, the lower word line layer 120a may include a metal material, conductive metal nitride, or a combination of the above materials. In some embodiments, the lower word line layer 120a may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination of the above materials. For example, the upper word line layer 120b may include doped polysilicon. In some embodiments, the lower word line layer 120a may include a core layer and a barrier layer between the core layer and each of the plurality of gate dielectric layers 122.

In some embodiments, before or after forming the plurality of word lines 120, by implanting impurity ions into two active areas 118 on both sides of each of the plurality of word lines 120 of the substrate 110, source and drain areas may be formed in each of the plurality of active areas 118.

Each of the plurality of gate dielectric layers 122 may include at least one selected from a silicon oxide layer, a silicon nitride layer, a silicon oxynitride layer, oxide/nitride/oxide (ONO), and a high-k dielectric layer having a dielectric constant higher than that of the silicon oxide layer. For example, in some embodiments, each of the plurality of gate dielectric layers 122 may have a dielectric constant of about 10 to about 25, but are not limited thereto.

Upper surfaces of the plurality of buried insulating layers 124 may be at the same level as the upper surface of the substrate 110. Each of the plurality of buried insulating layers 124 may include at least one material layer selected from a silicon oxide layer, a silicon nitride layer, a silicon oxynitride layer, and a combination of the above layers.

Referring to FIGS. 4A to 4F, a plurality of first and second insulating layer patterns 112 and 114 covering the plurality of isolation layers 116, the plurality of active areas 118, the plurality of buried insulating layers 124, the plurality of logic isolation layers 115, and the plurality of logic active areas 117 are formed. For example, each of the plurality of first and second insulating layer patterns 112 and 114 may include a silicon oxide layer, a silicon nitride layer, a silicon oxynitride layer, a metallic dielectric layer, or a combination of the above layers. In some embodiments, the plurality of first and second insulating layer patterns 112 and 114 may be formed by stacking a plurality of insulating layers including the plurality of first insulating layer patterns 112 and the plurality of second insulating layer patterns 114. In some embodiments, each of the plurality of first insulating layer patterns 112 may include a silicon oxide layer and each of the plurality of second insulating layer patterns 114 may include a silicon oxynitride layer. In other embodiments, each of the plurality of first insulating layer patterns 112 may include a non-metallic dielectric layer and each of the plurality of second insulating layer patterns 114 may include a metallic dielectric layer.

Then, after forming a plurality of conductive semiconductor layers 132P on the plurality of first and second insulating layer patterns 112 and 114, a plurality of direct contact holes 134H exposing source areas in the plurality of active areas 118 through the plurality of conductive semiconductor layers 132P and the plurality of first and second insulating layer patterns 112 and 114 are formed and a plurality of direct contact conductive layers 134P filling the plurality of direct contact holes 134H are formed. In some embodiments, the plurality of direct contact holes 134H may extend to the insides of the plurality of active areas 118, that is, the source areas. Each of the conductive semiconductor layers 132P may include, for example, doped polysilicon. Each of the plurality of direct contact conductive layers 134P may include, for example, doped polysilicon. In some embodiments, each of the plurality of direct contact conductive layers 134P may include an epitaxial silicon layer.

Referring to FIGS. 5A to 5F, a metallic conductive layer and an insulation capping layer are sequentially formed in order to form a plurality of bit line structures 140 while covering the plurality of conductive semiconductor layers 132P and the plurality of direct contact conductive layers 134P. In some embodiments, the metallic conductive layer may have a stacked structure of a first metallic conductive layer and a second metallic conductive layer. By etching the first metallic conductive layer, the second metallic conductive layer, and the insulation capping layer, a plurality of bit lines 147 having stacked structures of a plurality of first metallic conductive patterns 145 and a plurality of second metallic conductive patterns 146 in the form of lines and a plurality of insulation capping lines 148 are formed.

In some embodiments, each of the plurality of first metallic conductive patterns 145 may include TiN or Ti—Si—N (TSN) and each of the plurality of second metallic conductive patterns 146 may include W or tungsten silicide ($WSi_x$). In some embodiments, each of the plurality of first metallic conductive patterns 145 may perform a function of a diffusion barrier. In some embodiments, each of the plurality of insulation capping lines 148 may include a silicon nitride layer.

One bit line 147 and one insulation capping line 148 covering the one bit line 147 may configure one bit line structure 140. The plurality of bit line structures 140 including the plurality of bit lines 147 and the plurality of insulation capping lines 148 covering the plurality of bit lines 147 may extend in the second horizontal direction (the Y direction) parallel with the main surface of the substrate 110 to run parallel with one another. The plurality of bit lines 147 may configure the plurality of bit lines BL illustrated in FIG. 2. In some embodiments, the plurality of bit line structures 140 may further include a plurality of conductive semiconductor patterns 132 that are parts of the plurality of conductive semiconductor layers (132P of FIGS. 4A and 4D) arranged between the plurality of first and second insulating layer patterns 112 and 114 and the plurality of first metallic conductive patterns 145.

In an etching process of forming the plurality of bit lines 147, by removing parts of the plurality of conductive semiconductor layers (132P of FIGS. 4A to 4F) and parts of the plurality of direct contact conductive layers (134P of FIGS. 4A and 4D), which do not vertically overlap the plurality of bit lines 147, together by the etching process, the plurality of conductive semiconductor patterns 132 and the plurality of direct contact conductive patterns 134 may be formed. At this time, the plurality of first and second insulating layer patterns 112 and 114 may perform etch stop layers in the etching process of forming the plurality of bit lines 147, the plurality of conductive semiconductor patterns 132, and the plurality of direct contact conductive patterns 134. The plurality of direct contact conductive patterns 134 may configure the plurality of direct contacts DC illustrated in FIG. 2. The plurality of bit lines 147 may be electrically connected to the plurality of active areas 118 through the plurality of direct contact conductive patterns 134.

Side walls of each of the plurality of bit line structures 140 may be covered with two adjacent insulation spacer structures of a plurality of insulation spacer structures 150. Each of the plurality of insulation spacer structures 150 may include a first insulation spacer 152, a second insulation spacer 154, and a third insulation spacer 156. The second insulation spacer 154 may include a material having a lower dielectric constant than those of the first insulation spacer 152 and the third insulation spacer 156. In some embodiments, each of the first insulation spacer 152 and the third insulation spacer 156 may include a nitride layer and the second insulation spacer 154 may include an oxide layer. In some embodiments, each of the first insulation spacer 152 and the third insulation spacer 156 may include a nitride layer and the second insulation spacer 154 may include a material having etching selectivity with respect to the first insulation spacer 152 and the third insulation spacer 156. For example, when the first insulation spacer 152 and the third insulation spacer 156 include a nitride layer, the second insulation spacer 154 includes an oxide layer and may be removed in a subsequent process to become an air spacer.

Each of a plurality of buried contact holes 170H may be formed between two adjacent bit lines of the plurality of bit lines 147. An internal space of each of the plurality of buried contact holes 170H may be limited by two adjacent insulation spacer structures of the plurality of insulation spacer structures 150, each of which covers a side wall of each of two adjacent bit lines 147, between the two adjacent bit lines 147 of the plurality of bit lines 147 and each of the plurality of active areas 118.

Each of the plurality of buried contact holes 170H may be formed by removing parts of a pair of first and second insulating layer patterns 112 and 114 of the plurality of first and second insulating layer patterns 112 and 114 and each of the plurality of active areas 118 by using each of the plurality of insulation capping lines 148 and two adjacent insulation spacer structures of the plurality of insulation spacer structures 150, each of which covers a side wall of each of two adjacent bit line structures 140 of the plurality of bit line structures 140, as etching masks. In some embodiments, each of the plurality of buried contact holes 170H may be formed so that the internal space thereof limited by each of the plurality of active areas 118 may increase by performing an anisotropic etching process of removing parts of a pair of first and second insulating layer patterns 112 and 114 of the plurality of first and second insulating layer patterns 112 and 114 and each of the plurality of active areas 118 by using each of the plurality of insulation capping lines 148 and two adjacent insulation spacer structures of the plurality of insulation spacer structures 150, each of which covers a side wall of each of two adjacent bit line structures 140 of the plurality of bit line structures 140, as etching masks and then, performing an isotropic etching process of further removing another part of each of the plurality of active areas 118.

A plurality of gate line structures 140P may be formed on the plurality of logic active areas 117. In some embodiments, at least one dummy bit line structure 140D may be arranged between each of the plurality of bit line structures 140 and each of the plurality of gate line structures 140P.

The plurality of gate line structures 140P may include a plurality of gate lines 147P and the plurality of insulation capping lines 148 covering the plurality of gate lines 147P. The plurality of gate lines 147P provided in the plurality of gate line structures 140P may be formed together with the plurality of bit lines 147. That is, the plurality of gate lines 147P may have the stacked structures of the plurality of first metallic conductive patterns 145 and the plurality of second metallic conductive patterns 146. A plurality of gate insulating layer patterns 142 may be arranged between the plurality of gate lines 147P and the plurality of logic active areas 117. In some embodiments, the plurality of gate line structures 140P may further include a plurality of conductive semiconductor patterns 132 arranged between the plurality of gate insulating layer patterns 142 and the plurality of first metallic conductive patterns 145. The plurality of gate lines 147P may configure the plurality of gate line patterns GLP illustrated in FIG. 2.

Side walls of each of the plurality of gate line structures 140P may be covered with two adjacent gate insulation spacers of a plurality of gate insulation spacers 150P. Each of a plurality of gate insulation spacers 150P may include, for example, a nitride layer. In some embodiments, each of the plurality of gate insulation spacers 150P may include a single layer. However, inventive concepts are not limited thereto and each of the plurality of gate insulation spacers 150P may have a stacked structure of a plurality of layers of no less than two layers.

A plurality of dummy bit line structures 140D may extend to run parallel with each other in the second horizontal direction (the Y direction) together with the plurality of bit line structures 140. Each of the plurality of dummy bit line structures 140D may have an approximately similar structure to that of each of the plurality of bit line structures 140. The plurality of dummy bit line structures 140D may include a plurality of dummy bit lines 147D including the plurality of first metallic conductive patterns 145, the plurality of second metallic conductive patterns 146, and the plurality of insulation capping lines 148. Side walls of each of the plurality of dummy bit line structures 140D may be covered with at least one of two adjacent gate insulation spacers of the plurality of insulation spacer structures 150 and two adjacent gate insulation spacers of the plurality of gate insulation spacers 150P.

In some embodiments, a width of each of the plurality of dummy bit lines 147D in the first horizontal direction (the X direction) may be greater than a horizontal width of each of the plurality of bit lines 147. In other embodiments, the width of each of the plurality of dummy bit lines 147D in the first horizontal direction (the X direction) may be equal to the horizontal width of each of the plurality of bit lines 147. In some embodiments, in some of the plurality of dummy bit line structures 140D, a width of each of the plurality of dummy bit lines 147D in the first horizontal direction (the X direction) may be greater than a horizontal width of each of the plurality of bit lines 147 and, in others of the plurality of dummy bit line structures 140D, a width of each of the plurality of dummy bit lines 147D in the first horizontal direction (the X direction) may be equal to a horizontal width of each of the plurality of bit lines 147.

Referring to FIGS. 6A to 6F, a plurality of buried contacts 170 and a plurality of insulation fences 180 are formed in spaces among the plurality of insulation spacer structures 150 of which two adjacent insulation spacer structures cover side walls of each of the plurality of bit line structures 140. Along a space between a pair of insulation spacer structures facing each other and covering the side walls of each of the plurality of bit lines structures 140 among the plurality of insulation spacer structures 150, that is, in the second horizontal direction (the Y direction), the plurality of buried contacts 170 and the plurality of insulation fences 180 may be alternately arranged. For example, each of the plurality of buried contacts 170 may include polysilicon. For example, each of the plurality of insulation fences 180 may include a nitride layer.

In some embodiments, the plurality of buried contacts 170 may be arranged in line in the first horizontal direction (the X direction) and the second horizontal direction (the Y direction). The plurality of buried contacts 170 may respectively extend from the plurality of active areas 118 in the vertical direction (the Z direction) perpendicular to the substrate 110. The plurality of buried contacts 170 may configure the plurality of buried contacts BC illustrated in FIG. 2.

Each of the plurality of buried contacts 170 may be arranged in a space limited by each of the plurality of insulation fences 180 and two adjacent insulation spacer structures of the plurality of insulation spacer structures 150, which cover side walls of each of the plurality of bit line structures 140. The plurality of buried contacts 170 may fill lower parts of the spaces among the plurality of insulation spacer structures 150 of which two adjacent insulation spacer structures cover the side walls of each of the plurality of bit line structures 140.

A level of an upper surface of each of the plurality of buried contacts 170 may be lower than that of an upper surface of each of the plurality of insulation capping lines 148. An upper surface of each of the plurality of insulation fences 180 may be at the same level as the upper surface of each of the plurality of insulation capping lines 148 in the vertical direction (the Z direction).

A plurality of landing pad holes 190H may be limited by the plurality of insulation spacer structures 150 and the plurality of insulation fences 180. The plurality of buried contacts 170 may be exposed at bottom surfaces of the plurality of landing pad holes 190H.

A plurality of first and second filling insulation layers 172 and 174 may be formed on the plurality of first and second insulating layer patterns 112 and 114 of the plurality of gate line structures 140P. In some embodiments, the plurality of first and second filling insulation layers 172 and 174 may have stacked structures of the plurality of first filling insulation layers 172 and the plurality of second filling insulation layers 174. In some embodiments, each of the plurality of first filling insulation layers 172 may include an oxide layer and each of the plurality of second filling insulation layers 174 may include a nitride layer. Upper surfaces of the plurality of first and second filling insulation layers 172 and 174, that is, the upper surfaces of the plurality of second filling insulation layers 174 and the upper surfaces of the plurality of gate line structures 140P, may be at the same level as each other.

In a process of forming the plurality of buried contacts 170 and/or the plurality of insulation fences 180, upper parts of the plurality of insulation capping lines 148, the plurality of insulation spacer structures 150, and the plurality of gate insulation spacers 150P provided in the plurality of bit line structures 140, the plurality of dummy bit line structures 140D, and the plurality of gate line structures 140P are removed so that levels of upper surfaces of the plurality of bit line structures 140, the plurality of dummy bit line structures 140D, and the plurality of gate line structures 140P may be lowered.

Referring to FIGS. 7A to 7F, a plurality of first and second contact holes CPHE and CPHF passing through the plurality of first and second filling insulation layers 172 and 174 and the plurality of first and second insulating layer patterns 112 and 114 are formed. The plurality of first and second contact holes CPHE and CPHF may include the plurality of first contact holes CPHE and the plurality of second contact holes CPHF. The plurality of first contact holes CPHE and the plurality of second contact holes CPHF may be respectively referred to as a plurality of word line contact holes CPHE and a plurality of logic active area contact holes CPHF.

The plurality of word line contact holes CPHE may extend to the plurality of lower word line layers 120a through the plurality of first and second filling insulation layers 172 and 174, the plurality of first and second insulating layer patterns 112 and 114, the plurality of buried insulating layers 124, and the plurality of upper word line layers 120b. In some embodiments, the plurality of word line contact holes CPHE may extend to the insides of the plurality of lower word line layers 120a.

The plurality of logic active area contact holes CPHF may extend to the plurality of logic active areas 117 through the plurality of first and second filling insulation layers 172 and 174 and the plurality of first and second insulating layer patterns 112 and 114. In some embodiments, the plurality of logic active area contact holes CPHF may extend to the insides of the plurality of logic active areas 117.

In some embodiments, some of the plurality of first and second contact holes CPHE and CPHF may extend to the plurality of second metallic conductive patterns 146 or the plurality of first metallic conductive patterns 145 that configure the plurality of gate lines 147P or the plurality of bit lines 147 through the plurality of insulation capping lines 148.

Referring to FIGS. 8A to 8F, a landing pad material layer 190P filling the plurality of landing pad holes 190H and the plurality of first and second contact holes CPHE and CPHF and covering the plurality of bit line structures 140, the plurality of gate line structures 140P, and the at least one dummy bit line structure 140D is formed.

In some embodiments, a level of an interface in which the plurality of buried contacts 170 contact the landing pad material layer 190P may be higher than a first vertical level LV1 of an upper surface of each of the plurality of second metallic conductive patterns 146 and may be lower than a second vertical level LV2 of the upper surface of each of the plurality of insulation capping lines 148.

In some embodiments, the landing pad material layer 190P may include a conductive barrier layer and a conductive pad material layer on the conductive barrier layer. For example, the conductive barrier layer may include a metal, conductive metal nitride, or a combination of the above materials. In some embodiments, the conductive barrier layer may have a stacked structure of Ti and TiN. In some embodiments, the conductive pad material layer may include W.

In some embodiments, before forming the landing pad material layer 190P, a metal silicide layer may be formed on the plurality of buried contacts 170. The metal silicide layer may be arranged between the plurality of buried contacts 170 and the landing pad material layer 190P. The metal silicide layer may include cobalt silicide ($CoSi_x$), nickel silicide ($NiSi_x$), or manganese silicide ($MnSi_x$). However, inventive concepts are not limited thereto.

A plurality of hard mask patterns HMKC and HMKP are formed on the landing pad material layer 190P. In some embodiments, the plurality of hard mask patterns HMKC and HMKP may be formed by an extreme ultraviolet (EUV) lithography process. The plurality of hard mask patterns HMKC and HMKP may include a plurality of cell hard mask patterns HMKC and a plurality of logic hard mask patterns HMKP.

Referring to FIGS. 9A to 9F, by removing a part of the landing pad material layer (190P of FIGS. 8A to 8G) by using the plurality of cell hard mask patterns HMKC and the plurality of logic hard mask patterns HMKP as etching masks, a plurality of landing pads 190 filling at least parts of the plurality of landing pad holes 190H, extending onto the plurality of bit line structures 140, and divided by a plurality of recesses 190R and a plurality of first and second contact plugs CPE and CPF filling a plurality of logic bit lines BLP and the plurality of first and second contact holes CPHE and CPHF.

The plurality of landing pads 190 may be apart from one another with the plurality of recesses 190R therebetween. The plurality of landing pads 190 may be arranged on the plurality of buried contacts 170 and may extend onto the plurality of bit line structures 140. In some embodiments, the plurality of landing pads 190 may extend onto the plurality of bit lines 147. The plurality of landing pads 190 may be arranged on the plurality of buried contacts 170 so that the plurality of buried contacts 170 corresponding to the plurality of landing pads 190 may be electrically connected to the plurality of landing pads 190. The plurality of landing pads 190 may be connected to the plurality of active areas 118 through the plurality of buried contacts 170. The plurality of landing pads 190 may configure the plurality of landing pads LP illustrated in FIG. 2.

Each of the plurality of buried contacts 170 may be arranged between two adjacent bit line structures 140 and each of the plurality of landing pads 190 may extend from between two adjacent bit line structures 140 with one buried contact 170 therebetween onto one bit line structure 140.

Each of the plurality of logic bit lines BLP may be a part of the landing pad material layer 190P above the second vertical level LV2. The plurality of first and second contact plugs CPE and CPF may include the plurality of first contact plugs CPE filling the plurality of first contact holes CPHE and the plurality of second contact plugs CPF filling the plurality of second contact holes CPHF.

Referring to FIGS. 10A to 10F, a plurality of lower electrodes 210 and a plurality of capacitor dielectric layers 220 are sequentially formed on the plurality of landing pads 190. The plurality of lower electrodes 210 may correspond to the plurality of landing pads 190 and may be electrically connected to the plurality of landing pads 190. The plurality of capacitor dielectric layers 220 may conformally cover surfaces of the plurality of lower electrodes 210. In some embodiments, the plurality of capacitor dielectric layers 220 may be integrated with the plurality of lower electrodes 210 to cover the plurality of lower electrodes 210 in a uniform area, for example, the memory cell area (CR of FIG. 2). In other embodiments, the plurality of capacitor dielectric layers 220 may cover the memory cell area CR and the peripheral area (PR of FIG. 2). The plurality of lower electrodes 210 may configure the plurality of storage nodes SN illustrated in FIG. 2.

Each of the plurality of lower electrodes 210 may be in the form of a pillar of which the inside is filled to have a circular horizontal cross-section. However, inventive concepts are not limited thereto. In some embodiments, each of the plurality of lower electrodes 210 may be in the form of a cylinder of which the lower portion is closed. In some embodiments, the plurality of lower electrodes 210 may be arranged in the form of honeycombs in zigzags in the first horizontal direction (the X direction) or the second horizontal direction (the Y direction). In other embodiments, the plurality of lower electrodes 210 may be arranged in a matrix in the first horizontal direction (the X direction) and the second horizontal direction (the Y direction). Each of the plurality of lower electrodes 210 may include, for example, silicon doped with impurities, a metal such as W or copper (Cu), or a conductive metal compound such as titan nitride. Although not shown, the semiconductor memory device 1 may further include at least one support pattern contacting side walls of the plurality of lower electrodes 210.

Each of the plurality of capacitor dielectric layers 220 may include, for example, TaO, TaAlO, TaON, AlO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or a combination of the above materials.

Figure 10A:
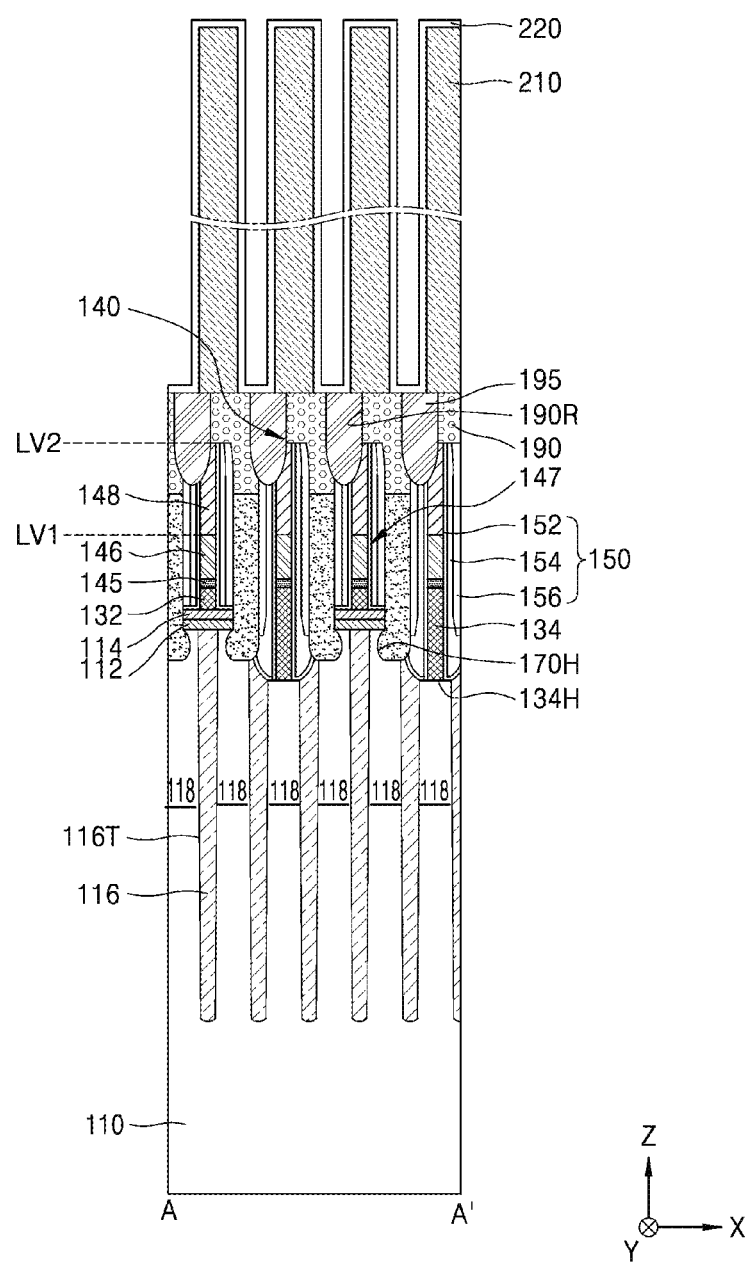
Figure 10B:
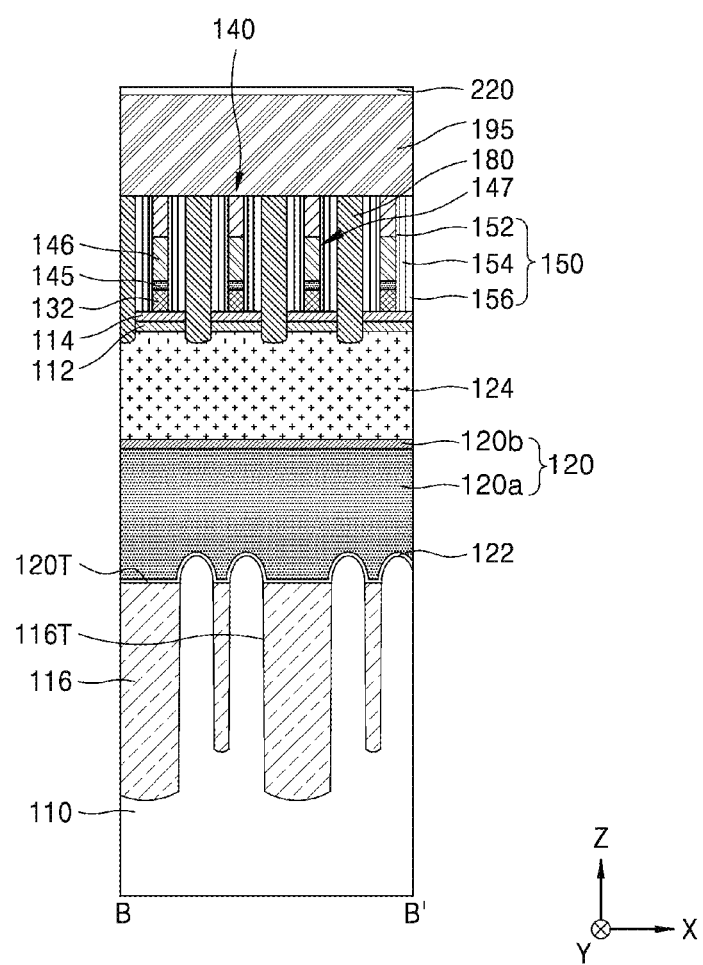
Figure 10C:
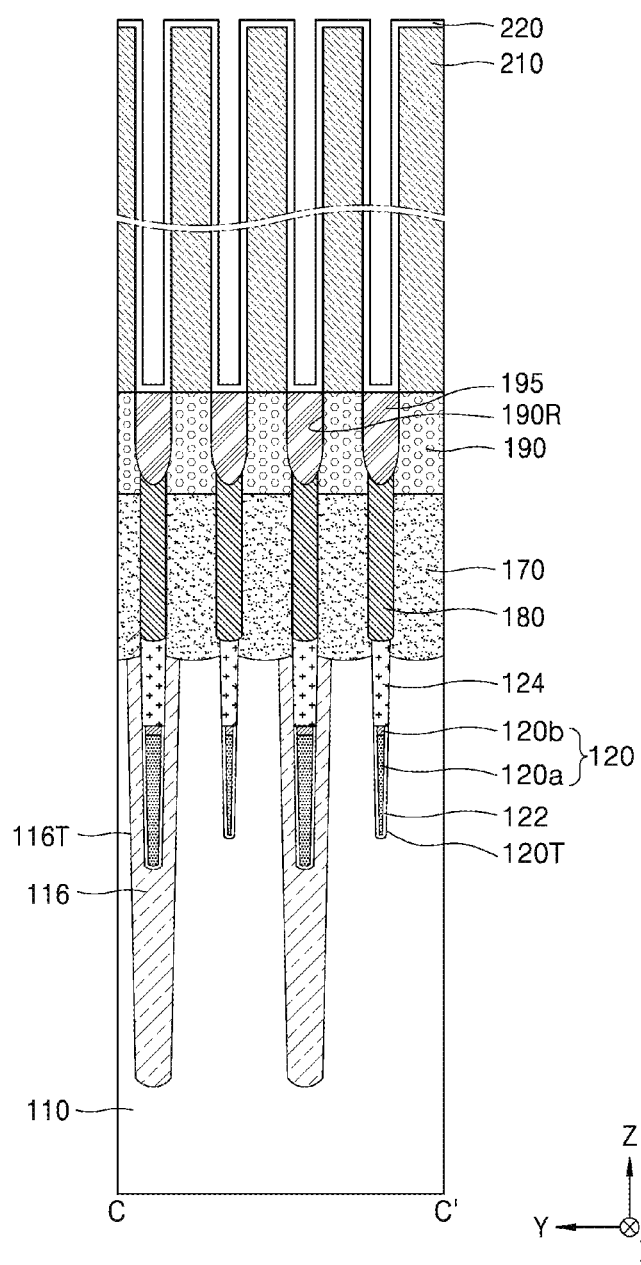
Figure 10D:
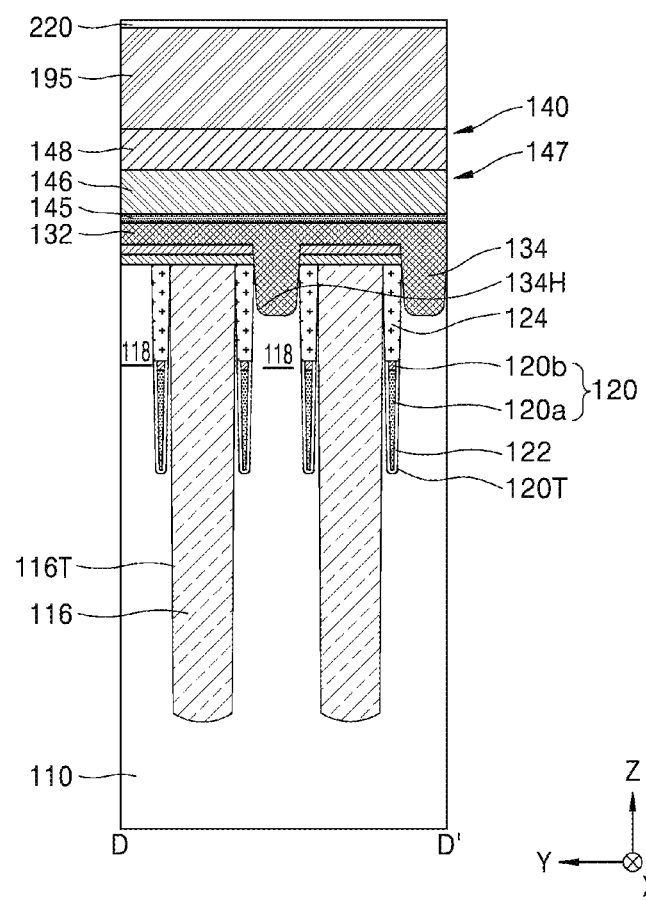
Figure 10E:
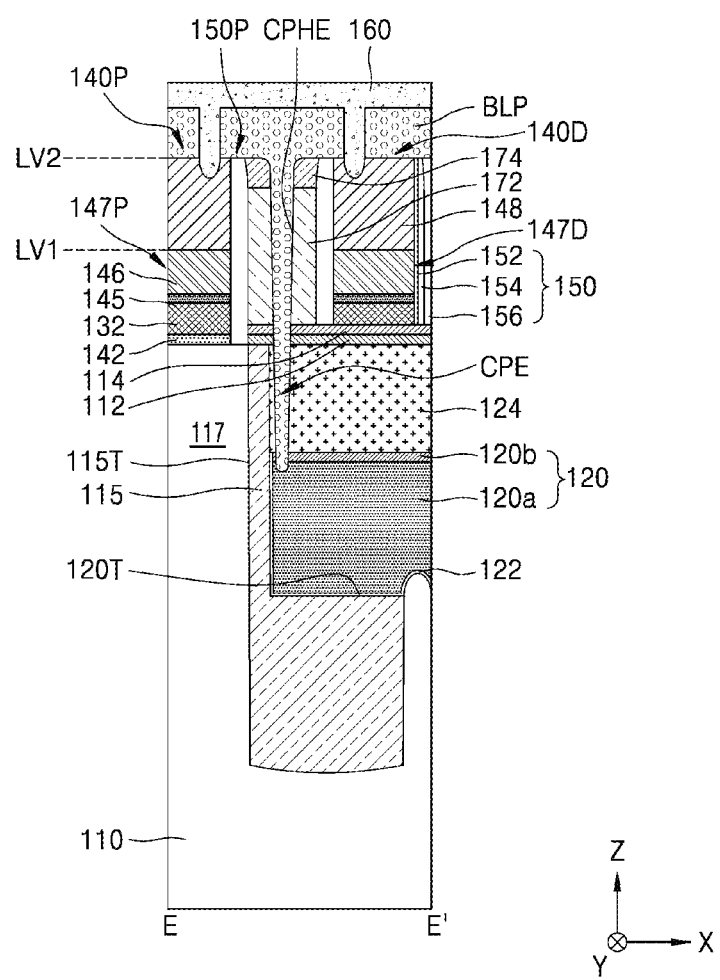
Figure 10F:
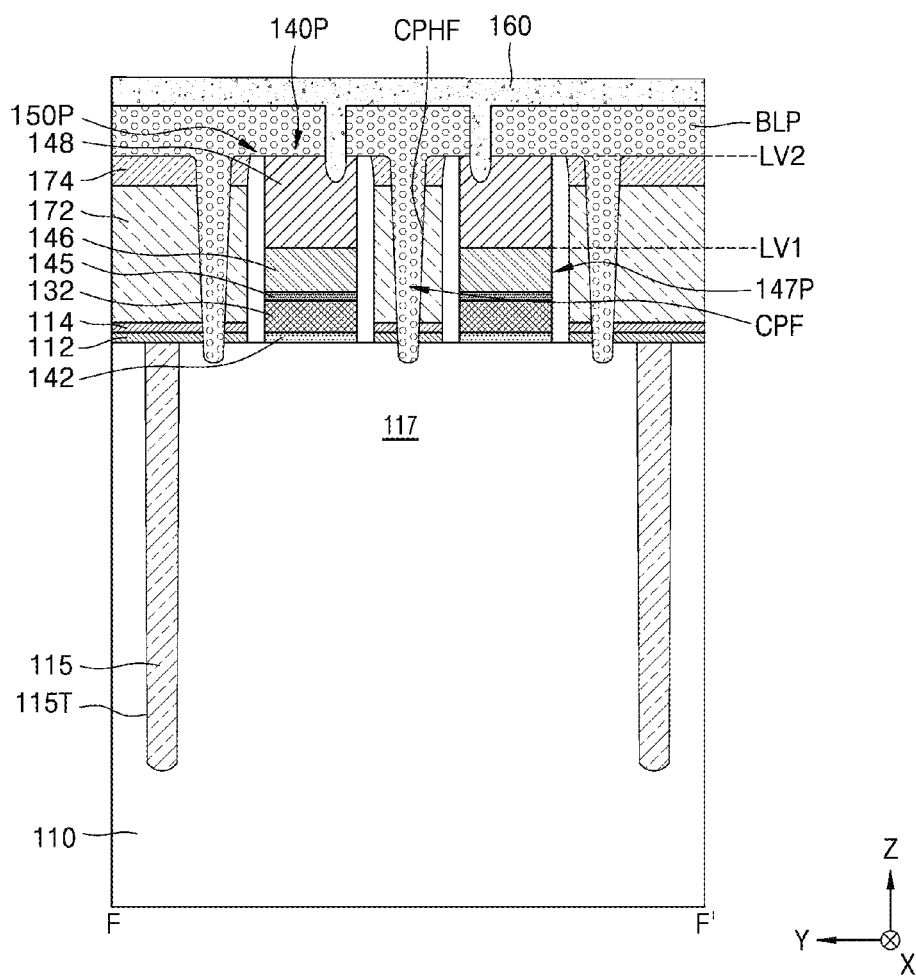

Before forming the plurality of lower electrodes 210, a plurality of insulation structures 195 filling the plurality of recesses 190R may be formed. In some embodiments, each of the plurality of insulation structures 195 may include an interlayer insulating layer and an etch stop layer. For example, the interlayer insulating layer may include an oxide layer and the etch stop layer may include a nitride layer. In FIGS. 10A and 10C, an upper surface of each of the plurality of insulation structures 195 is at the same level as a lower surface of each of the plurality of lower electrodes 210. However, inventive concepts are not limited thereto.

Before filling the plurality of lower electrodes 210 and the plurality of capacitor dielectric layers 220, a logic capping layer 160 covering the plurality of logic bit lines BLP may be formed. The logic capping layer 160 may include, for example, silicon nitride. In some embodiments, the logic capping layer 160 may cover upper surfaces of the plurality of logic bit lines BLP. In other embodiments, the logic capping layer 160 may fill the spaces among the plurality of logic bit lines BLP without covering the upper surfaces of the plurality of logic bit lines BLP.

Figure 11A:
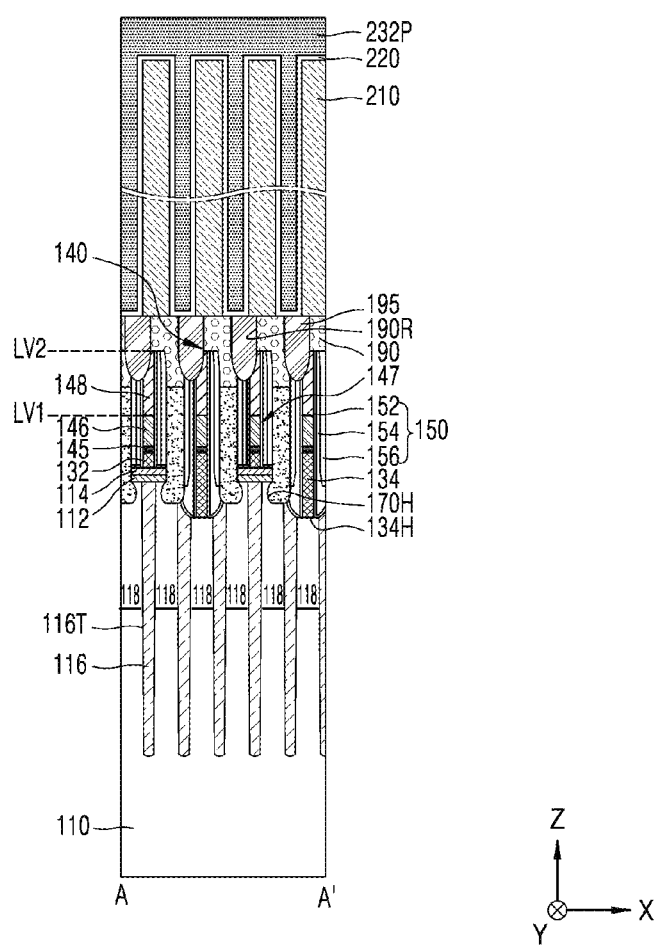
Figure 11B:
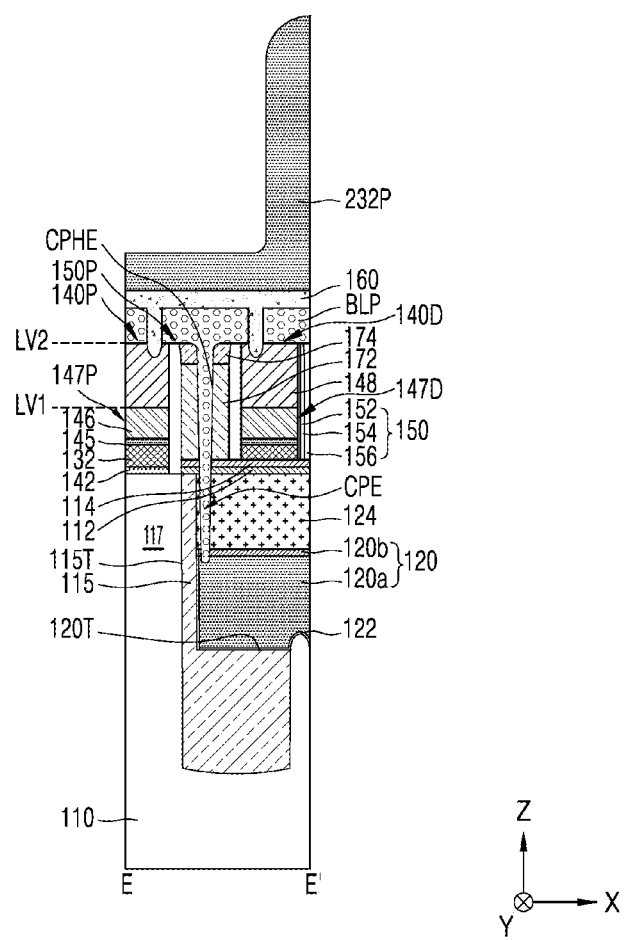
Figure 11C:
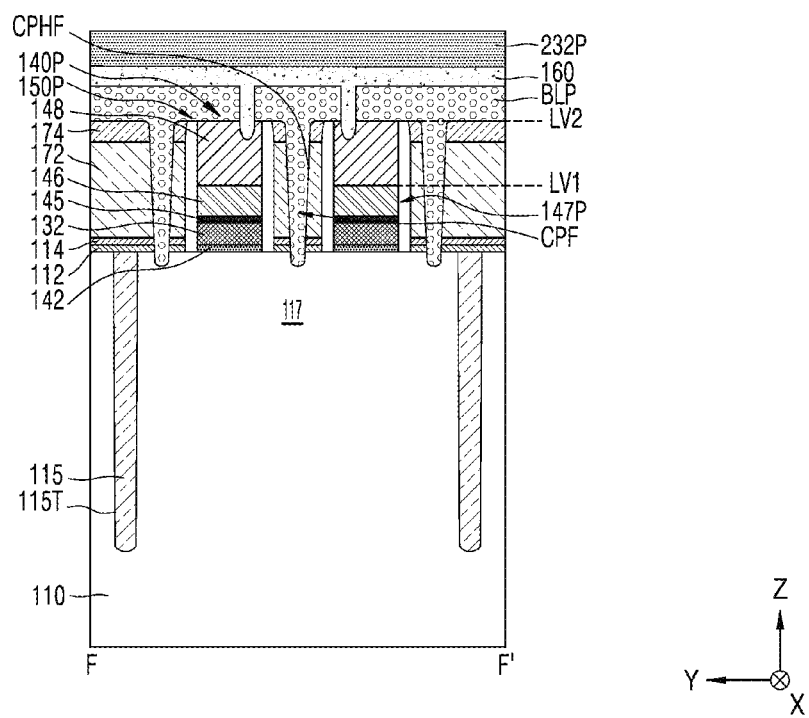

Referring to FIGS. 11A to 11C, a first upper electrode material layer 232P covering the plurality of capacitor dielectric layers 220 and the logic capping layer 160 is formed. The first upper electrode material layer 232P may include, for example, a semiconductor material. In some embodiments, the first upper electrode material layer 232P may include doped polysilicon or doped polycrystalline silicon germanium (SiGe). The first upper electrode material layer 232P may fill the spaces among the plurality of lower electrodes 210. For example, the first upper electrode material layer 232P may be formed on the plurality of capacitor dielectric layers 220 and the logic capping layer 160 to a thickness of about 1,000 Å to about 2,500 Å.

Figure 12A:
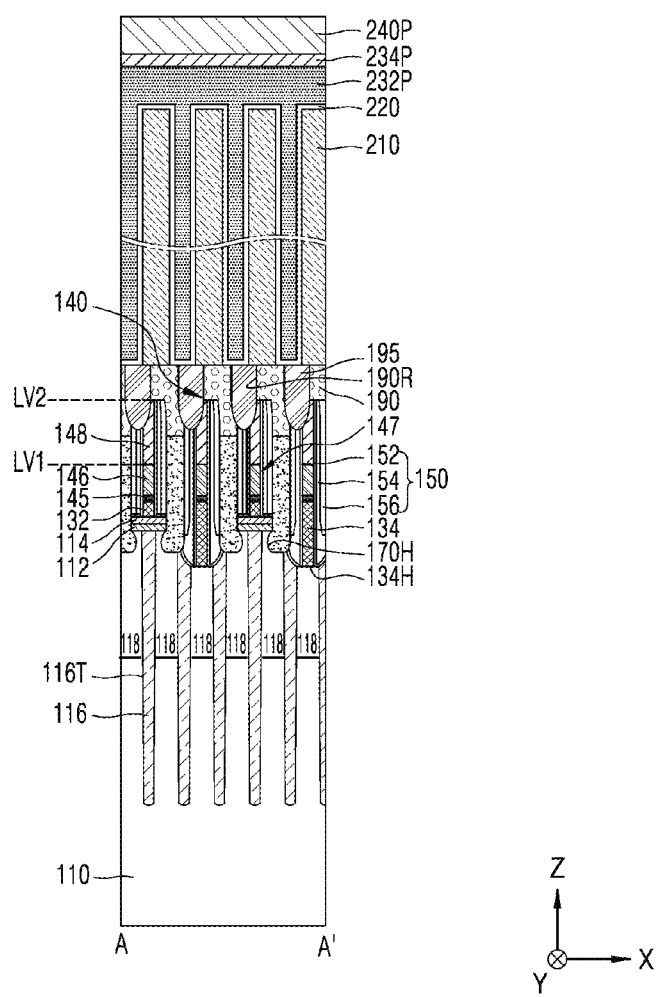
Figure 12B:
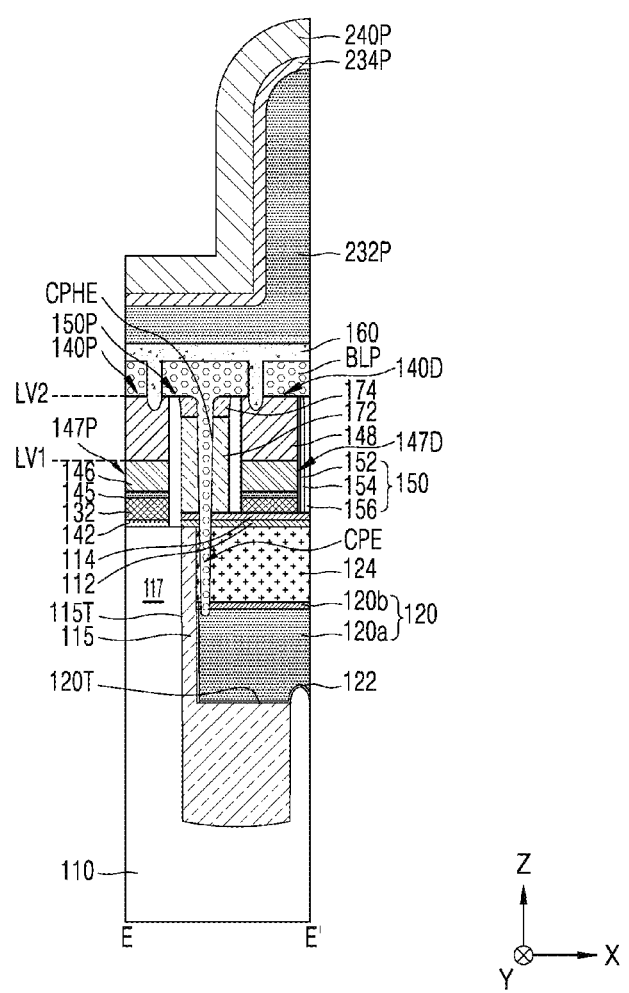
Figure 12C:
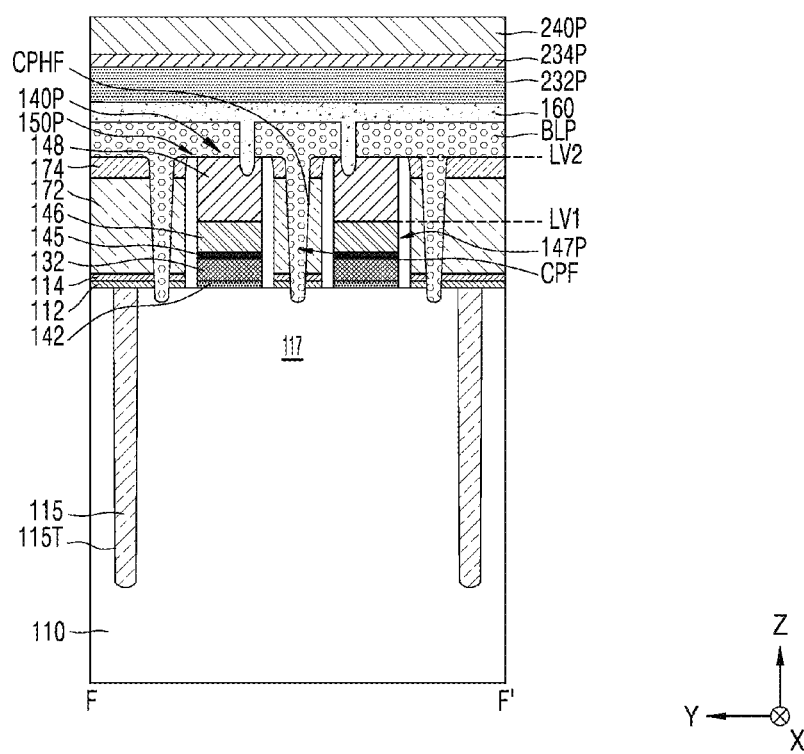

Referring to FIGS. 12A to 12C, a second upper electrode material layer 234P and an etch stop material layer 240P are sequentially formed on the first upper electrode material layer 232P.

The second upper electrode material layer 234P may include a conductive metallic material. In some embodiments, the second upper electrode material layer 234P may include a metal. In some embodiments, the second upper electrode material layer 234P may have a stacked structure of an electrode barrier layer, a main electrode layer including a metal, and an interface layer including at least one of metal oxide, metal nitride, metal carbide, and metal silicide. For example, the second upper electrode material layer 234P may have a thickness of about 300 Å to about 1,000 Å. In some embodiments, the interface layer provided in the second upper electrode material layer 234P may have a thickness of about 5 Å to about 50 Å.

The etch stop material layer 240P may include, for example, Si or a combination of Ge and at least one of oxygen (O), nitrogen (N), carbon (C), boron (B), hydrogen (H), and fluorine (F). The etch stop material layer 240P may include, for example, SiO, SiN, SiCN, SiON, or SiBN. In some embodiments, the etch stop material layer 240P may include silicon oxynitride or silicon nitride. For example, the etch stop material layer 240P may have a thickness of about 300 Å to about 1,500 Å. In some embodiments, the etch stop material layer 240P may include silicon nitride having a stoichiometric ratio different from that of silicon nitride of the logic capping layer 160.

Figure 13A:
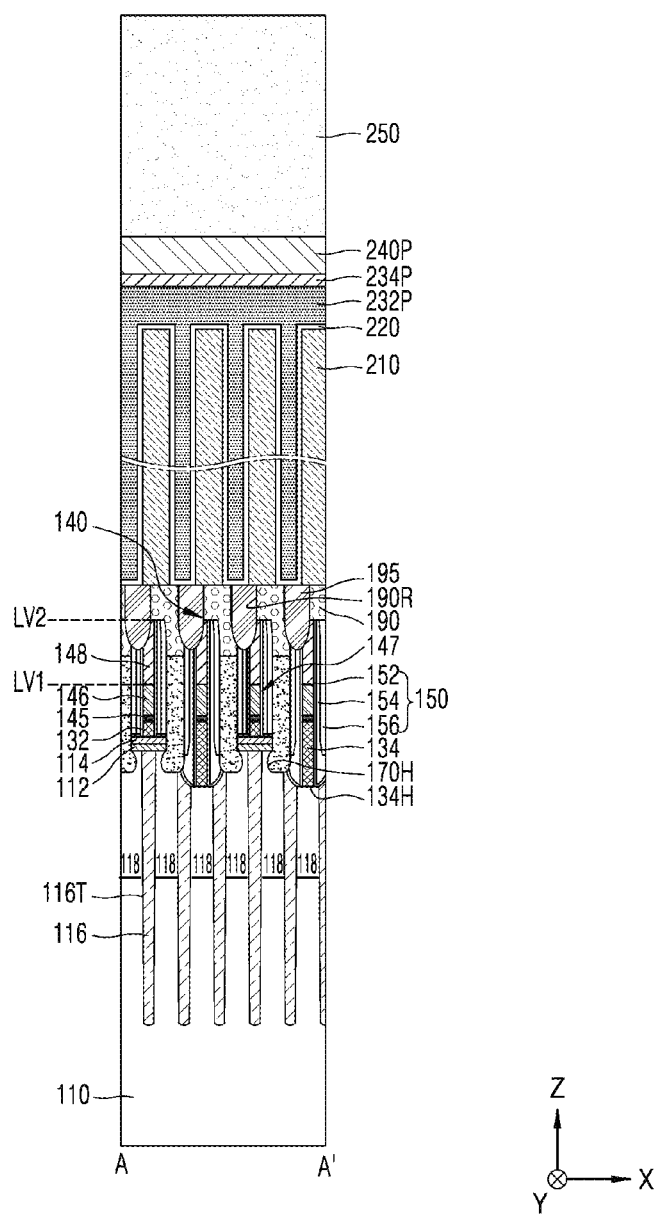
Figure 13B:
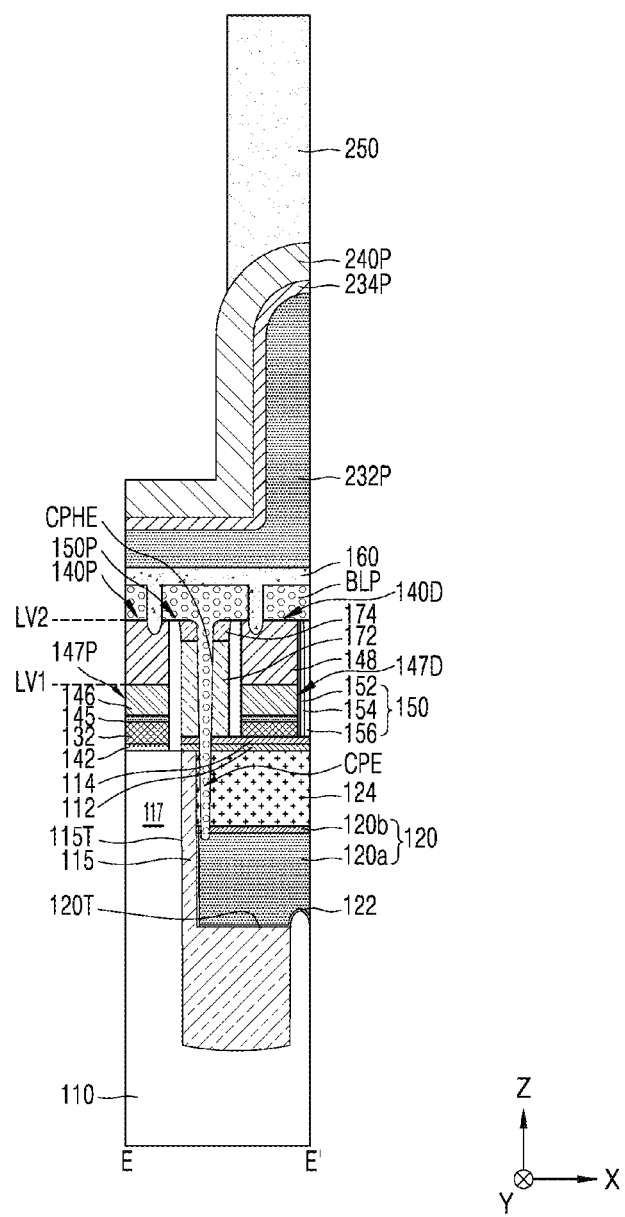
Figure 13C:
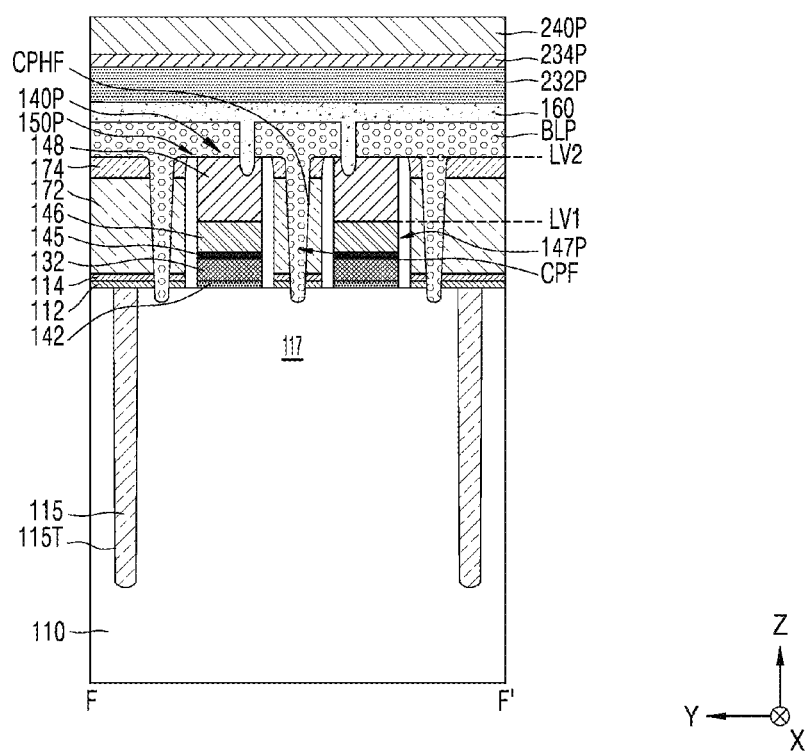

Referring to FIGS. 13A to 13C, a cell mask layer 250 covering a part of the etch stop material layer 240P is formed. For example, the cell mask layer 250 may include a resist material or may have a stacked structure of a hard mask material and a resist material. The cell mask layer 250 may cover the memory cell area (CR of FIG. 2) and may not cover the peripheral area (PR of FIG. 2). For example, the cell mask layer 250 may cover a portion of a stacked structure of the first upper electrode material layer 232P, the second upper electrode material layer 234P, and the etch stop material layer 240P, which covers the plurality of lower electrodes 210, and may expose a portion of the stacked structure of the first upper electrode material layer 232P, the second upper electrode material layer 234P, and the etch stop material layer 240P having an approximately uniform vertical height on the logic capping layer 160.

Figure 14A:
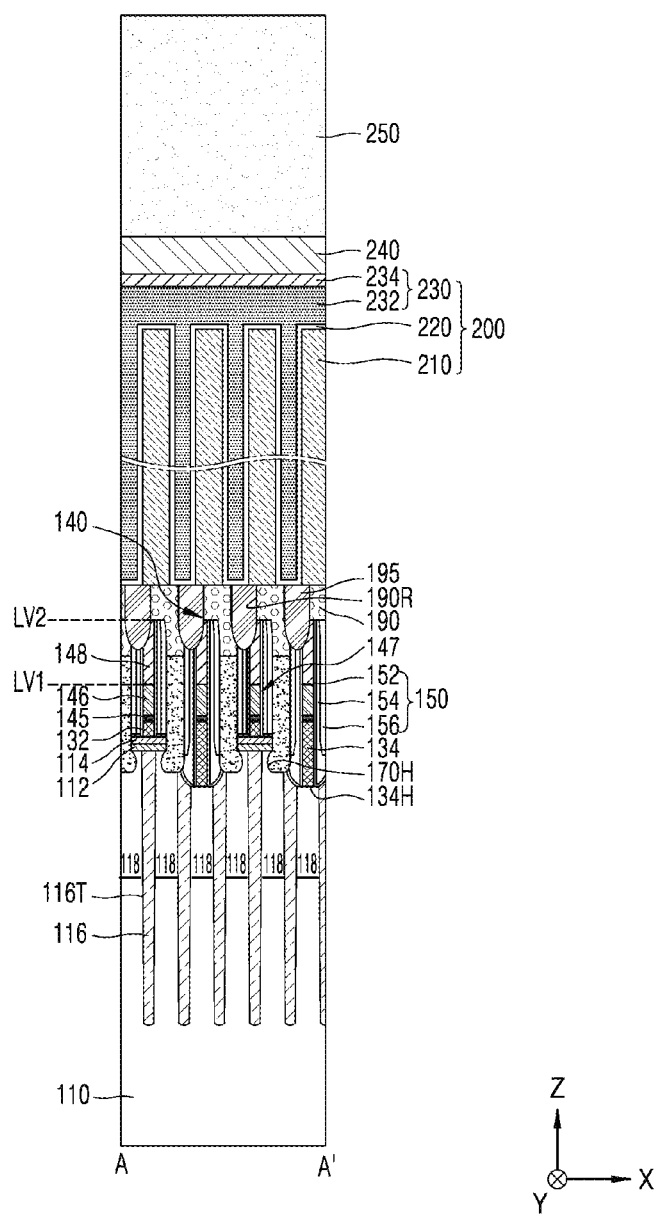
Figure 14B:
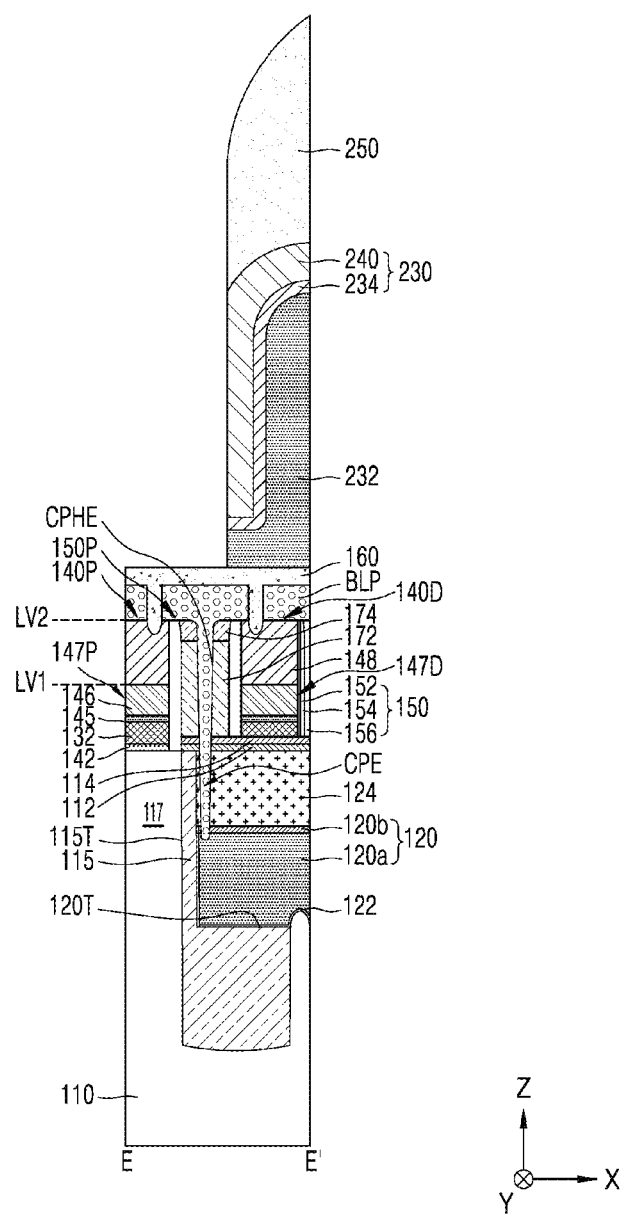
Figure 14C:
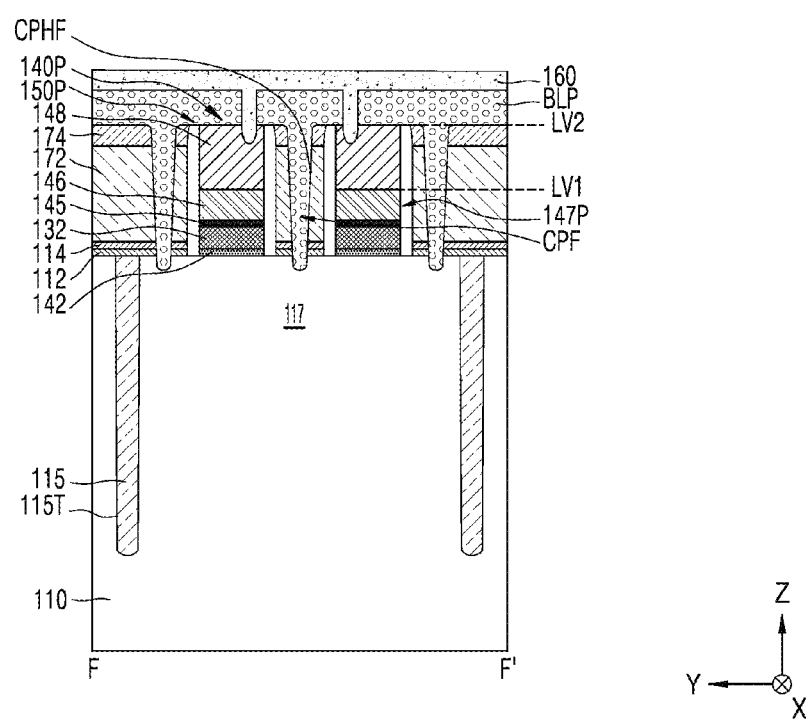

Referring to FIGS. 14A to 14C, by removing parts of the etch stop material layer 240P, the second upper electrode material layer 234P, and the first upper electrode material layer 232P by using the cell mask layer 250 as an etching mask, an etch stop layer 240, a second upper electrode layer 234, and a first upper electrode layer 232 are formed. The first upper electrode layer 232 and the second upper electrode layer 234 may configure an upper electrode 230. The plurality of lower electrodes 210, the plurality of capacitor dielectric layers 220, and the upper electrode 230 may configure a plurality of capacitor structures 200. Then, as illustrated in FIGS. 15A and 15C, the cell mask layer 250 is removed.

Figure 15A:
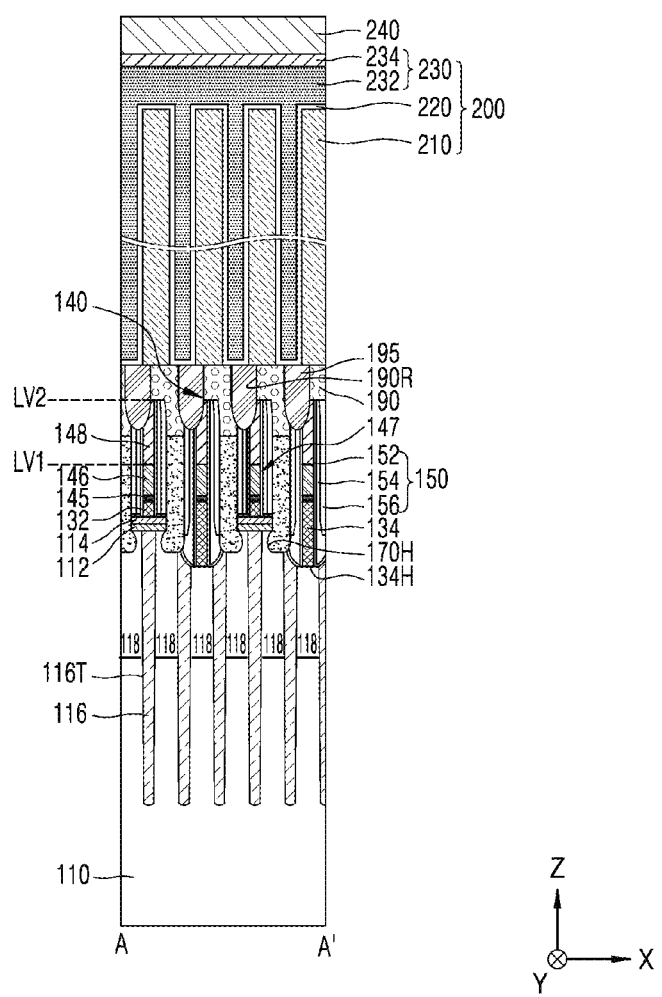
Figure 15B:
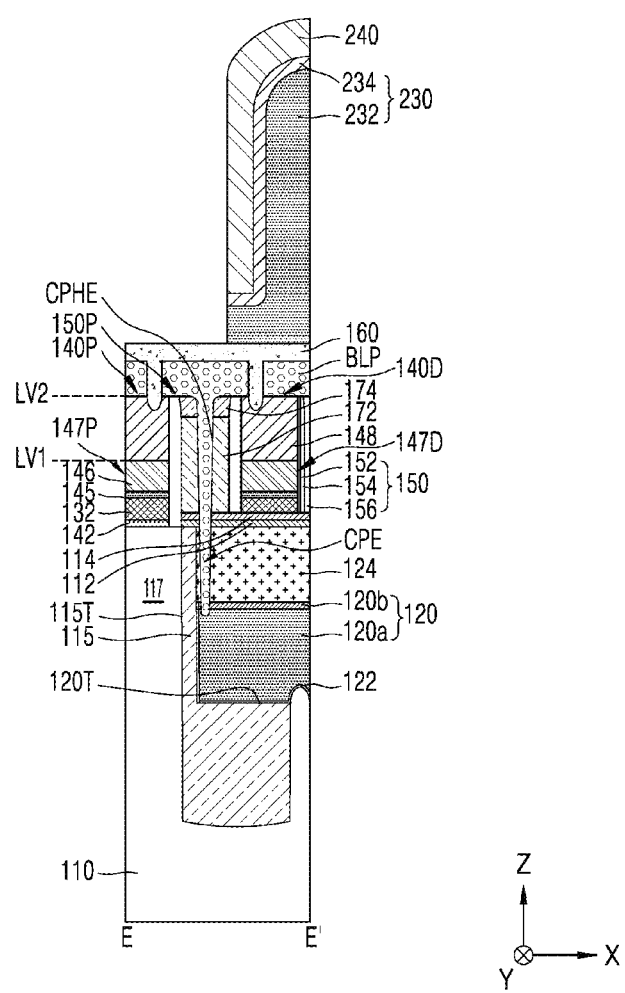
Figure 15C:
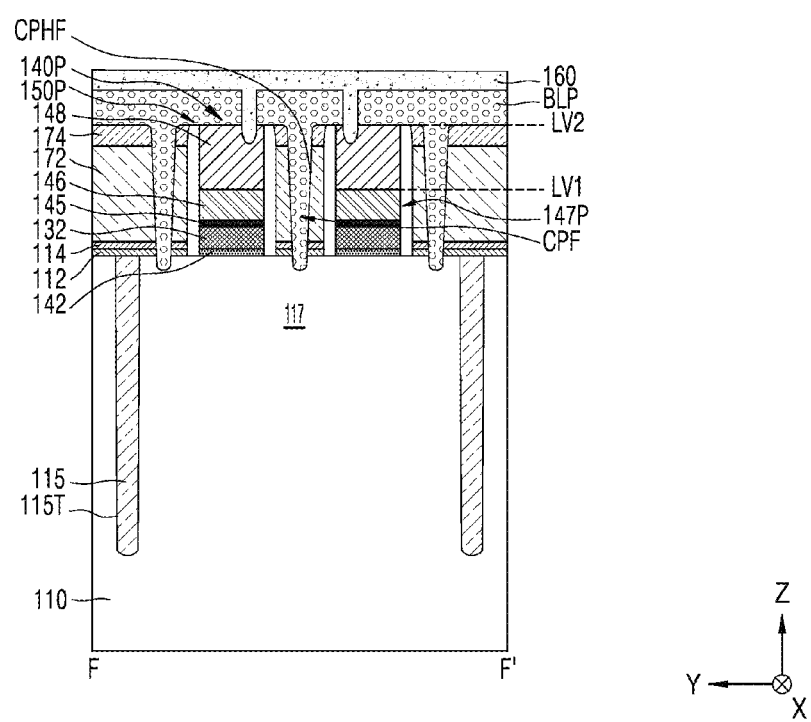
Figure 16A:
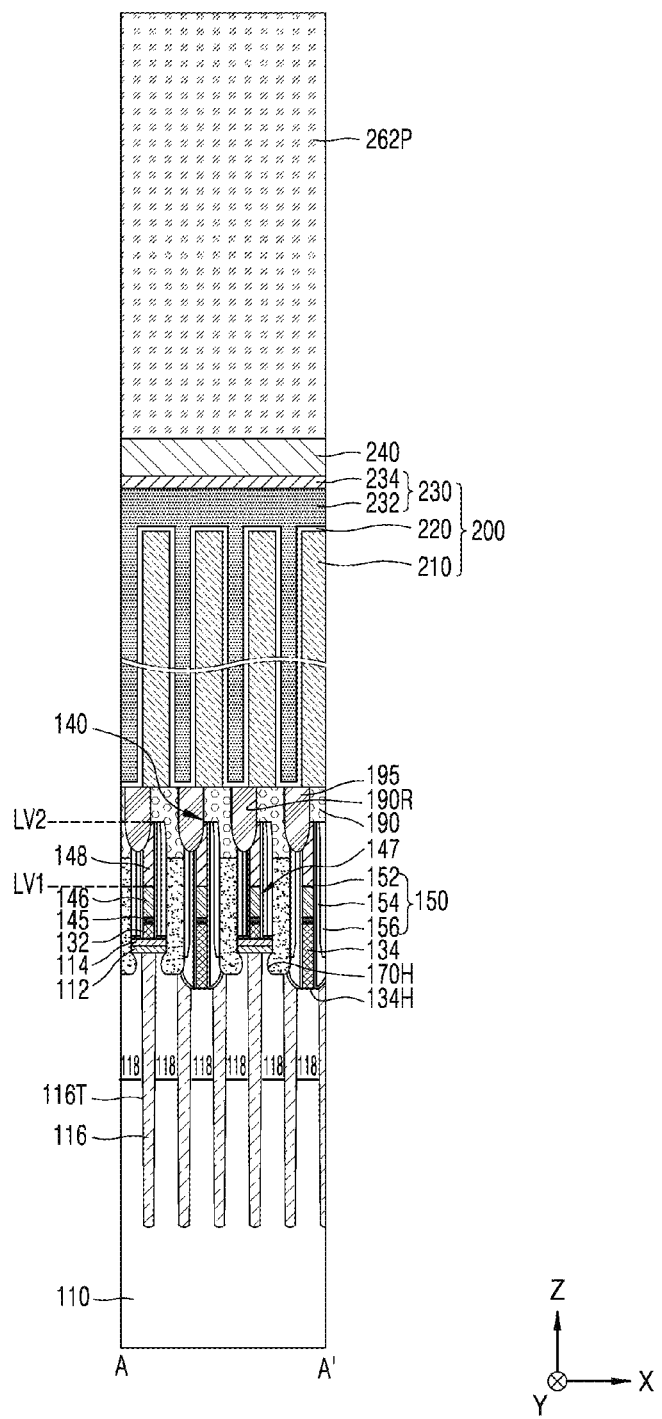
Figure 16B:
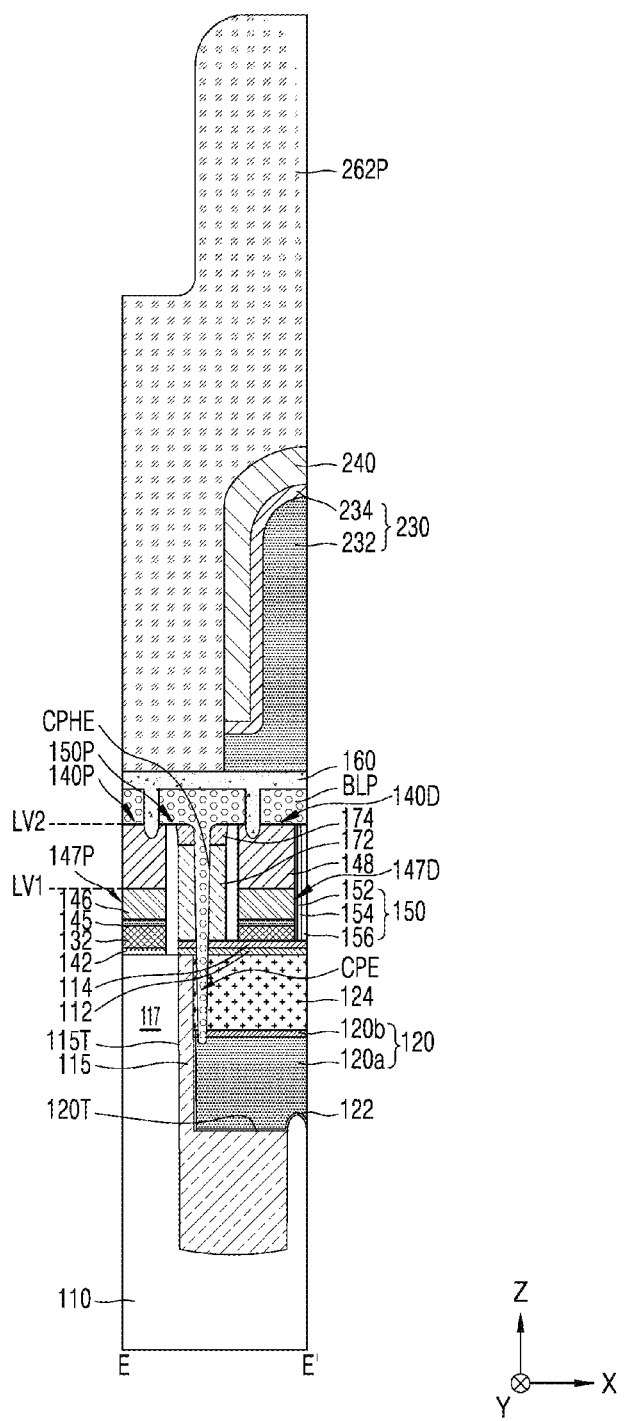
Figure 16C:
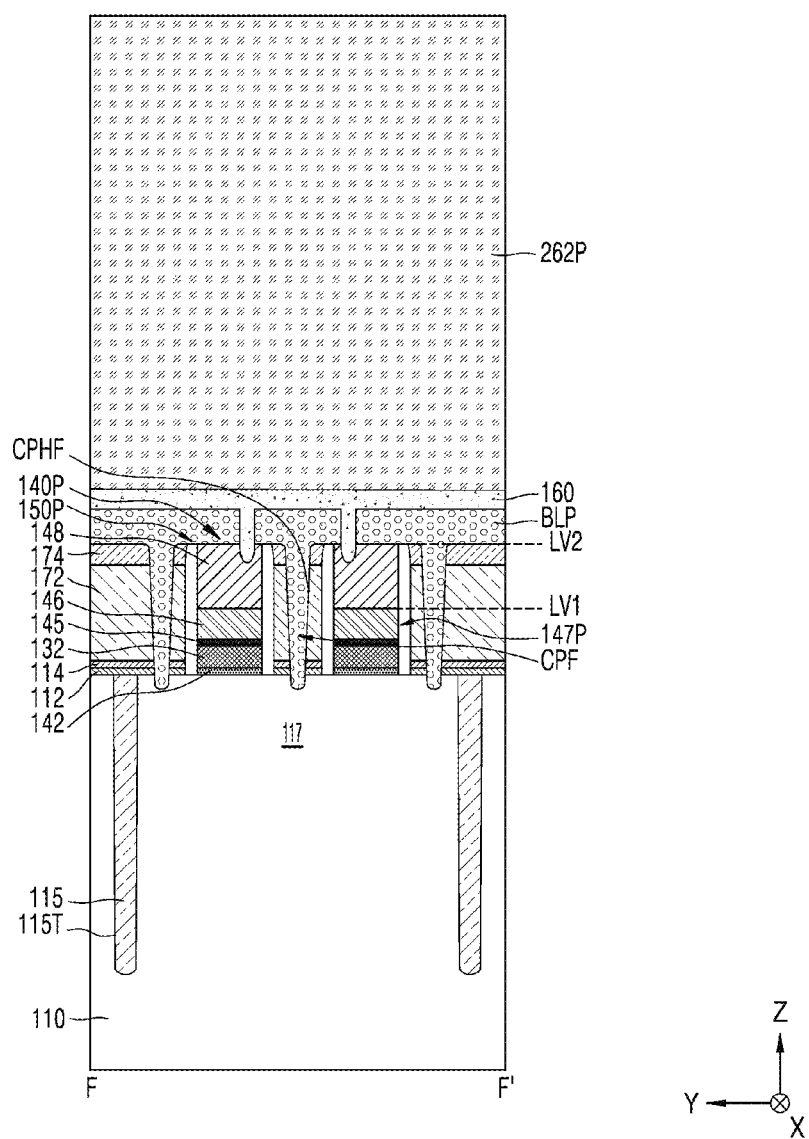
Figure 17A:
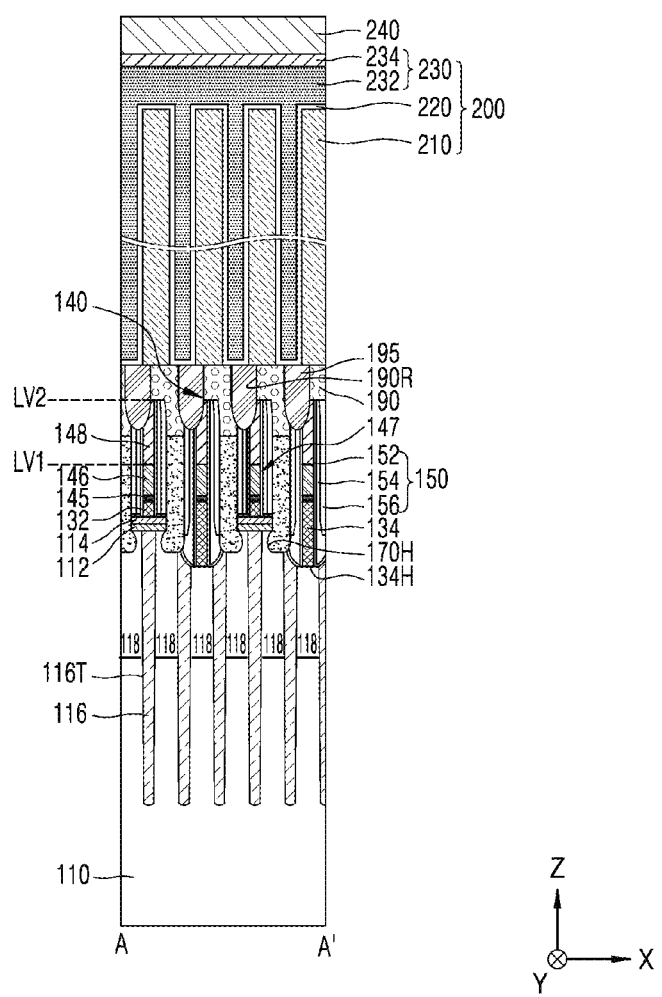
Figure 17B:
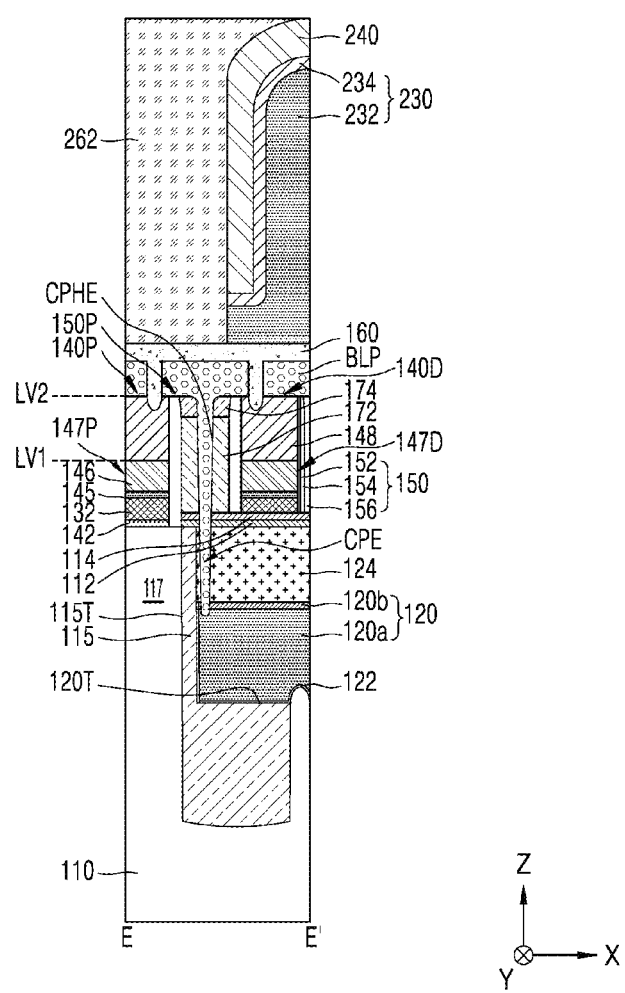
Figure 17C:
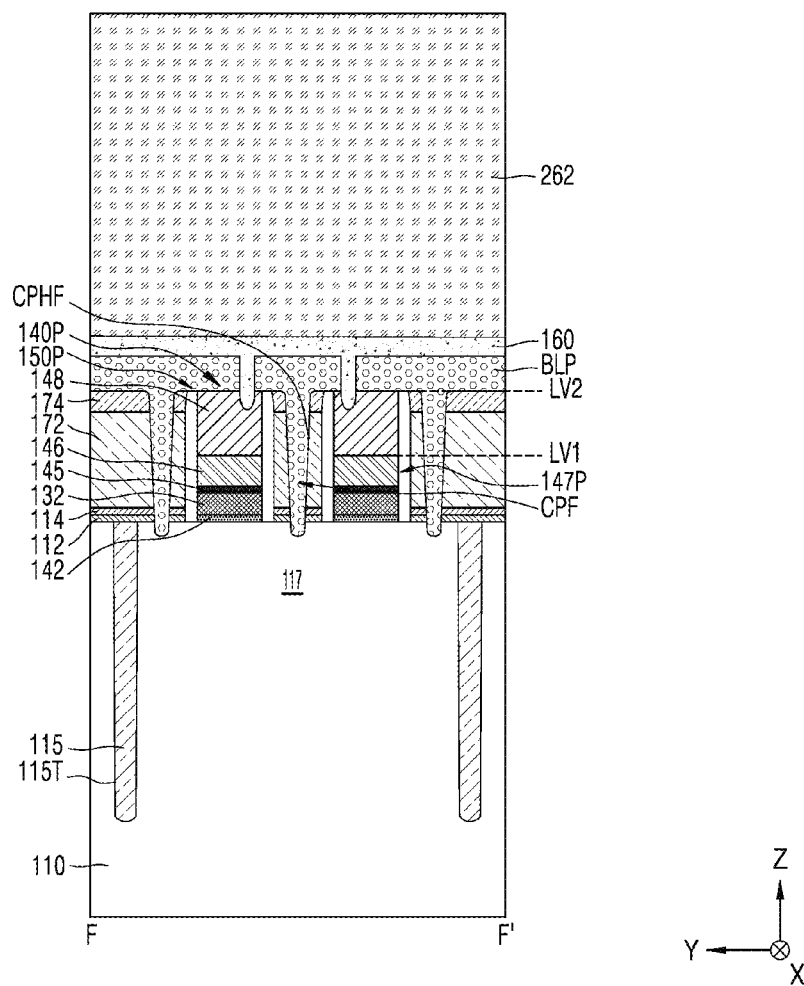

Referring to FIGS. 16A to 16C, a buried insulating material layer 262P covering the resultant material of FIGS. 15A and 15C is formed. The buried insulating material layer 262P may include, for example, silicon oxide. The buried insulating material layer 262P may have a thickness enough to entirely cover the etch stop layer 240 covering the plurality of capacitor structures 200. For example, an upper surface of the buried insulating material layer 262P may be at a level higher than that of the uppermost end of the etch stop layer 240.

Referring to FIGS. 16A to 17C, a buried insulating layer 262 is formed by removing an upper part of the buried insulating material layer 262P. The buried insulating layer 262 may be formed by removing a part of the buried insulating material layer 262P at the level higher than that of the uppermost end of the etch stop layer 240. For example, the buried insulating layer 262 may be formed by removing the upper part of the buried insulating material layer 262P by performing a chemical mechanical polishing (CMP) process by using the etch stop layer 240 as a process stopper.

Figure 18A:
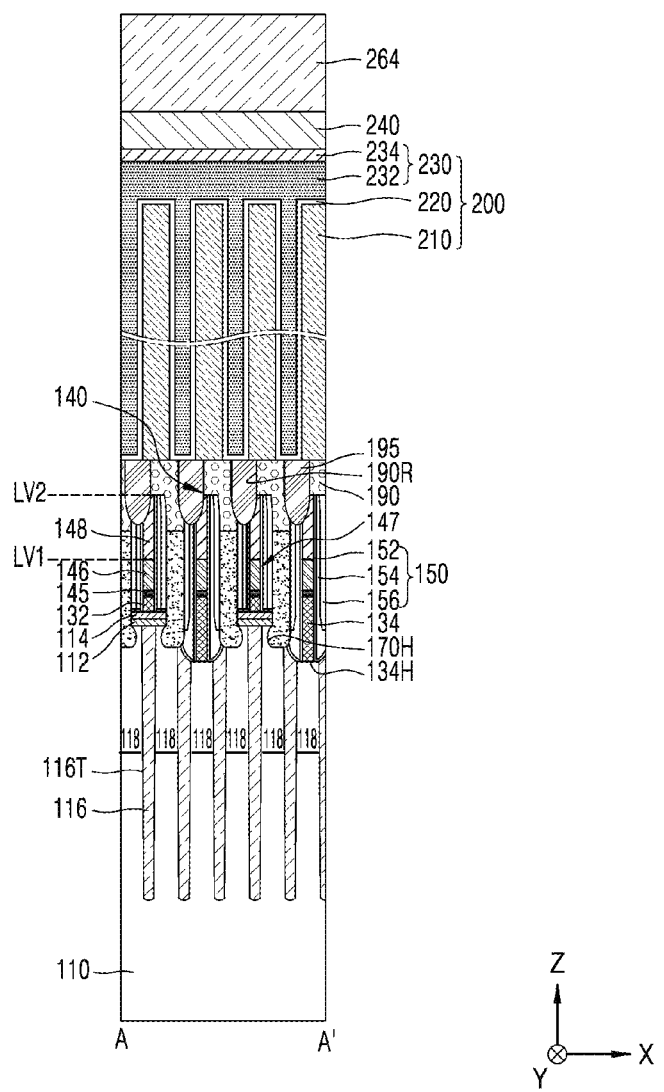
Figure 18B:
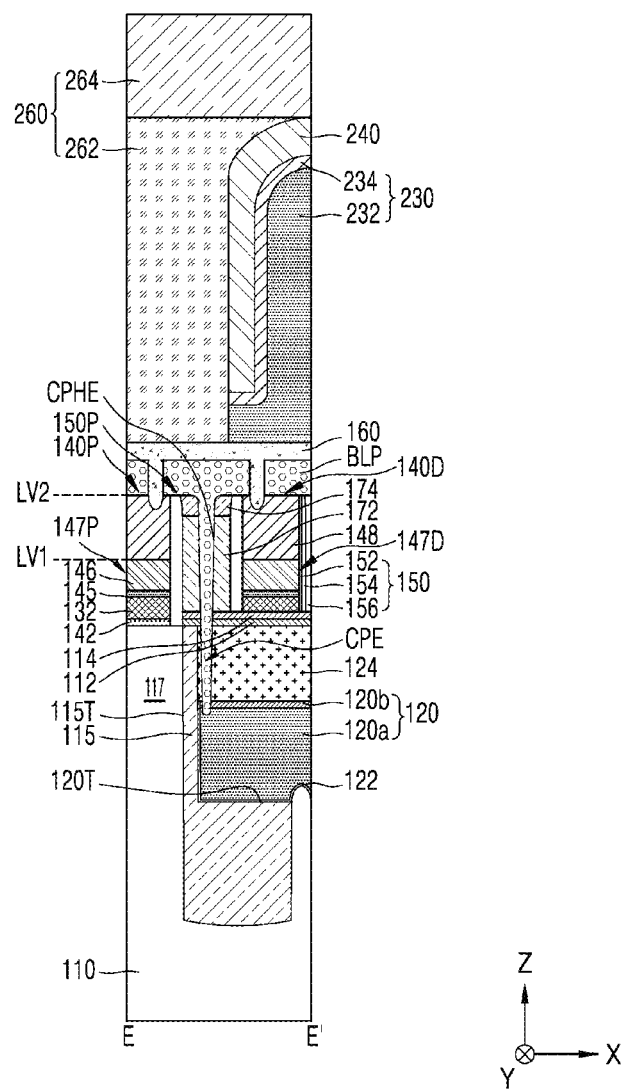
Figure 18C:
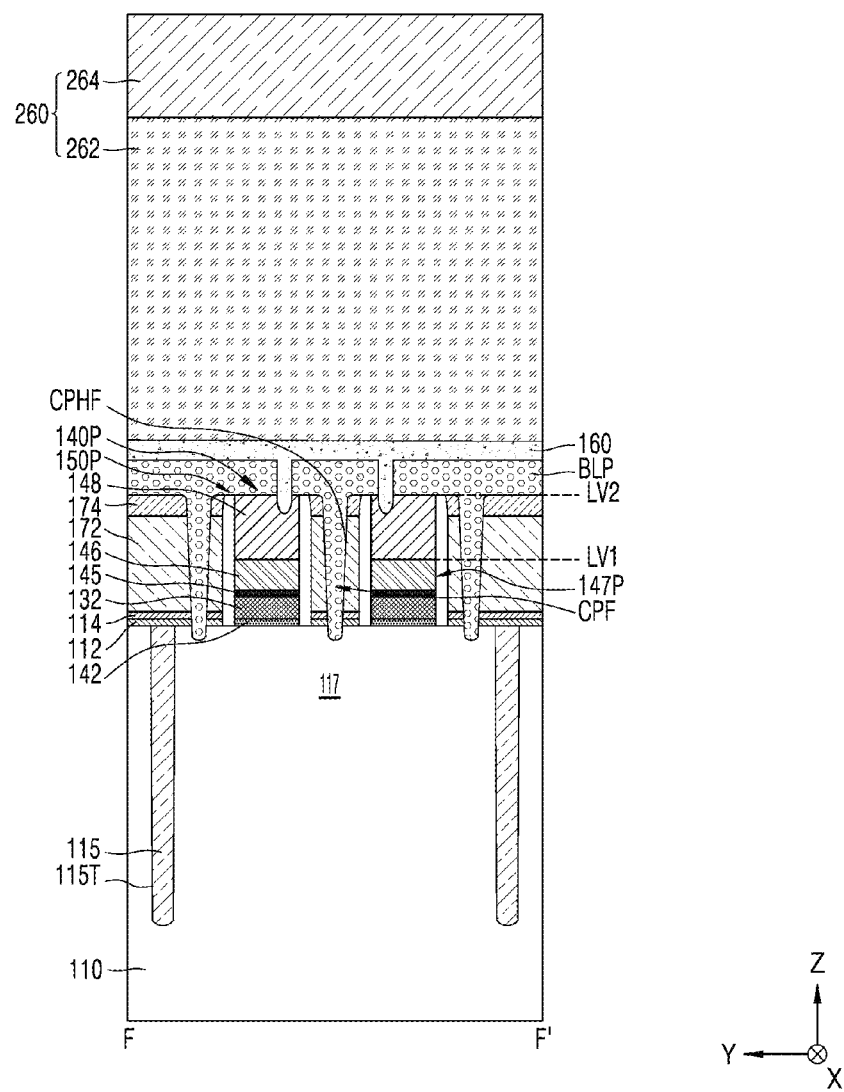

Referring to FIGS. 18A to 18C, a cover insulating layer 264 covering the buried insulating layer 262 and the etch stop layer 240 is formed. The buried insulating layer 262 and the cover insulating layer 264 may configure a filling insulation layer 260. The cover insulating layer 264 may include, for example, silicon oxide. In some embodiments, the buried insulating layer 262 and the cover insulating layer 264 may include the same material as each other. Each of the buried insulating layer 262 and the cover insulating layer 264 may include, for example, an oxide layer or an ultra-low k (ULK) layer. The oxide layer may include at least one selected from a borophosphosilicate glass (BPSG) layer, a phosphosilicate glass (PSG) layer, a borosilicate glass (BSG) layer, an un-doped silicate glass (USG) layer, a tetra ethyl ortho silicate (TEOS) layer, and a high density plasma (HDP) layer. The ULK layer may include, for example, at least one selected from a SiOC layer and a SiCOH layer each having an ultralow dielectric constant k of 2.2 to 2.4.

Figure 19A:
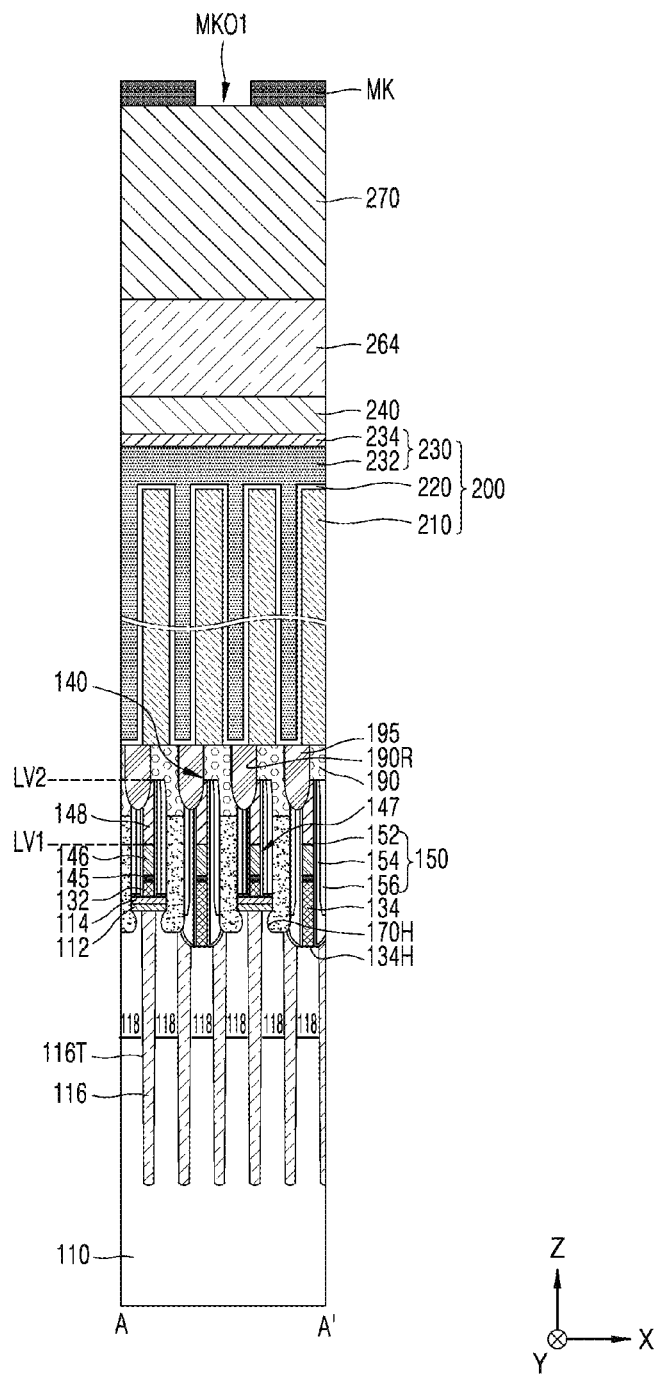
Figure 19B:
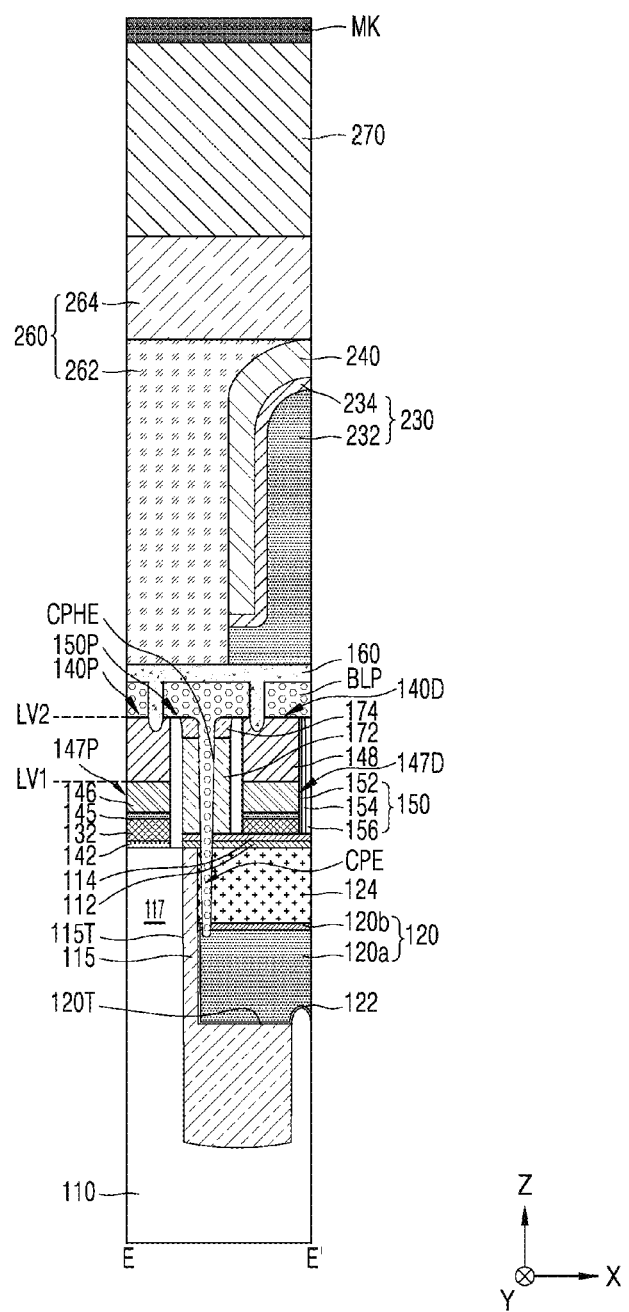
Figure 19C:
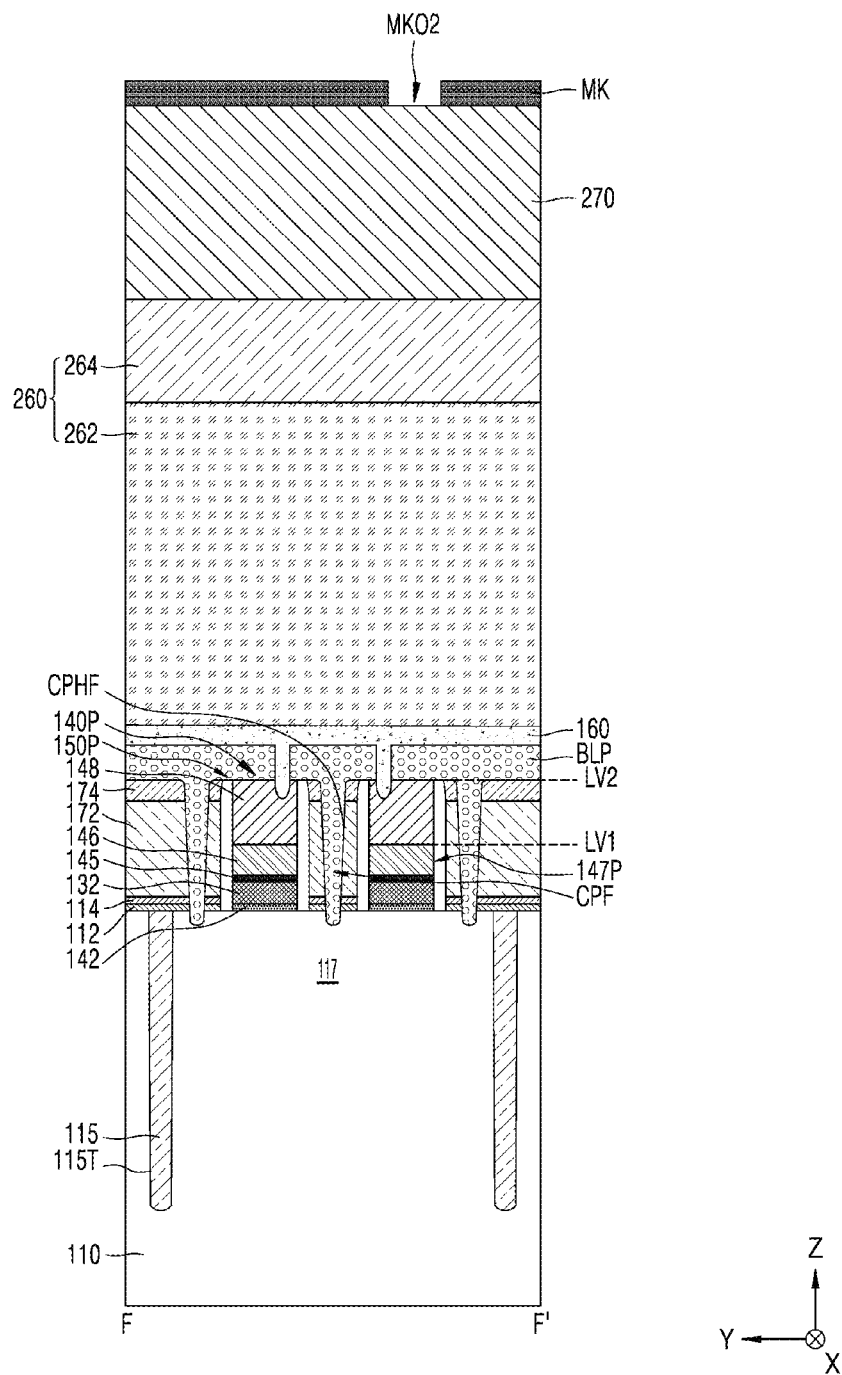
Figure 20A:
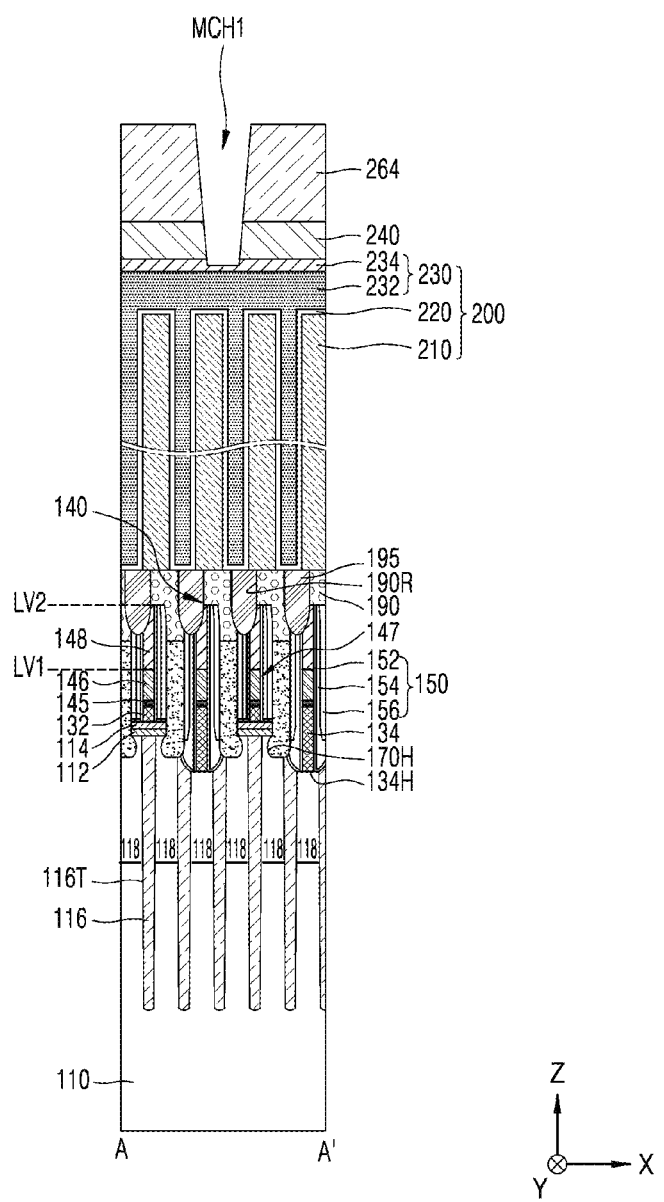
Figure 20B:
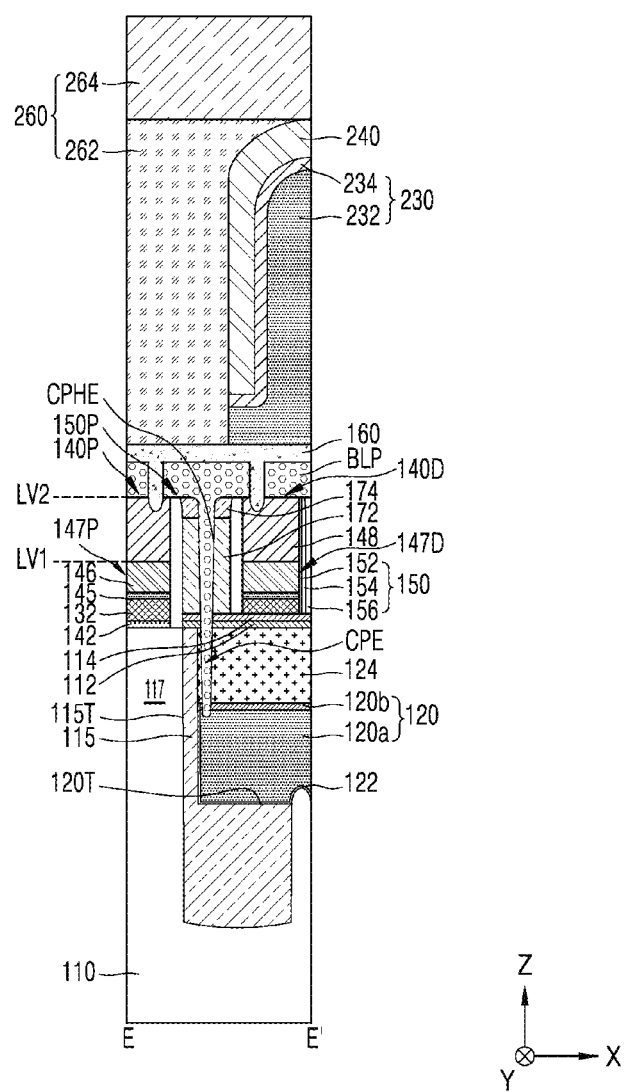
Figure 20C:
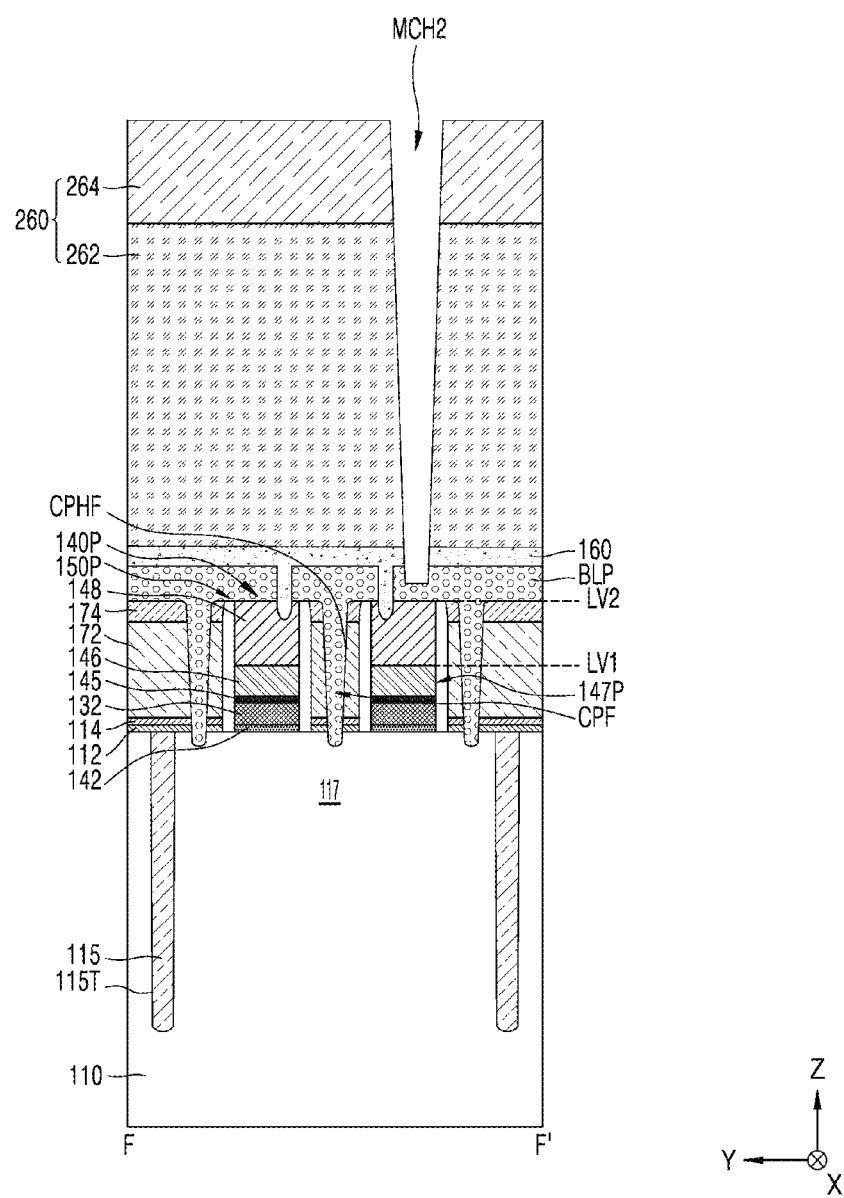

Referring to FIGS. 19A to 19C, a hard mask layer 270 and a mask pattern MK covering the hard mask layer 270 and having first and second mask openings MKO1 and MKO2 are formed on the filling insulation layer 264. The mask pattern MK may be formed so that the first mask opening MKO1 is on the upper electrode 230 and the second mask opening MKO2 is on the plurality of logic bit lines BLP.

The hard mask layer 270 may include, for example, an amorphous carbon layer (ACL) or a spin on hard mask (SOH). In some embodiments, the hard mask layer 270 may have a stacked structure of at least two material layers of an ACL, an SOH, silicon oxynitride, and an antireflection layer. The mask pattern MK may include, for example, a resist material.

Referring to FIGS. 19A to 20C, by removing a part of the hard mask layer 270 and a part of the filling insulation layer 260 by using the mask pattern MK as an etching mask, a plurality of wiring contact holes including a first wiring contact hole MCH1 and a second wiring contact hole MCH2 are formed. After forming the plurality of wiring contact holes including the first wiring contact hole MCH1 and the second wiring contact hole MCH2, the mask pattern MK and the hard mask layer 270 may be removed.

The upper electrode 230 may be exposed at a bottom surface of the first wiring contact hole MCH1. The first wiring contact hole MCH1 may extend to the upper electrode 230 through the cover insulating layer 264 and the etch stop layer 240. In some embodiments, the first wiring contact hole MCH1 may extend to an inside of the upper electrode 230.

The plurality of logic bit lines BLP may be exposed at a bottom surface of the second wiring contact hole MCH2. The second wiring contact hole MCH2 may extend to the plurality of logic bit lines BLP through the filling insulation layer 260 and the logic capping layer 160. In some embodiments, the second wiring contact hole MCH2 may extend to the insides of the plurality of logic bit lines BLP.

In some embodiments, the first wiring contact hole MCH1 and the second wiring contact hole MCH2 may be formed by performing a first etching process of exposing the etch stop layer 240 and the logic capping layer 160 together by using the etch stop layer 240 and then, a second etching process of removing the etch stop layer 240 and the logic capping layer 160. Therefore, the first wiring contact hole MCH1 and the second wiring contact hole MCH2 having remarkably different vertical heights may be formed together.

Referring to FIGS. 21A to 21C, a plurality of wiring contact plugs including a first wiring contact plug MC1 filling the first wiring contact hole MCH1 and a second wiring contact plug MC2 filling the second wiring contact hole MCH2 are formed.

Each of the plurality of wiring contact plugs including the first wiring contact plug MC1 and the second wiring contact plug MC2 may include a wiring contact conductive layer 310 including a wiring contact barrier layer 312 and a wiring contact filling layer 314. The wiring contact barrier layer 312 may conformally cover internal surfaces of the first wiring contact plug MC1 and the second wiring contact hole MCH2 and the wiring contact filling layer 314 may cover the wiring contact barrier layer 312 and may fill the first wiring contact plug MC1 and the second wiring contact hole MCH2. For example, the wiring contact barrier layer 312 may include Ti, Ta, TiN, or TaN. For example, the wiring contact filling layer 314 may include a metal such as W.

Referring to FIGS. 22A to 22E, the semiconductor memory device 1 may be formed by forming a plurality of wiring lines 320 connected to the first wiring contact plug MC1 and the second wiring contact plug MC2 on the filling insulation layer 260 in which the first wiring contact plug MC1 and the second wiring contact plug MC2 are formed. Each of the plurality of wiring lines 320 may include, for example, a metal such as aluminum (Al), Cu, or W.

The semiconductor memory device 1 includes the substrate 110 having the plurality of active areas 118 and the plurality of logic active areas 117, the plurality of gate dielectric layers 122, the plurality of word lines 120, and the plurality of buried insulating layers 124 sequentially formed in the plurality of word line trenches 120T intersecting with the plurality of active areas 118 in the substrate 110, the plurality of first and second insulating layer patterns 112 and 114 covering the plurality of isolation layers 116, the plurality of active areas 118, and the plurality of buried insulating layers 124, the plurality of bit line structures 140 on the plurality of first and second insulating layer patterns 112 and 114, the plurality of insulation spacer structures 150 of which two adjacent insulation spacer structures cover side walls of each of the plurality of bit line structures 140, the plurality of gate line structures 140P on the plurality of logic active areas 117, the plurality of gate insulation spacers 150P of which two adjacent gate insulation spacers cover side walls of each of the plurality of gate line structures 140P, the plurality of buried contacts 170 filling lower portions of spaces limited by the plurality of insulation fences 180 and the plurality of insulation spacer structures 150 and connected to the plurality of active areas 118, the plurality of landing pads 190 filling upper portions of the spaces limited by the plurality of insulation fences 180 and the plurality of insulation spacer structures 150 and extending to upper portions of the plurality of bit line structures 140, and the plurality of capacitor structures 200 including the plurality of lower electrodes 210 connected to the plurality of landing pads 190, the plurality of capacitor dielectric layers 220, and the upper electrode 230.

The upper electrode 230 may include a first upper electrode layer 232 and a second upper electrode layer 234 covering the first upper electrode layer 232. The first upper electrode layer 232 may cover the plurality of capacitor dielectric layers 220 and may fill the spaces among the plurality of lower electrodes 210. The first upper electrode layer 232 may have a first thickness T1 from the uppermost ends of the plurality of capacitor dielectric layers 220 in a vertical direction. The second upper electrode layer 234 may have the second thickness T2. The second thickness T2 may be less than the first thickness T1. The first thickness T1 may be about 1,000 Å to about 2,500 Å, and the second thickness T2 may be about 300 Å to about 1,000 Å. The lowermost end of the second upper electrode layer 234 may be at a level higher than that of each of the uppermost ends of the plurality of lower electrodes 210 and the uppermost ends of the plurality of capacitor dielectric layers 220.

In some embodiments, the first upper electrode layer 232 may include doped polysilicon or doped polycrystalline SiGe. In some embodiments, the second upper electrode layer 234 may have a stacked structure of an electrode barrier layer 235 and a main electrode layer 236. The electrode barrier layer 235 may function as an adhesive layer attaching the second upper electrode layer 234 to the first upper electrode layer 232. The electrode barrier layer 235 may include, for example, Ti, TiN, Ta, or TaN. In some embodiments, the electrode barrier layer 235 may include Ti. The main electrode layer 236 may include, for example, W, Ru, RuO, Pt, PtO, Jr, IrO, SRO(SrRuO), BSRO((Ba,Sr)RuO), CRO(CaRuO), BaRuO, or La(Sr,Co)O. In some embodiments, the main electrode layer 236 may include a metal material. In some embodiments, the main electrode layer 236 may include W.

The etch stop layer 240 may cover an upper surface of the upper electrode 230. The etch stop layer 240 may have a third thickness T3. The third thickness T3 may be less than the first thickness T1. The third thickness T3 may be about 300 Å to about 1,500 Å. The etch stop layer 240 may cover the upper electrode 230 and may not cover the logic capping layer 160. For example, the etch stop layer 240 may overlap the upper electrode 230 and may not overlap the logic capping layer 160 in the vertical direction (the Z direction).

The plurality of insulation fences 180 may be apart one another along a space between a pair of insulation spacer structures facing each other and covering the side walls of each of the plurality of bit lines structures 140 among the plurality of insulation spacer structures 150, that is, in the second horizontal direction (the Y direction). The plurality of insulation fences 180 may extend from spaces among the plurality of buried contacts 170 to spaces among the plurality of landing pads 190.

The semiconductor memory device 1 may further include a plurality of word line contact plugs CPE and a plurality of logic active area contact plugs CPF. The plurality of word line contact plugs CPE may be connected to the plurality of lower word line layers 120a through the plurality of first and second filling insulation layers 172 and 174, the plurality of first and second insulating layer patterns 112 and 114, the plurality of buried insulating layers 124, and the plurality of upper word line layers 120b. The plurality of logic active area contact plugs CPF may be connected to the plurality of logic active areas 117 through the plurality of first and second filling insulation layers 172 and 174 and the plurality of first and second insulating layer patterns 112 and 114.

The plurality of logic bit lines BLP may be arranged on the plurality of insulation capping lines 148 and the plurality of first and second filling insulation layers 172 and 174. Each of the plurality of word line contact plugs CPE and the plurality of logic active area contact plugs CPF may be connected to at least one of the plurality of logic bit lines BLP. Each of the plurality of logic bit lines BLP may have a stacked structure of a bit line barrier layer 192 and a bit line conductive layer 194. In some embodiments, the bit line barrier layer 192 may include Ti, TiN, or a stacked structure of Ti and TiN and the bit line conductive layer 194 may include W.

The semiconductor memory device 1 may further include the first wiring contact plug MC1 and the second wiring contact hole MCH2. The second wiring contact plug MC2 may have a vertical height greater than that of first wiring contact plug MC1. For example, an upper surface of the first wiring contact plug MC1 may be at the same level as an upper surface of the second wiring contact plug MC2 and a lower surface of the first wiring contact plug MC1 may be at a level higher than a lower surface of the second wiring contact plug MC2. The first wiring contact plug MC1 may electrically connect the plurality of wiring lines 320 to the upper electrode 230. The second wiring contact plug MC2 may electrically connect the plurality of wiring lines 320 to the plurality of logic bit lines BLP. In some embodiments, the second wiring contact plug MC2 and the plurality of logic bit lines BLP connected to the second wiring contact plug MC2 may electrically connect the plurality of wiring lines 320 to the plurality of gate lines 147P, the plurality of wiring lines 320 to the plurality of word lines 120, or the plurality of wiring lines 320 to the plurality of logic active areas 117.

The first wiring contact plug MC1 may extend to the second upper electrode layer 234 through the filling insulation layer 260, that is, the cover insulating layer 264 and the etch stop layer 240. For example, the first wiring contact plug MC1 may extend to an inside of the second upper electrode layer 234. In some embodiments, a lower surface of the first wiring contact plug MC1 may be at a level higher than an upper surface of the first upper electrode layer 232 so that the first wiring contact plug MC1 is apart from the first upper electrode layer 232. In some embodiments, the first wiring contact plug MC1 may extend to an inside of the main electrode layer 236 of the second upper electrode layer 234 and may not contact the electrode barrier layer 235.

The second wiring contact plug MC2 may extend to the plurality of logic bit lines BLP through the filling insulation layer 260, that is, the cover insulating layer 264 and the buried insulating layer 262, and the logic capping layer 160. For example, the second wiring contact plug MC2 may extend to the insides of the plurality of logic bit lines BLP. In some embodiments, the second wiring contact plug MC2 may extend to an inside of the bit line conductive layer 194 of the plurality of logic bit lines BLP and may not contact the bit line barrier layer 192.

The etch stop layer 240 covering the upper surface of the second upper electrode layer 234 electrically connected to the first wiring contact plug MC1 and surrounding the first wiring contact plug MC1 may be formed of a material different from that of the logic capping layer 160 covering the upper surfaces of the plurality of logic bit lines BLP electrically connected to the second wiring contact plug MC2 and surrounding the second wiring contact plug MC2. In some embodiments, the etch stop layer 240 may include silicon oxynitride and the logic capping layer 160 may include silicon nitride. In some embodiments, the etch stop layer 240 may include silicon nitride having a stoichiometric ratio different from that of silicon nitride of the logic capping layer 160.

The semiconductor memory device 1 according to inventive concepts includes the upper electrode 230 including the first upper electrode layer 232 including a semiconductor material and the second upper electrode layer 234 including a metallic material. Therefore, the first upper electrode layer 232 may cover the plurality of capacitor dielectric layers 220 covering the plurality of lower electrodes 210 and may fill the spaces among the plurality of lower electrodes 210 and the second upper electrode layer 234 may protect a lower structure while performing a back end of line (BEOL) process on the wiring contact conductive layer 310 and the plurality of wiring lines 320. In addition, because the second upper electrode layer 234 provides improved adhesion to insulating materials, for example, the etch stop layer 240 and/or the filling insulation layer 260 covering the upper electrode layer 230, the reliability of the semiconductor memory device 1 may improve.

In addition, because the semiconductor memory device 1 according to inventive concepts further includes the etch stop layer 240 covering the upper electrode layer 230, the first wiring contact plug MC1 and the second wiring contact plug MC2 having different heights may be formed together.

FIGS. 23A to 23F are cross-sectional views illustrating an enlarged part of a semiconductor memory device according to embodiments of inventive concepts. Specifically, FIGS. 23A to 23F are cross-sectional views illustrating an enlarged part corresponding to the portion CT1 of FIG. 22A.

Referring to FIGS. 22A to 23A, the semiconductor memory device 1 may include an upper electrode 230a instead of the upper electrode 230 illustrated in FIGS. 22A, 22B, and 22D.

The upper electrode 230a may include a first upper electrode layer 232 and a second upper electrode layer 234a covering the first upper electrode layer 232. The first upper electrode layer 232 may have the first thickness T1 from the uppermost ends of the plurality of capacitor dielectric layers 220 in a vertical direction. The second upper electrode layer 234a may have the second thickness T2.

In some embodiments, the second upper electrode layer 234a may have a stacked structure of an electrode barrier layer 235, a main electrode layer 236, and an interface layer 237. The interface layer 237 may cover an upper surface of the main electrode layer 236. The first wiring contact plug MC1 may extend to an inside of the main electrode layer 236 through the interface layer 237. The interface layer 237 may include at least one of metal oxide, metal nitride, metal carbide, and metal silicide. For example, the main electrode layer 236 may include W and the interface layer 237 may include at least one of WO, WN, WC, and WSi. In some embodiments, the interface layer 237 may include conductive metal oxide. For example, the interface layer 237 may include WO. The interface layer 237 may have a fourth thickness T4 less than the first thickness T1, a second thickness T2, and the third thickness T3. The fourth thickness T4 may be about 5 Å to about 50 Å.

Because, in the semiconductor memory device 1 according to inventive concepts, the upper electrode layer 234a includes the interface layer 237, a lower structure may be protected while performing the BEOL process on the wiring contact conductive layer 310 and the plurality of wiring lines 320.

Referring to FIGS. 22A to 22E and 23B, the semiconductor memory device 1 may include an upper electrode 230b instead of the upper electrode 230 illustrated in FIGS. 22A, 22B, and 22D.

The upper electrode 230b may include a first upper electrode layer 232 and a second upper electrode layer 234b covering the first upper electrode layer 232. In some embodiments, the second upper electrode layer 234b may have a stacked structure of an electrode barrier layer 235, an interface layer 237, and a main electrode layer 236. The interface layer 237 may be interposed between the electrode barrier layer 235 and the main electrode layer 236 so as to cover a lower surface of the main electrode layer 236. The first wiring contact plug MC1 may extend to an inside of the main electrode layer 236 without contacting the interface layer 237.

Referring to FIGS. 22A to 22E and 23C, the semiconductor memory device 1 may include an upper electrode 230c instead of the upper electrode 230 illustrated in FIGS. 22A, 22B, and 22D.

The upper electrode 230c may include a first upper electrode layer 232 and a second upper electrode layer 234c covering the first upper electrode layer 232. In some embodiments, the second upper electrode layer 234c may have a stacked structure of an electrode barrier layer 235, a first main electrode layer 236a, an interface layer 237, and a second main electrode layer 236b. Each of the first main electrode layer 236a and the second main electrode layer 236b may include the same material as the main electrode layer 236 illustrated in FIGS. 22A, 22B, and 22D. When the first main electrode layer 236a and the second main electrode layer 236b are referred to as a main electrode layer, the interface layer 237 may be in the upper electrode layer.

Referring to FIGS. 22A to 22E and 23D, the semiconductor memory device 1 may include an upper electrode 230d instead of the upper electrode 230 illustrated in FIGS. 22A, 22B, and 22D.

The upper electrode 230d may include a first upper electrode layer 232 and a second upper electrode layer 234d covering the first upper electrode layer 232. In some embodiments, the second upper electrode layer 234d may have a stacked structure of an electrode barrier layer 235, a first interface layer 237a, a main electrode layer 236, and a second interface layer 237b. Each of the first interface layer 237a and the second interface layer 237b may include the same material as the interface layer 237a illustrated in FIG.

23A. Each of the first interface layer 237a and the second interface layer 237b may have a thickness of about 5 Å to about 25 Å.

Referring to FIGS. 22A to 22E and 23E, the semiconductor memory device 1 may include an upper electrode 230e instead of the upper electrode 230 illustrated in FIGS. 22A, 22B, and 22D.

The upper electrode 230e may include a first upper electrode layer 232 and a second upper electrode layer 234e covering the first upper electrode layer 232. In some embodiments, the second upper electrode layer 234e may have a stacked structure of an electrode barrier layer 235, a first main electrode layer 236a, a first interface layer 237a, a second main electrode layer 236b, and a second interface layer 237b.

Referring to FIGS. 22A to 22E and 23F, the semiconductor memory device 1 may include a first wiring contact plug MC1a instead of the first wiring contact plug MC1 illustrated in FIG. 22A.

The first wiring contact plug MC1a may extend to an inside of the firsts upper electrode layer 232 through the filling insulation layer 260, that is, the cover insulating layer 254, the etch stop layer 240, and the second upper electrode layer 234 and may be apart from the plurality of capacitor dielectric layers 220.

Figure 24A:
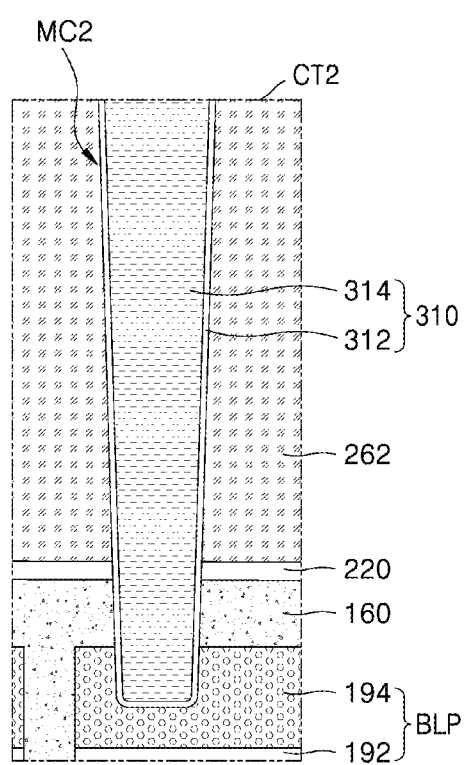
FIGS. 24A to 24C are cross-sectional views illustrating an enlarged part of a semiconductor memory device according to embodiments of inventive concepts.
Figure 24B:
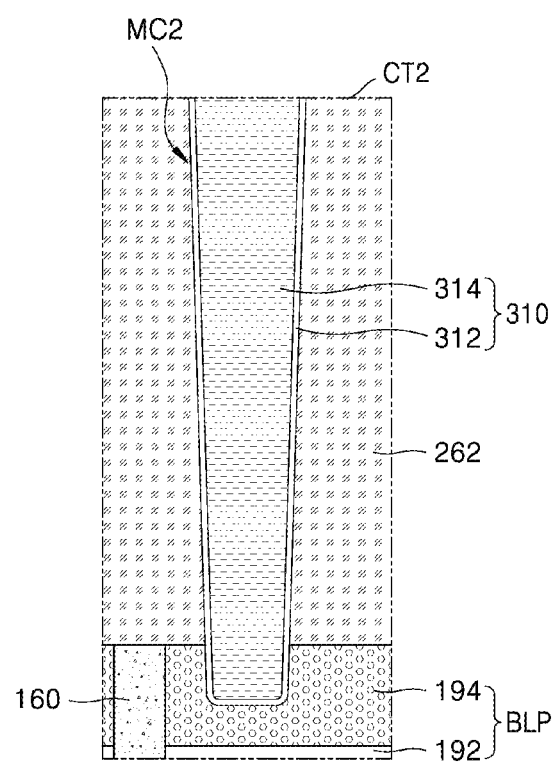
Figure 24C:
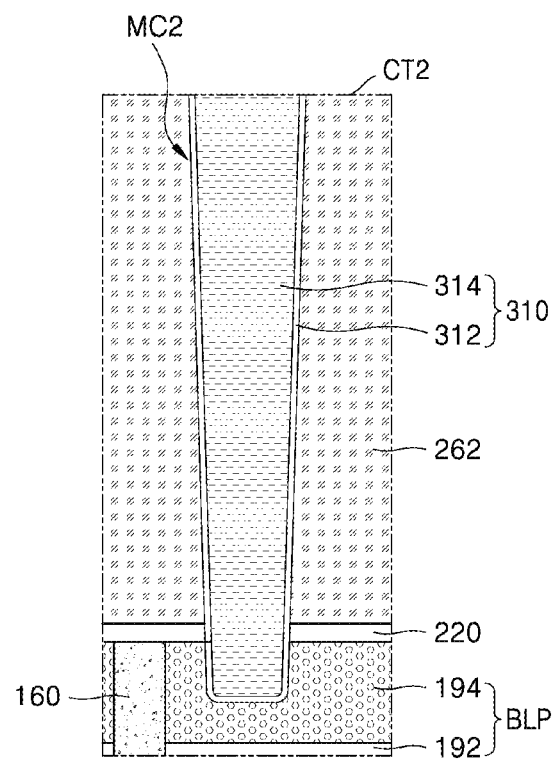

FIGS. 24A to 24C are cross-sectional views illustrating an enlarged part of a semiconductor memory device according to embodiments of inventive concepts. Specifically, FIGS. 24A to 24C are cross-sectional views illustrating an enlarged part corresponding to the portion CT2 of FIG. 22C.

Referring to FIGS. 22A to 22E and 24A, the plurality of capacitor dielectric layers 220 provided in the semiconductor memory device 1 may cover an upper surface of the logic capping layer 160. That is, the plurality of capacitor dielectric layers 220 may cover the plurality of lower electrodes 210 in the memory cell area (CR of FIG. 2) and an upper surface of the logic capping layer 160 in the peripheral area (PR of FIG. 2).

The second wiring contact plug MC2 may extend to an inside of the bit line conductive layer 194 of the plurality of logic bit lines BLP through the filling insulation layer 260, that is, the cover insulating layer 264 and the buried insulating layer 262, the plurality of capacitor dielectric layers 220, and the logic capping layer 160.

Referring to FIGS. 22A to 22E and 24B, the logic capping layer 160 provided in the semiconductor memory device 1 may fill the spaces among the plurality of logic bit lines BLP and may not cover the upper surfaces of the plurality of logic bit lines BLP.

The second wiring contact plug MC2 may extend to an inside of the bit line conductive layer 194 of the plurality of logic bit lines BLP through the filling insulation layer 260, that is, the cover insulating layer 264 and the buried insulating layer 262.

Referring to FIGS. 22A to 22E and 24C, the logic capping layer 160 provided in the semiconductor memory device 1 may fill the spaces among the plurality of logic bit lines BLP and may not cover the upper surfaces of the plurality of logic bit lines BLP and the plurality of capacitor dielectric layers 220 may cover the upper surface of the logic capping layer 160 and the bit line conductive layer 194 of the plurality of logic bit lines BLP.

The second wiring contact plug MC2 may extend to the inside of the bit line conductive layer 194 of the plurality of logic bit lines BLP through the filling insulation layer 260, that is, the cover insulating layer 264 and the buried insulating layer 262, and the plurality of capacitor dielectric layers 220.

Figure 25:
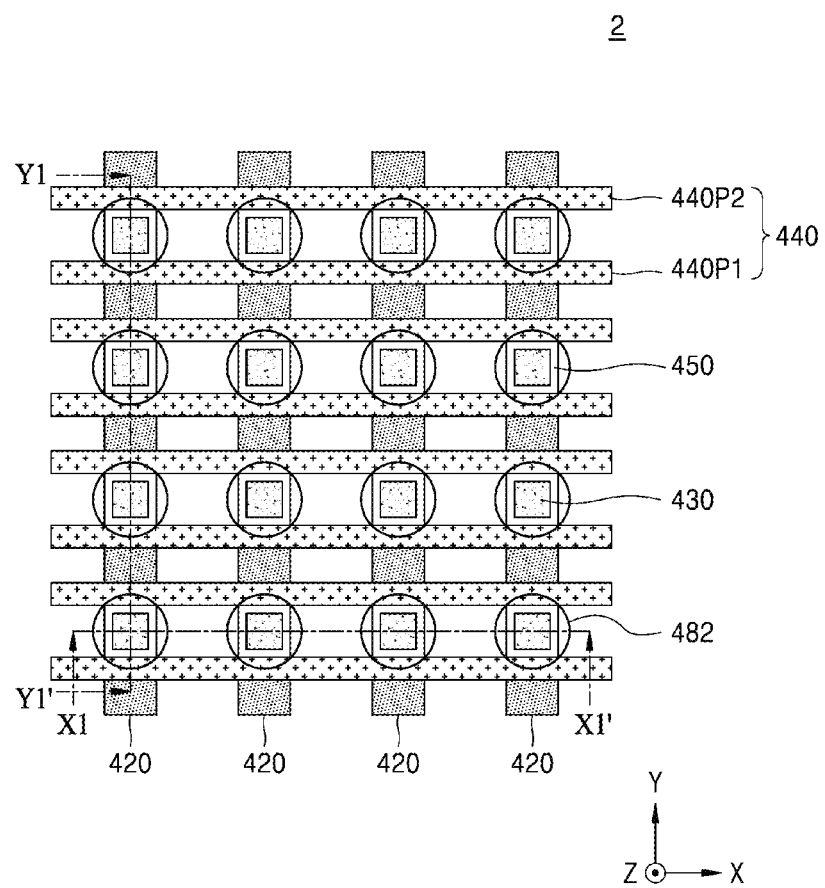
FIG. 25 is a layout diagram illustrating a semiconductor memory device according to embodiments of inventive concepts.
Figure 26:
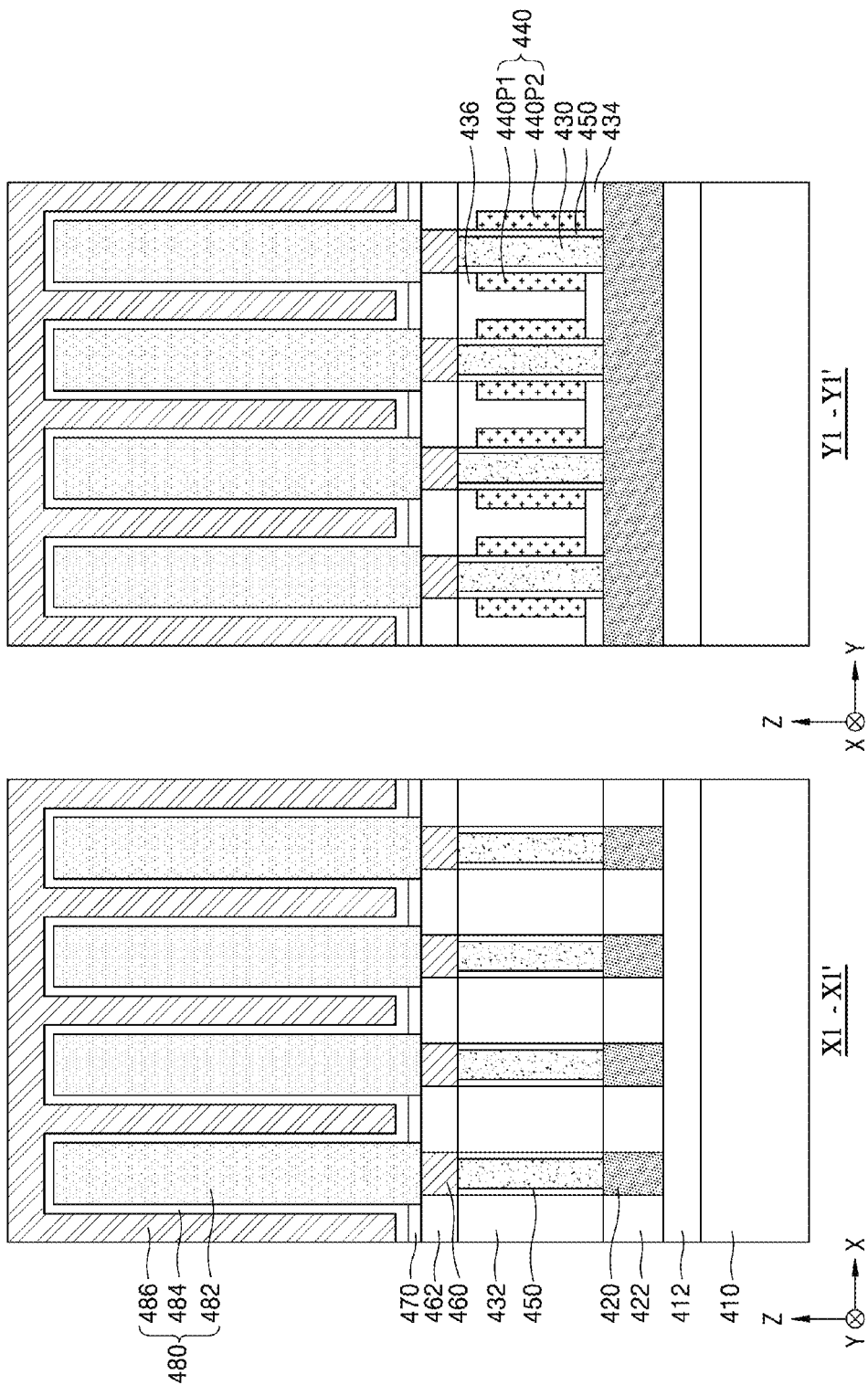
FIG. 26 is a cross-sectional view taken along the line X1-X1' and the line Y1-Y1' of FIG. 25.

FIG. 25 is a layout diagram illustrating a semiconductor memory device 2 according to embodiments of inventive concepts and FIG. 26 is a cross-sectional view taken along the line X1-X1' and the line Y1-Y1' of FIG. 25.

Referring to FIGS. 25 and 26, the semiconductor memory device 2 may include a substrate 410, a plurality of first conductive lines 420, a plurality of channel layers 430, a plurality of gate electrodes 440, a plurality of gate insulating layers 450, and a plurality of capacitor structures 480. An integrated circuit (IC) device 400 may be a memory device including a vertical channel transistor (VCT). The VCT may refer to a structure in which the plurality of channel layers 430 extend from the substrate 410 in a vertical direction.

A lower insulating layer 412 may be arranged on the substrate 410 and a plurality of first conductive lines 420 may be apart from one another on the lower insulating layer 412 in the first horizontal direction (the X direction) and may extend in the second horizontal direction (the Y direction). A plurality of first insulating patterns 422 may be arranged on the lower insulating layer 412 to fill spaces among the plurality of first conductive lines 420. The plurality of first insulating patterns 422 may extend in the second horizontal direction (the Y direction) and an upper surface of each of the plurality of first insulating patterns 422 may be at the same level as an upper surface of each of the plurality of first conductive lines 420. The plurality of first conductive lines 420 may function as a plurality of bit lines of the semiconductor memory device 2.

In example embodiments, each of the plurality of first conductive lines 420 may include doped polysilicon, a metal, conductive metal nitride, conductive metal silicide, conductive metal oxide, or a combination of the above materials. For example, each of the plurality of first conductive lines 420 may include doped polysilicon, Al, Cu, Ti, Ta, ruthenium (Ru), W, molybdenum (Mo), platinum (Pt), nickel (Ni), cobalt (Co), TiN, TaN, WN, NbN, TiAl, TiAlN, TiSi, TiSiN, TaSi, TaSiN, RuTiN, NiSi, CoSi, IrO$_x$, RuO$_x$, or a combination of the above materials. However, inventive concepts are not limited thereto. Each of the plurality of first conductive lines 420 may include a single layer or a multilayer of the above materials. In example embodiments, the plurality of first conductive lines 420 may include a two-dimensional semiconductor material, for example, graphene, carbon nanotube, or a combination of the above materials.

The plurality of channel layers 430 may be arranged in a matrix on the plurality of first conductive lines 420 to be apart from one another in the first horizontal direction (the X direction) and the second horizontal direction (the Y direction). Each of the plurality of channel layers 430 may have a first width in the first horizontal direction (the X direction) and a first height in a third direction (the Z direction). The first height may be greater than the first width. For example, the first height may be about 2 to 10 times the first width. However, inventive concepts are not limited thereto. Bottom portions of the plurality of channel layers 430 may function as first source/drain areas (not shown), upper portions of the plurality of channel layers 430 may function as second source/drain areas (not shown), and parts of the plurality of channel layers 430 between the first source/drain areas and the second source/drain areas may function as channel areas (not shown).

In example embodiments, each of the plurality of channel layers 430 may include an oxide semiconductor, for example, $In_xGa_yZn_zO$, $In_xGa_ySi_zO$, $In_xSn_yZn_zO$, $In_xZn_yO$, $Zn_xO$, $Zn_xSn_yO$, $ZnxO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination of the above materials. Each of the plurality of channel layers 430 may include a single layer or a multilayer of the oxide semiconductor. In some embodiments, the plurality of channel layers 430 may have band gap energy greater than band gap energy of silicon. For example, the plurality of channel layers 430 may have band gap energy of about 1.5 eV to about 5.6 eV. For example, the plurality of channel layers 430 may have optimal channel performance when the plurality of channel layers 430 have band gap energy of about 2.0 eV to about 4.0 eV. For example, the plurality of channel layers 430 may be polycrystalline or amorphous. However, inventive concepts are not limited thereto. In example embodiments, the plurality of channel layers 430 may include a two-dimensional semiconductor material, for example, graphene, carbon nanotube, or a combination of the above materials.

A first sub-gate electrode 440P1 and a second sub-gate electrode 440P2 of each of the plurality of gate electrodes 440 may extend on side walls of each of the plurality of channel layers 430 in the first horizontal direction (the X direction). Each of the plurality of gate electrodes 440 may include the first sub-gate electrode 440P1 facing a first side wall of each of the plurality of channel layers 430 and the second sub-gate electrode 440P2 facing a second side wall opposite to the first side wall of each of the plurality of channel layers 430. As one channel layer 430 is arranged between the first sub-gate electrode 440P1 and the second sub-gate electrode 440P2, the semiconductor memory device 2 may have a dual gate transistor structure. However, inventive concepts are not limited thereto. The second sub-gate electrode 440P2 may be omitted and only the first sub-gate electrode 440P1 facing the first side wall of each of the plurality of channel layers 430 may be formed so that a single gate transistor structure may be implemented.

Each of the plurality of gate electrodes 440 may include doped polysilicon, a metal, conductive metal nitride, conductive metal silicide, conductive metal oxide, or a combination of the above materials. For example, each of the plurality of gate electrodes 440 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination of the above materials. However, inventive concepts are not limited thereto.

Two adjacent gate insulating layers among the plurality of gate insulating layers 450 may surround the side walls of each of the plurality of channel layers 430 and may be interposed between each of the plurality of channel layers 430 and each of the plurality of gate electrodes 440. For example, as illustrated in FIG. 25, the side walls of each of the plurality of channel layers 430 may be surrounded by the two adjacent gate insulating layers among the plurality of gate insulating layers 450 and parts of side walls of each of the plurality of gate electrodes 440 may contact the two adjacent gate insulating layers among the plurality of gate insulating layers 450. In other embodiments, the plurality of gate insulating layers 450 may extend in a direction (that is, the first horizontal direction (the X direction)) in which the plurality of gate electrodes 440 extend and only two side walls of each of the plurality of channel layers 430, which face each of the plurality of gate electrodes 440, may contact each of the plurality of gate insulating layers 450.

In example embodiments, each of the plurality of gate insulating layers 450 may include a silicon oxide layer, a silicon oxynitride layer, a high-k dielectric layer having a dielectric constant higher than that of a silicon oxide layer, or a combination of the above layers. The high-k dielectric layer may include metal oxide or metal oxynitride. For example, the high-k dielectric layer used as each of the plurality of gate insulating layers 450 may include $HfO_2$, HfSiO, HfSiON, HfTaO, HfSiO, HfZrO, $ZrO_2$, $Al_2O_3$, or a combination of the above materials. However, inventive concepts are not limited thereto.

On the plurality of first insulating patterns 422, a plurality of second insulating patterns 432 may extend in the second horizontal direction (the Y direction) and each of the plurality of channel layers 430 may be arranged between two adjacent second insulating patterns 432 among the plurality of second insulating patterns 432. In addition, between the two adjacent second insulating patterns 432, each of a plurality of first buried layers 434 and each of a plurality of second buried layers 436 may be arranged in a space between two adjacent channel layers 430. Each of the plurality of first buried layers 434 may be arranged on a bottom surface of the space between the two adjacent channel layers 430 and each of a plurality of second buried layers 436 may fill a remaining part of the space between the two adjacent channel layers 430 on each of the plurality of first buried layers 434. An upper surface of each of the plurality of second buried layers 436 may be at the same level as an upper surface of each of the plurality of channel layers 430 and the plurality of second buried layers 436 may cover upper surfaces of the plurality of gate electrodes 440. Unlike in the above, the plurality of second insulating patterns 432 may include material layers continuous to the plurality of first insulating layers 422 or the plurality of second buried layers 436 may include material layers continuous to the plurality of first buried layers 434.

A plurality of capacitor contacts 460 may be arranged on the plurality of channel layers 430. The plurality of capacitor contacts 460 may be arranged to vertically overlap the plurality of channel layers 430 and may be arranged in a matrix to be apart one another in the first horizontal direction (the X direction) and the second horizontal direction (the Y direction). Each of the plurality of capacitor contacts 460 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination of the above materials. However, inventive concepts are not limited thereto. Two adjacent upper insulating layers among a plurality of upper insulating layers 462 may surround side walls of each of the plurality of capacitor contacts 460 on two adjacent second insulating patterns among the plurality of second insulating patterns 432 and two adjacent buried layers among the plurality of second buried layers 436.

A plurality of etch stop layers 470 may be arranged on the plurality of upper insulating layers 462 and a capacitor structure 480 may be arranged on the plurality of etch stop layers 470. The capacitor structure 480 may include a plurality of lower electrodes 482, a plurality of capacitor dielectric layers 484, and an upper electrode 486.

The plurality of lower electrodes 482 may be electrically connected to upper surfaces of the plurality of capacitor contacts 460 through the plurality of etch stop layers 470. Each of the plurality of lower electrodes 482 may be in the form of a pillar extending in the third direction (the Z direction). However, inventive concepts are not limited thereto. In example embodiments, the plurality of lower electrodes 482 may be arranged to vertically overlap the plurality of capacitor contacts 460 and may be arranged in a matrix to be apart from one another in the first horizontal direction (the X direction) and the second horizontal direction (the Y direction). Unlike in the above, a plurality of landing pads (not shown) may be further arranged between the plurality of capacitor contacts 460 and the plurality of lower electrodes 482 so that the plurality of lower electrodes 482 may be hexagonal.

The plurality of lower electrodes 482 and the plurality of capacitor dielectric layers 484 may be the plurality of lower electrodes 210 and the plurality of capacitor dielectric layers 220 illustrated in FIGS. 22A to 23F and the upper electrode 486 may be one of the upper electrodes 230, 230a, 230b, 230c, 230d, and 230e illustrated in FIGS. 22A to 23F.

The semiconductor memory device 2 may further include one of the first wiring contact plugs MC1 and MC1a illustrated in FIGS. 22A to 24C and the second wiring contact plug MC2.

Figure 27:
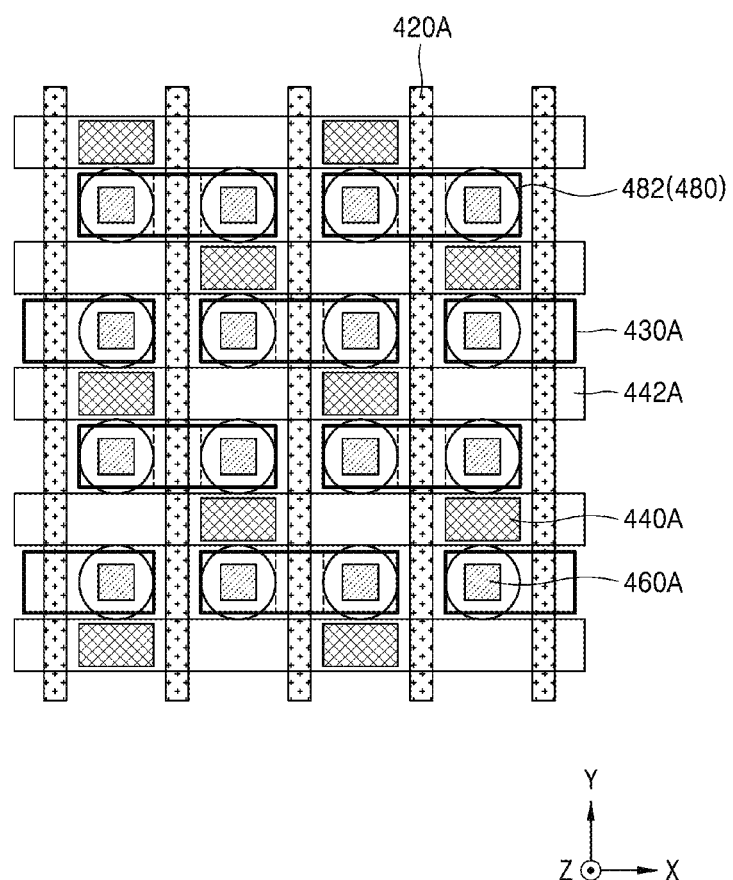
FIG. 27 is a layout diagram illustrating a semiconductor memory device according to embodiments of inventive concepts.
Figure 28:
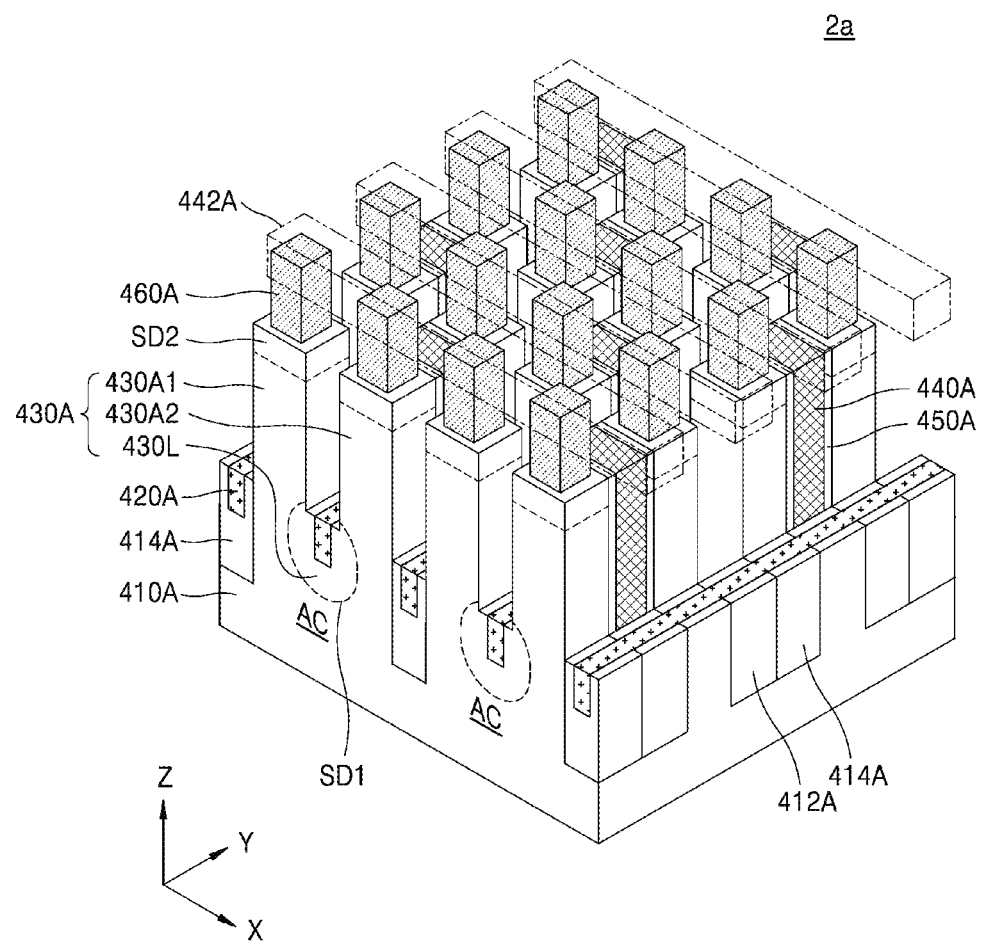
FIG. 28 is a perspective view illustrating a semiconductor memory device.

FIG. 27 is a layout diagram illustrating a semiconductor memory device 2a according to embodiments of inventive concepts and FIG. 28 is a perspective view illustrating a semiconductor memory device.

Referring to FIGS. 27 and 28, the semiconductor memory device 2a may include a substrate 410A, a plurality of first conductive lines 420A, a plurality of channel structures 430A, a plurality of contact gate electrodes 4440A, a plurality of second conductive lines 442A, and the plurality of capacitor structures 480. The semiconductor memory device 2a may be a memory device including a VCT.

In the substrate 410A, a plurality of active areas AC may be defined by a plurality of first isolation layers 412A and a plurality of second isolation layers 414A. The plurality of channel structures 430A may be respectively arranged in the plurality of active areas AC and may respectively include a plurality of first active pillars 430A1 and a plurality of second active pillars 430A2 extending in a vertical direction and a plurality of connection units 430L connected to bottom surfaces of the plurality of first active pillars 430A1 and bottom surfaces of the plurality of second active pillars 430A2. In the plurality of connection units 430L, a plurality of first source/drain areas SD1 may be arranged and, in upper portions of the plurality of first and second active pillars 430A1 and 430A2, a plurality of second source/drain areas SD2 may be arranged. Each of the plurality of first and second active pillars 430A1 and 430A2 may configure an independent unit memory cell.

The plurality of first conductive lines 420A may extend to intersect the plurality of active areas AC, for example, in the second horizontal direction (the Y direction). One of the plurality of first conductive lines 420A may be arranged on each of the plurality of connection units 430L between each of the plurality of first active pillars 430A1 and each of the plurality of second active pillars 430A2 and may be arranged on each of the plurality of first source/drain areas SD1. Another first conductive line 420A adjacent to the one first conductive line 420A may be arranged between two channel structures 430A. One of the plurality of first conductive lines 420A may function as a common bit line included in two unit memory cells configured by the first active pillar 430A1 and the second active pillar 430A2 arranged on both sides of the one first conductive lines 420A.

Between two channel structures 430A adjacent to each other in the second horizontal direction (the Y direction), a contact gate electrode 440A may be arranged. For example, the contact gate electrode 440A may be arranged between a first active pillar 430A1 included in a channel structure 430A and a second active pillar 430A2 of a channel structure 430A adjacent to the channel structure 430A and may be shared by the first active pillar 430A1 and the second active pillar 430A2 arranged on side walls of the contact gate electrode 440A. Between the contact gate electrode 440A and the first active pillar 430A1 and between the contact gate electrode 440A and the second active pillar 430A2, a gate insulating layer 450A may be arranged. A plurality of second conductive lines 442A may extend on upper surfaces of the plurality of contact gate electrodes 440A in the first horizontal direction (the X direction). The plurality of second conductive lines 442A may function as a plurality of word lines of the semiconductor memory device 2a.

A plurality of capacitor contacts 460A may be arranged on the plurality of channel structures 430A. The plurality of capacitor contacts 460A may be arranged on the plurality of second source/drain areas SD2 and the plurality of capacitor structures 480 may be arranged on the plurality of capacitor contacts 460A.

The plurality of capacitor structures 480 may be the plurality of capacitor structures 200 illustrated in FIGS. 1 to 24C and may include one of the upper electrodes 230, 230a, 230b, 230c, 230d, and 230e illustrated in FIGS. 22A to 23F.

The semiconductor memory device 2a may further include one of the first wiring contact plugs MC1 and MC1a illustrated in FIGS. 22A to 24C and the second wiring contact plug MC2.

While inventive concepts have been particularly shown and described with reference to embodiments thereof, it will be understood that various changes in form and details may be made therein without departing from the spirit and scope of the following claims.

What is claimed is:

1. A semiconductor memory device comprising:
a substrate;
a plurality of capacitors including a plurality of lower electrodes on the substrate, an upper electrode on the plurality of lower electrodes, and a plurality of capacitor dielectric layers between the plurality of lower electrodes and the upper electrode; and
a filling insulation layer covering the plurality of capacitors;
wherein the upper electrode includes a first upper electrode layer covering the plurality of capacitor dielectric layers, and a second upper electrode layer on the first upper electrode layer, and
wherein the second upper electrode layer has a stacked structure including an electrode barrier layer and a main electrode layer,
wherein the electrode barrier layer is arranged between the first upper electrode layer and the main electrode layer, and
wherein the first upper electrode layer includes a semiconductor material and the main electrode layer includes a metallic material.

2. The semiconductor memory device of claim 1, wherein
a thickness of the electrode barrier layer is less than a thickness of the first upper electrode layer and a thickness of the main electrode layer.

3. The semiconductor memory device of claim 1, wherein the filling insulation layer includes an ultra-low k (ULK) layer including carbon (C).

4. The semiconductor memory device of claim 3, wherein the filling insulation layer includes at least one selected from a SiOC layer and a SiCOH layer.

5. The semiconductor memory device of claim 1, wherein each of the plurality of lower electrodes is in the form of a pillar extending in a vertical direction.

6. The semiconductor memory device of claim 1, wherein each of the plurality of lower electrodes includes titanium nitride.

7. The semiconductor memory device of claim 1, further comprising:
a plurality of vertical channel transistors between the substrate and the plurality of capacitors,
wherein each of the plurality of vertical channel transistors includes a channel layer extending from the substrate in a vertical direction.

8. The semiconductor memory device of claim 7, wherein the channel layer includes an oxide semiconductor.

9. The semiconductor memory device of claim 1, wherein
a lower portion of the first upper electrode layer extends towards the substrate into a region between the plurality of lower electrodes.

10. The semiconductor memory device of claim 1, wherein the second upper electrode layer has a stacked structure further including an interface layer including conductive metal oxide.

11. A semiconductor memory device comprising:
a substrate;
a plurality of capacitors including a plurality of lower electrodes on the substrate, a plurality of capacitor dielectric layers conformally covering surfaces of the plurality of lower electrodes, and an upper electrode covering the plurality of capacitor dielectric layers filling spaces among the plurality of lower electrodes, the upper electrode having a stacked structure in which a first electrode layer, an electrode barrier layer, and a second electrode layer are sequentially stacked; and
a filling insulation layer covering the plurality of capacitors, the filling insulation layer includes carbon (C), wherein
the second electrode layer includes a metallic material,
the electrode barrier layer is between the first electrode layer and the second electrode layer, and
the first electrode layer includes a semiconductor material.

12. The semiconductor memory device of claim 11, wherein
the first electrode layer has a first thickness from uppermost ends of the plurality of capacitor dielectric layers to an upper surface of the first electrode layer,
the second electrode layer has a second thickness from a bottom surface to a top surface of the second electrode layer, and
the first thickness of the first electrode is greater than the second thickness of the second electrode layer.

13. The semiconductor memory device of claim 11, wherein the upper electrode has a stacked structure further including an interface layer including conductive metal oxide.

14. The semiconductor memory device of claim 11, further comprising:
an etch stop layer between the upper electrode and the filling insulation layer;
a plurality of wiring lines on the filling insulation layer; and
a wiring contact plug connecting at least one of the plurality of wiring lines to the upper electrode through the filling insulation layer and the etch stop layer,
wherein the wiring contact plug extends to an inside of the second electrode layer through the filling insulation layer and the etch stop layer and has a lower surface at a level higher than an upper surface of the first electrode layer.

15. The semiconductor memory device of claim 11, wherein each of the plurality of lower electrodes is in the form of a pillar extending in a vertical direction and includes titanium nitride.

16. The semiconductor memory device of claim 11, further comprising:
a plurality of vertical channel transistors between the substrate and the plurality of capacitors, each of the plurality of vertical channel transistors including a channel layer,
wherein the channel layer includes an oxide semiconductor and extends from the substrate in a vertical direction.

17. The semiconductor memory device of claim 11, wherein the first electrode layer includes a semiconductor material, and
a lower portion of the first electrode layer extends towards the substrate into a region between the plurality of lower electrodes.

18. A semiconductor memory device comprising:
a substrate including a cell area and a peripheral area;
a plurality of gate lines on the peripheral area of the substrate;
a plurality of logic bit lines on the plurality of gate lines;
a plurality of lower electrodes separated from each other on the cell area;
a plurality of capacitor dielectric layers conformally covering the plurality of lower electrodes;
an upper electrode including a first upper electrode layer filling spaces in between the plurality of lower electrodes and covering the plurality of capacitor dielectric layer, an electrode barrier layer covering the first upper electrode layer, and a second upper electrode layer covering the electrode barrier layer such that the electrode barrier layer is between the first upper electrode layer and the second upper electrode layer, the first upper electrode layer including a semiconductor material, and the second upper electrode layer including a metallic material;
an etch stop layer covering the upper electrode;
a filling insulation layer including carbon (C), and covering the etch stop layer,
a plurality of wiring lines on the filling insulation layer;
a first wiring contact plug connecting at least one of the plurality of wiring lines to the upper electrode through the filling insulation layer and the etch stop layer; and
a second wiring contact plug connecting at least another one of the plurality of wiring lines to the plurality of logic bit lines through the filling insulation layer.

19. The semiconductor memory device of claim 18, wherein a height of the second wiring contact plug is greater than a height of the first wiring contact plug.

20. The semiconductor memory device of claim 18, wherein the upper electrode includes an interface layer including conductive metal oxide.

* * * * *

UNITED STATES PATENT AND TRADEMARK OFFICE
CERTIFICATE OF CORRECTION

PATENT NO. : 12,183,680 B2
APPLICATION NO. : 18/191418
DATED : December 31, 2024
INVENTOR(S) : Yonghyeok Son et al.

Page 1 of 2

It is certified that error appears in the above-identified patent and that said Letters Patent is hereby corrected as shown below:

In the Claims

Claim 11 should read:
11. A semiconductor memory device comprising:
 a substrate;
 a plurality of capacitors including a plurality of lower electrodes on the substrate, a plurality of capacitor dielectric layers conformally covering surfaces of the plurality of lower electrodes, and an upper electrode covering the plurality of capacitor dielectric layers and filling spaces among the plurality of lower electrodes, the upper electrode having a stacked structure in which a first electrode layer, an electrode barrier layer, and a second electrode layer are sequentially stacked; and
 a filling insulation layer covering the plurality of capacitors, the filling insulation layer including carbon (C), wherein
  the second electrode layer includes a metallic material,
  the electrode barrier layer is between the first electrode layer and the second electrode layer, and
  the first electrode layer includes a semiconductor material.

Claim 18 should read:
18. A semiconductor memory device comprising:
 a substrate including a cell area and a peripheral area;
 a plurality of gate lines on the peripheral area of the substrate;
 a plurality of logic bit lines on the plurality of gate lines;
 a plurality of lower electrodes separated from each other on the cell area;
 a plurality of capacitor dielectric layers conformally covering the plurality of lower electrodes;
 an upper electrode including a first upper electrode layer filling spaces between the plurality of lower electrodes and covering the plurality of capacitor dielectric layers, an electrode barrier layer covering the first upper electrode layer, and a second upper electrode layer covering the electrode barrier layer such that the electrode barrier layer is between the first upper Signed and Sealed this
Eighth Day of April, 2025

Coke Morgan Stewart
*Acting Director of the United States Patent and Trademark Office* electrode layer and the second upper electrode layer, the first upper electrode layer including a semiconductor material, and the second upper electrode layer including a metallic material;

an etch stop layer covering the upper electrode;

a filling insulation layer including carbon (C), and covering the etch stop layer, a plurality of wiring lines on the filling insulation layer;

a first wiring contact plug connecting at least one of the plurality of wiring lines to the upper electrode through the filling insulation layer and the etch stop layer; and a second wiring contact plug connecting at least another one of the plurality of wiring lines to the plurality of logic bit lines through the filling insulation layer.